(12) United States Patent
Matsuura et al.

(10) Patent No.: US 10,236,286 B2
(45) Date of Patent: Mar. 19, 2019

(54) SEMICONDUCTOR INTEGRATED CIRCUIT APPARATUS AND MANUFACTURING METHOD FOR SAME

(71) Applicant: MIE FUJITSU SEMICONDUCTOR LIMITED, Kuwana-shi, Mie (JP)

(72) Inventors: Katsuyoshi Matsuura, Yokohama (JP); Junichi Ariyoshi, Yokohama (JP)

(73) Assignee: MIE FUJITSU SEMICONDUCTOR LIMITED, Kuwana-shi (JP)

( * ) Notice: Subject to any disclaimer, the term of this patent is extended or adjusted under 35 U.S.C. 154(b) by 0 days.

(21) Appl. No.: 15/595,306

(22) Filed: May 15, 2017

(65) Prior Publication Data

US 2017/0250177 A1    Aug. 31, 2017

Related U.S. Application Data

(62) Division of application No. 14/594,848, filed on Jan. 12, 2015.

(30) Foreign Application Priority Data

Jan. 14, 2014   (JP) ................................. 2014-003914

(51) Int. Cl.
*H01L 27/02*   (2006.01)
*H01L 21/8234*   (2006.01)
(Continued)

(52) U.S. Cl.
CPC .... *H01L 27/0288* (2013.01); *H01L 21/26586* (2013.01); *H01L 21/823418* (2013.01);
(Continued)

(58) Field of Classification Search
None
See application file for complete search history.

(56) References Cited

U.S. PATENT DOCUMENTS

| 2001/0038128 A1 | 11/2001 | Woolery et al. |
| 2002/0072180 A1 | 6/2002 | Yugami et al. |

(Continued)

FOREIGN PATENT DOCUMENTS

| CN | 101180723 A | 5/2008 |
| JP | 54-52483 A | 4/1979 |

(Continued)

OTHER PUBLICATIONS

Office Action dated May 9, 2017, issued in counterpart Japanese Application No. 2014-003914, with machine translation. (7 pages).
(Continued)

*Primary Examiner* — Ermias T Woldegeorgis
(74) *Attorney, Agent, or Firm* — Westerman, Hattori, Daniels & Adrian, LLP

(57) ABSTRACT

A semiconductor integrated circuit apparatus and a manufacturing method for the same are provided in such a manner that a leak current caused by a ballast resistor is reduced, and at the same time, the inconsistency in the leak current is reduced. The peak impurity concentration of the ballast resistors is made smaller than the peak impurity concentration in the extension regions, and the depth of the ballast resistors is made greater than the depth of the extension regions.

9 Claims, 69 Drawing Sheets

(51) Int. Cl.
    *H01L 21/8238*    (2006.01)
    *H01L 27/07*      (2006.01)
    *H01L 27/06*      (2006.01)
    *H01L 27/11517*   (2017.01)
    *H01L 21/265*     (2006.01)
    *H01L 29/66*      (2006.01)
    *H01L 29/78*      (2006.01)

(52) U.S. Cl.
    CPC .. *H01L 21/823814* (2013.01); *H01L 27/0629* (2013.01); *H01L 27/0738* (2013.01); *H01L 27/11517* (2013.01); *H01L 29/6659* (2013.01); *H01L 29/7833* (2013.01)

(56) References Cited

U.S. PATENT DOCUMENTS

| | | | |
|---|---|---|---|
| 2006/0273398 A1 | 12/2006 | Suzuki et al. | |
| 2008/0067599 A1* | 3/2008 | Tsutsumi | H01L 21/823814 257/358 |
| 2009/0159973 A1* | 6/2009 | Hiraoka | H01L 21/823418 257/360 |
| 2010/0136758 A1 | 6/2010 | Ogawa et al. | |

FOREIGN PATENT DOCUMENTS

| | | |
|---|---|---|
| JP | 04-215441 A | 8/1992 |
| JP | 2002-184973 A | 6/2002 |
| JP | 2006-33944 A | 12/2006 |
| JP | 2009-158621 A | 7/2009 |
| JP | 2010-74176 A | 4/2010 |
| JP | 2010-129980 A | 6/2010 |
| JP | 2012-230989 A | 11/2012 |
| KR | 2002-0057365 A | 7/2002 |
| TW | 201246507 A | 11/2012 |
| WO | 2006/126245 A1 | 11/2006 |
| WO | 2012/147456 A1 | 11/2012 |

OTHER PUBLICATIONS

Office Action dated Jun. 2, 2017, issued in Chinese Application No. 201510016305.6, with English translation (22 pages).
Partial European Search Report dated May 27, 2015, issued in corresponding Patent Application No. 15150714.2 (6 pages).
Extended European Search Report dated Sep. 17, 2015, issued in counterpart European Patent Application No. 15150714.2 (14 pages).
Office Action of Chinese Patent Application No. 201510016305.6 dated Mar. 7, 2018. Full translation of the Office Action. (15 pages).
Office Action dated Jun. 21, 2018, issued in counterpart European Application No. 15150714.2. (5 pages).

* cited by examiner

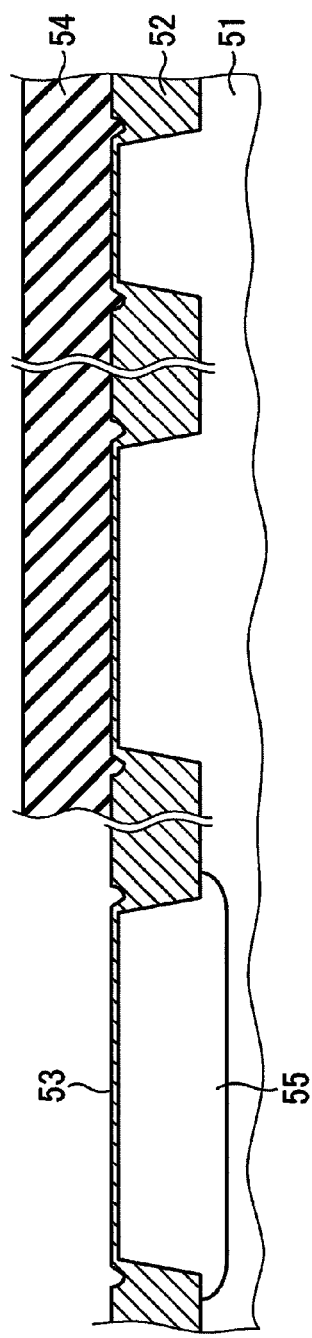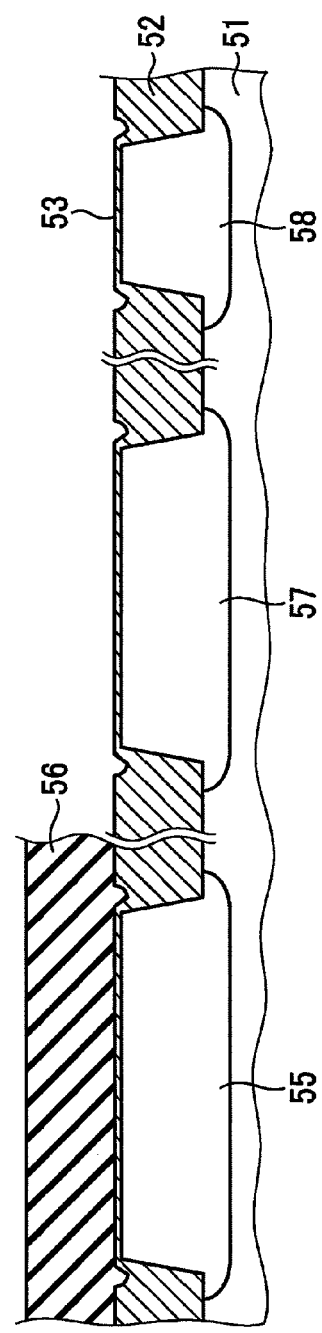
FIG. 16A
FIG. 16B

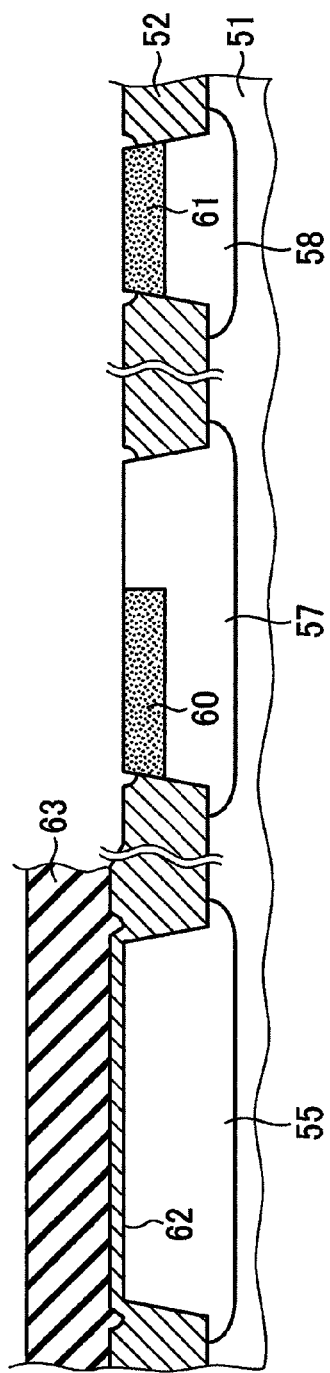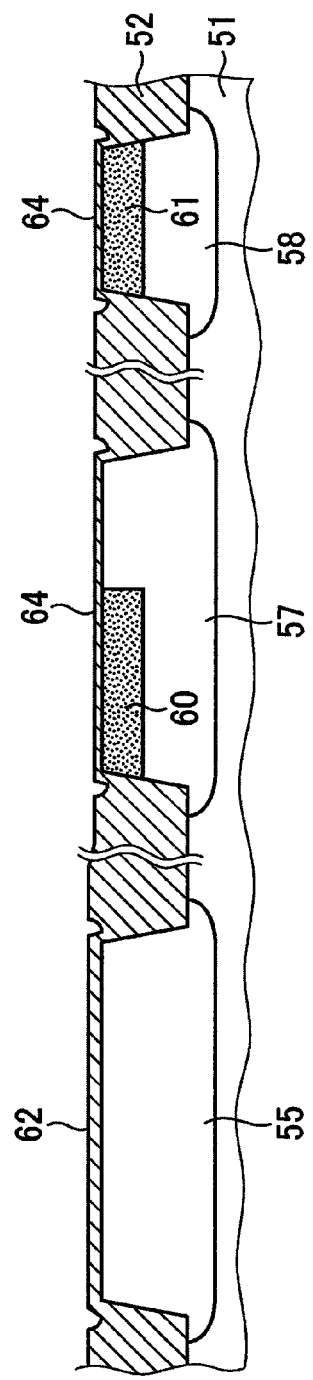
FIG. 16E
FIG. 16F

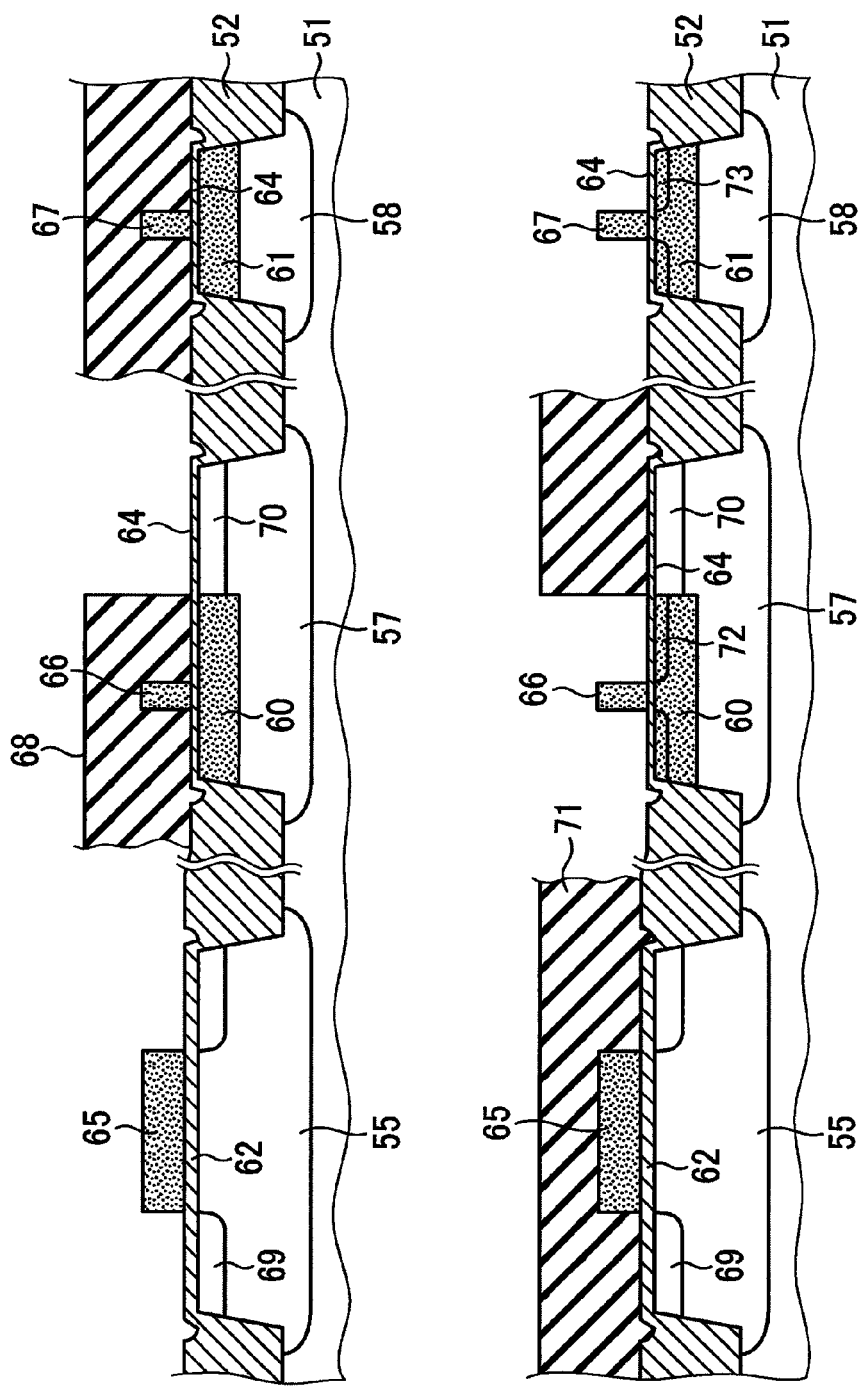

FIG. 26C
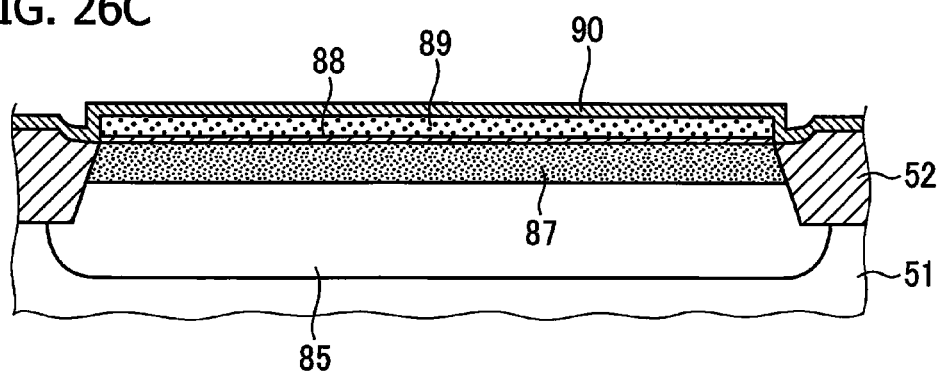
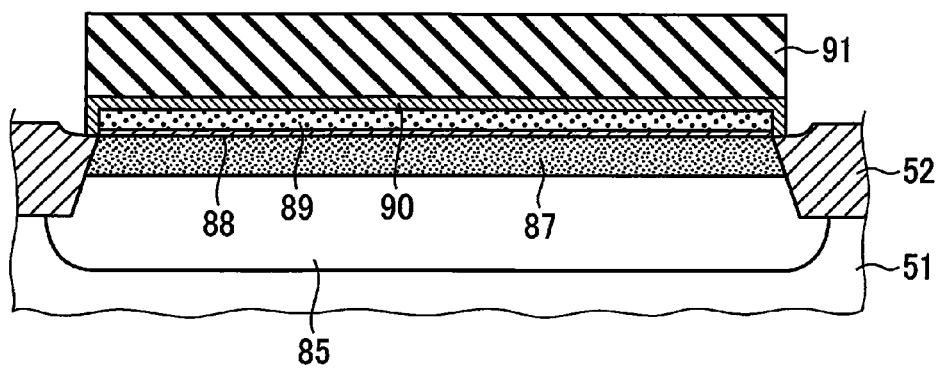
FIG. 26D

FIG. 26G
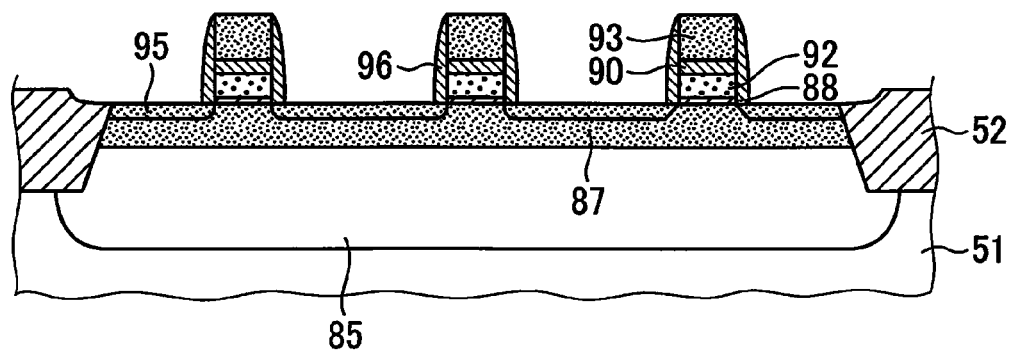
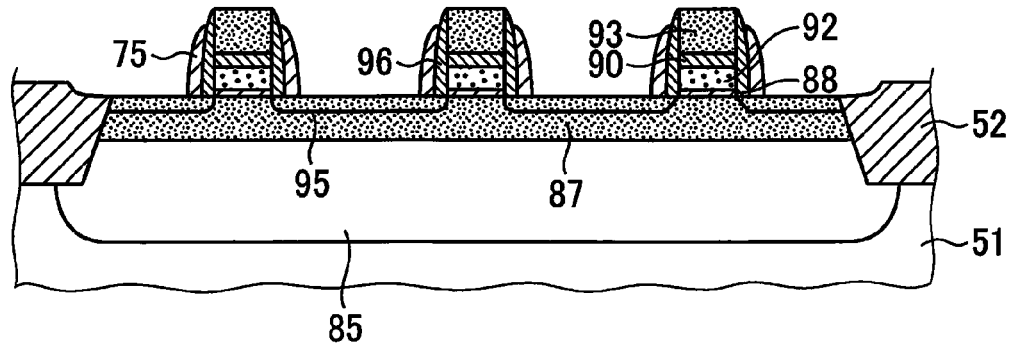
FIG. 26H

FIG. 26I
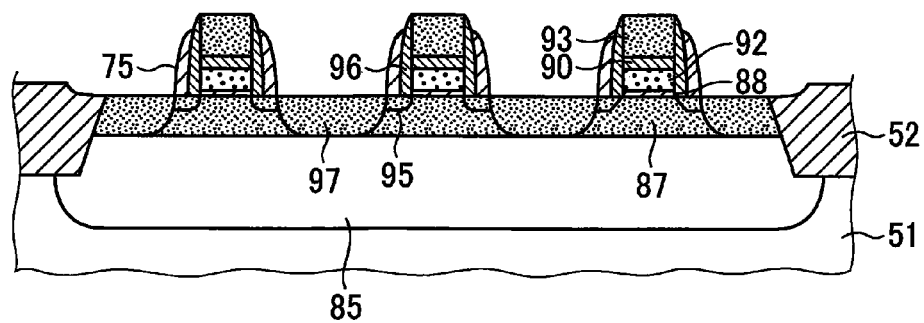
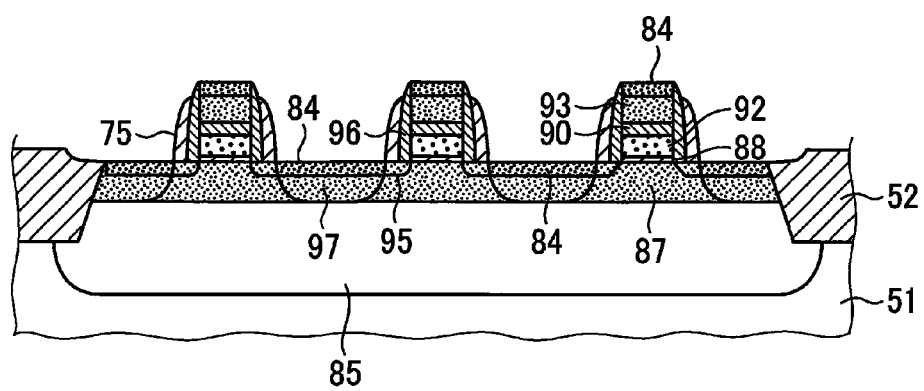
FIG. 26J

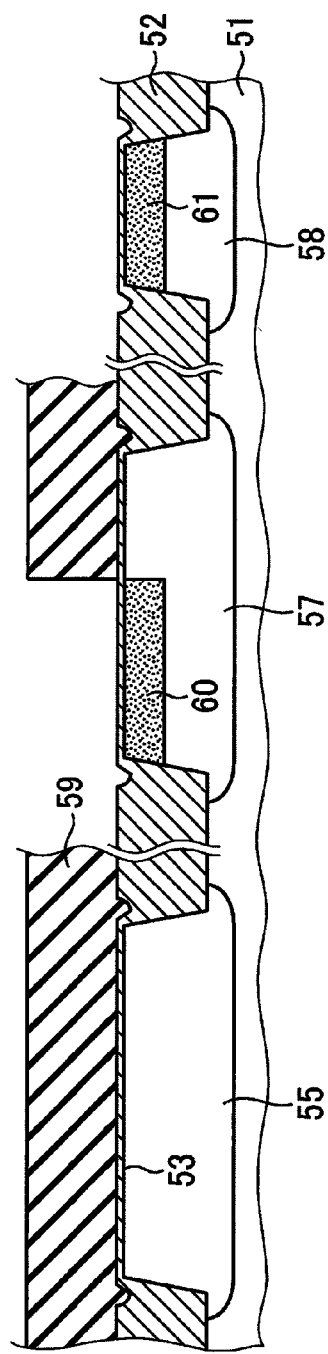
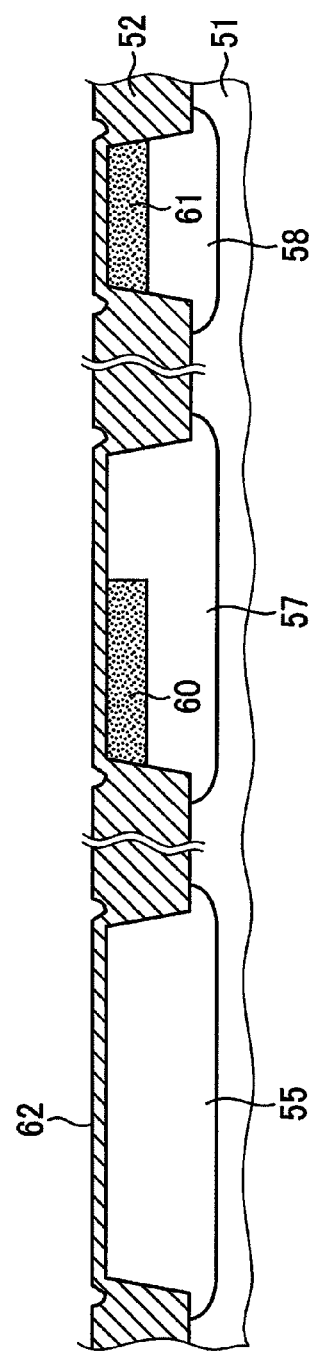
FIG. 27A
FIG. 27B

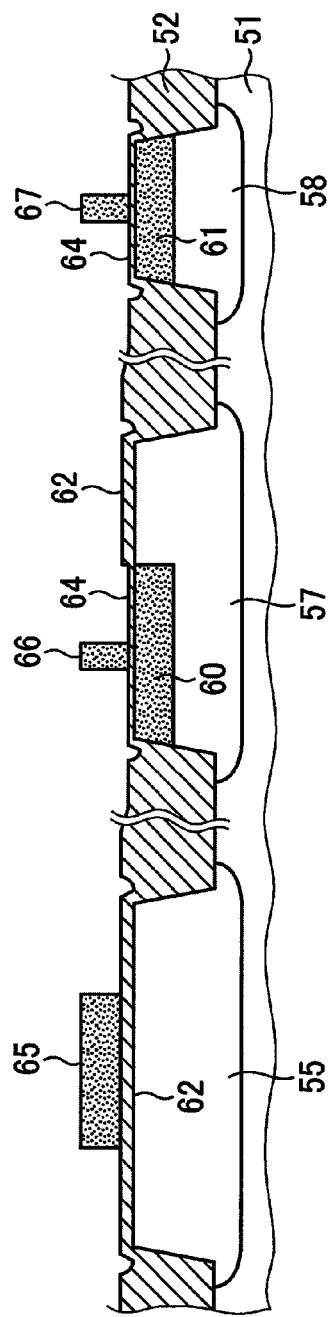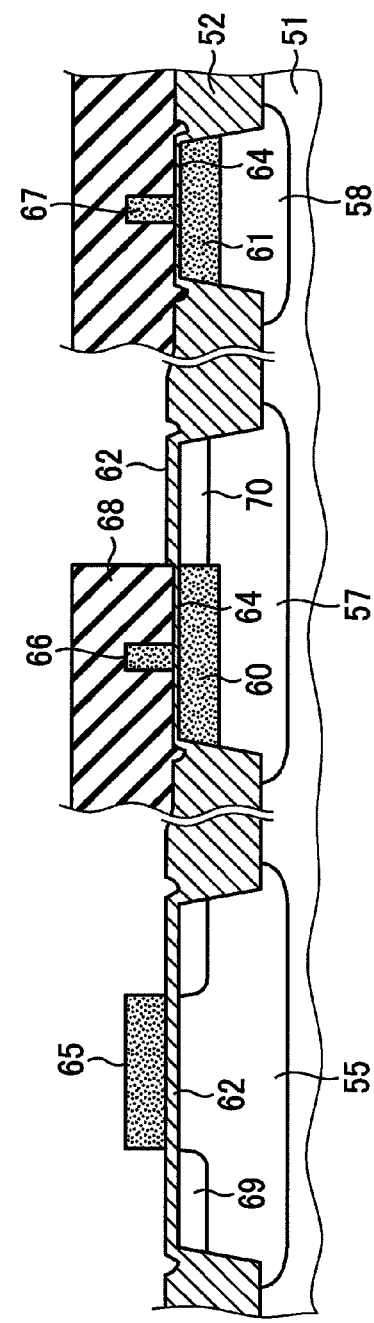
FIG. 27E
FIG. 27F

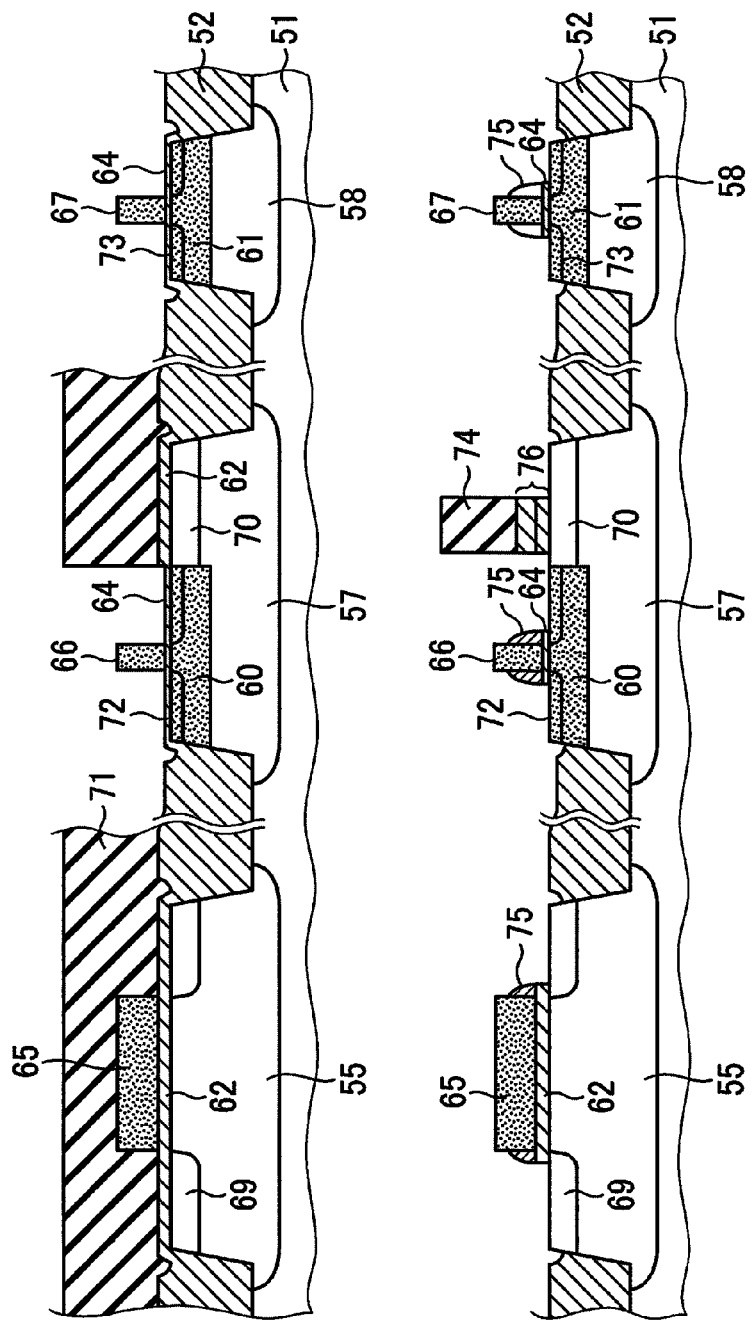

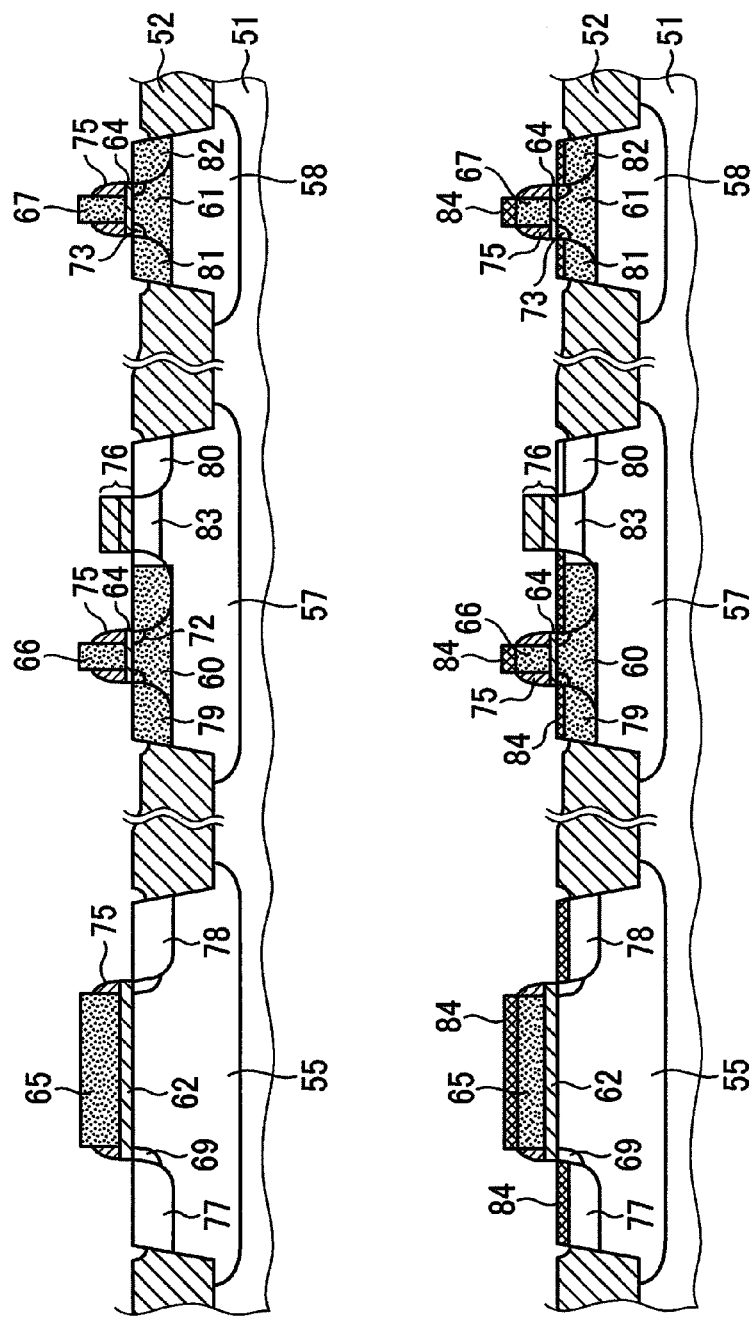

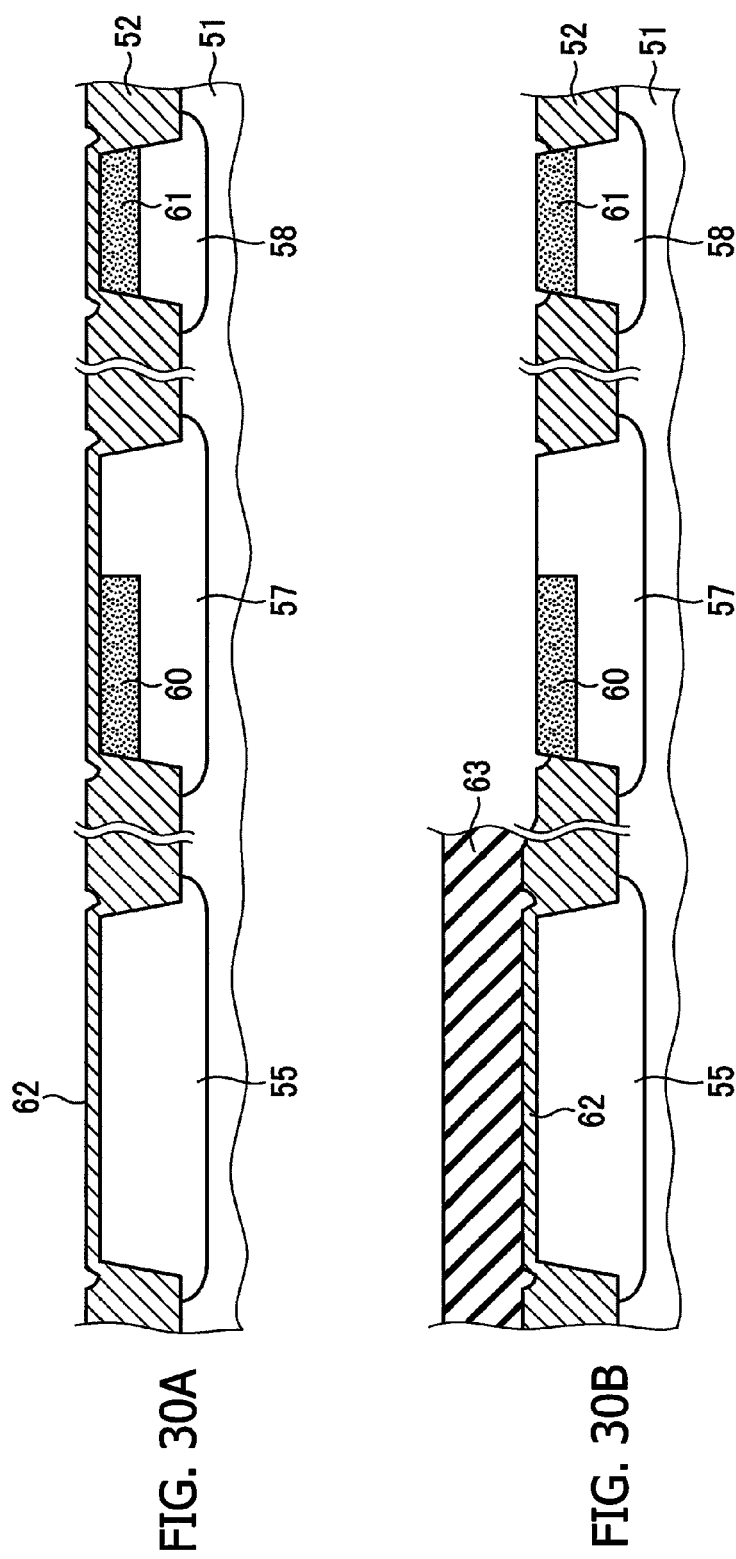

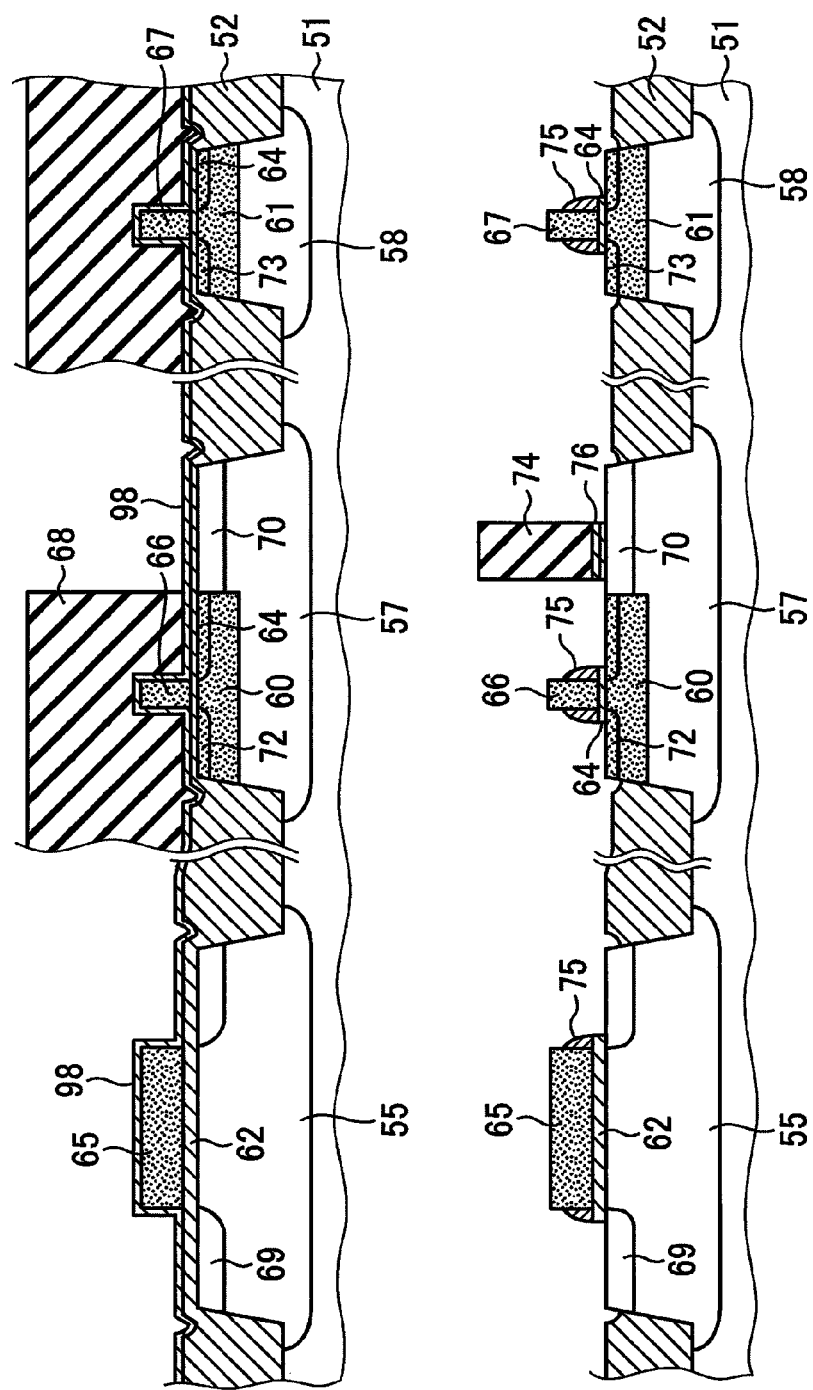

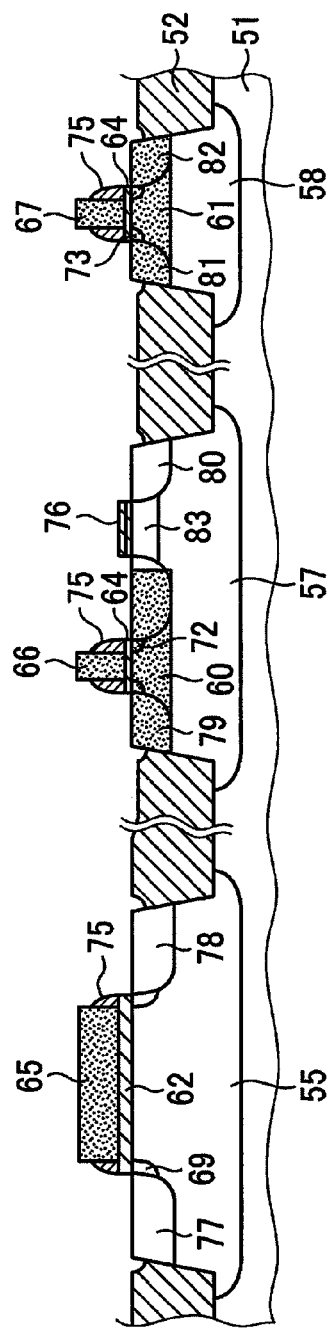
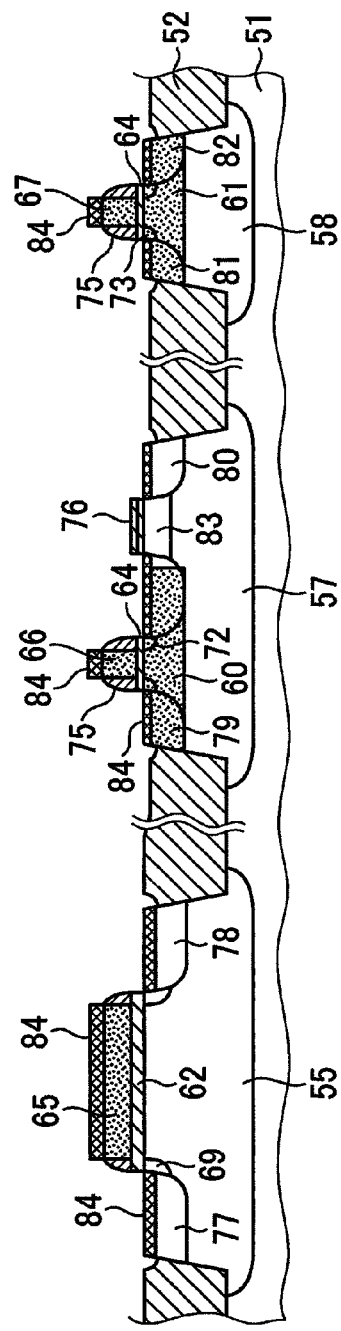
FIG. 30I
FIG. 30J

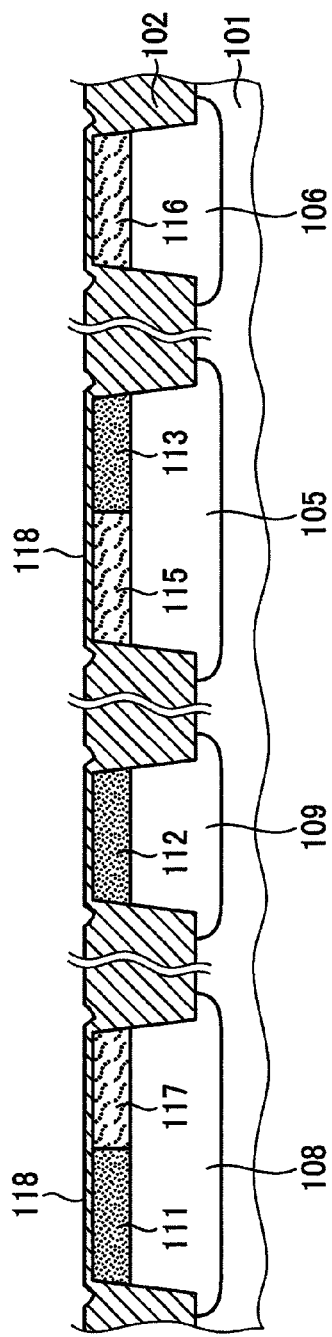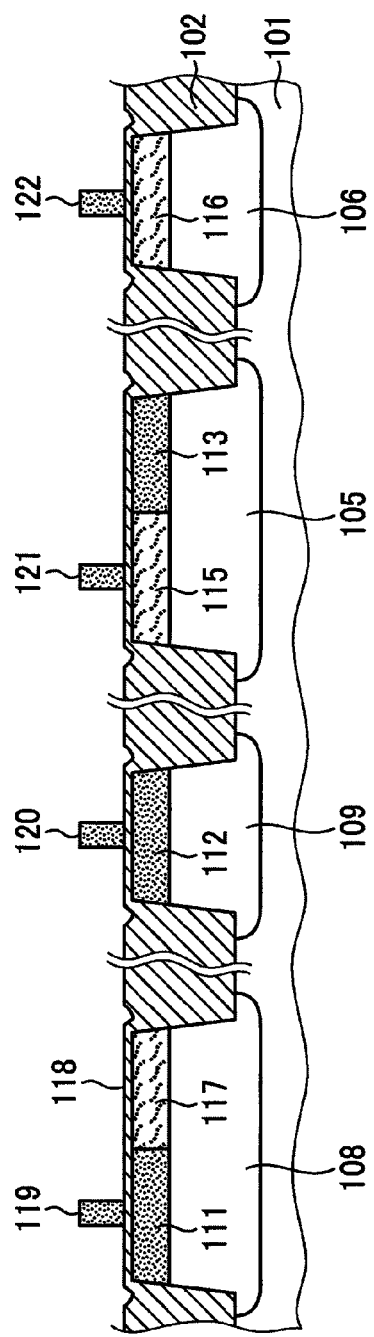
FIG. 31E
FIG. 31F

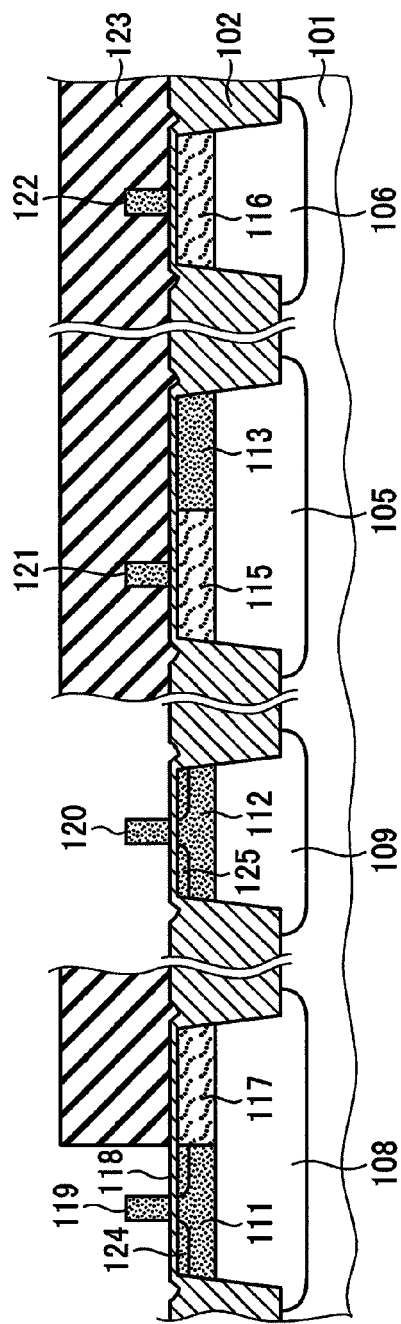
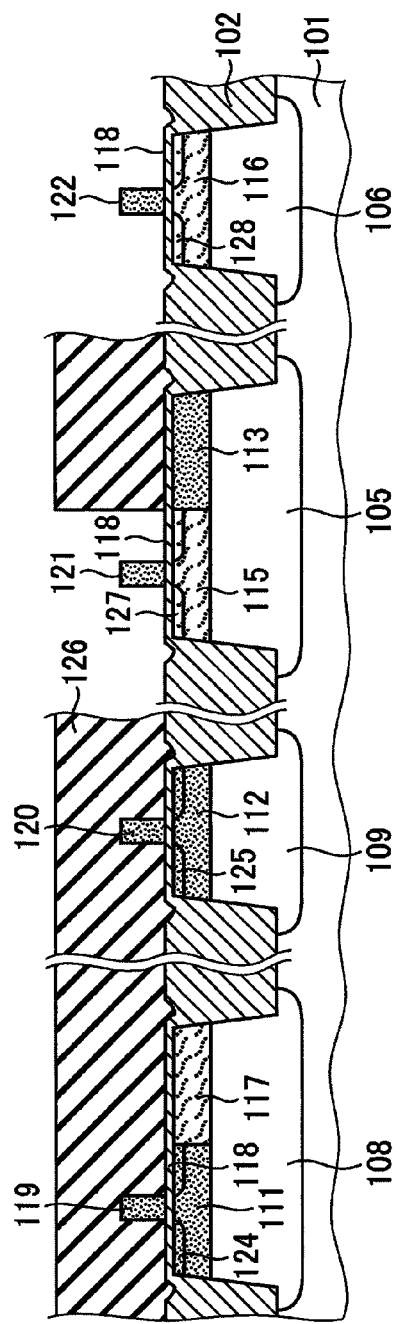
FIG. 31G
FIG. 31H

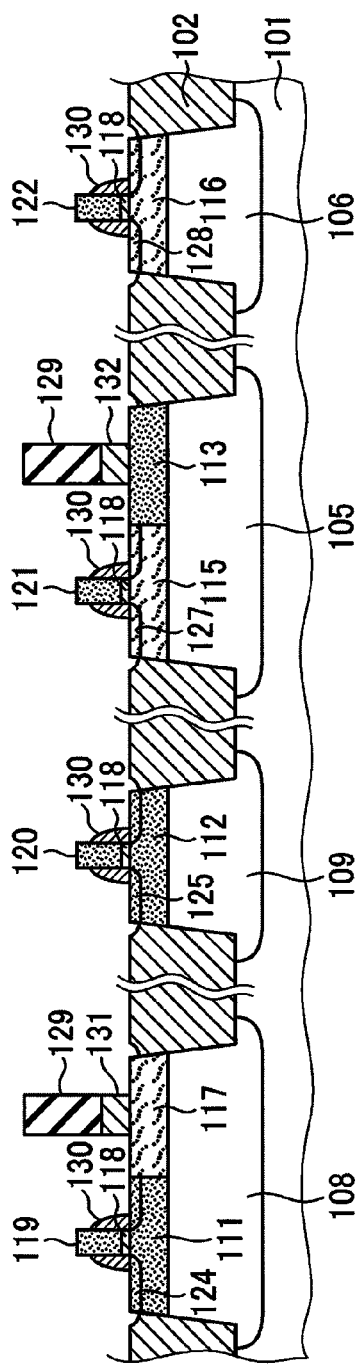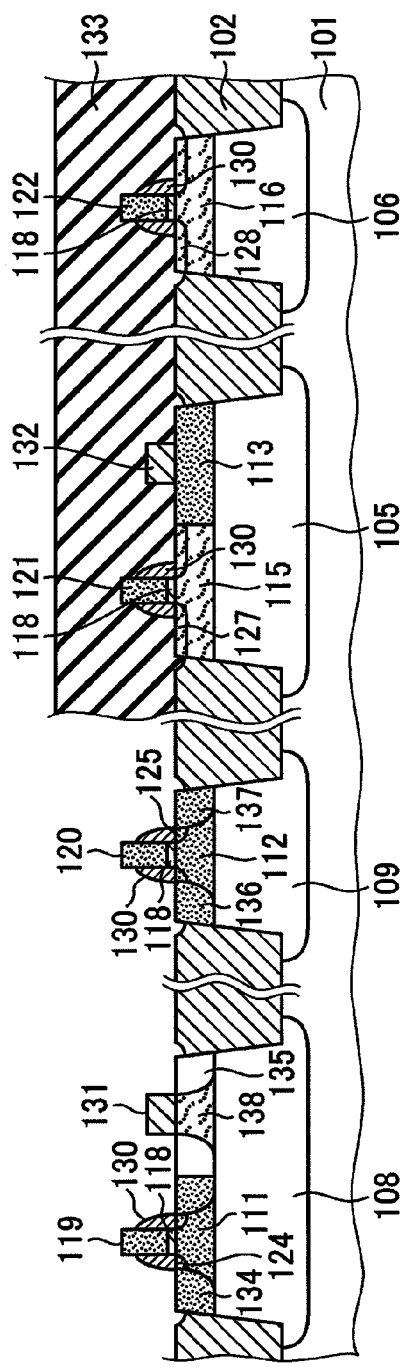
FIG. 31I
FIG. 31J

FIG. 35A
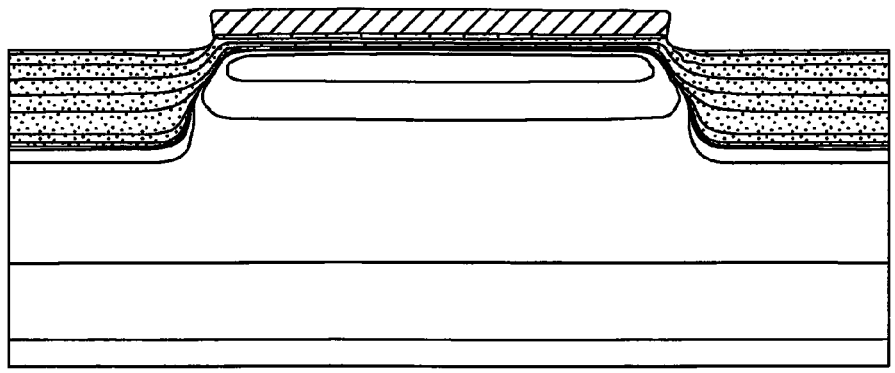
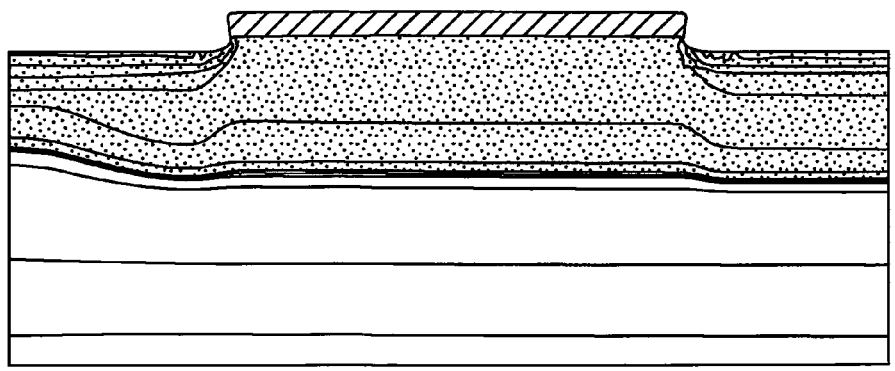
FIG. 35B

FIG. 37A
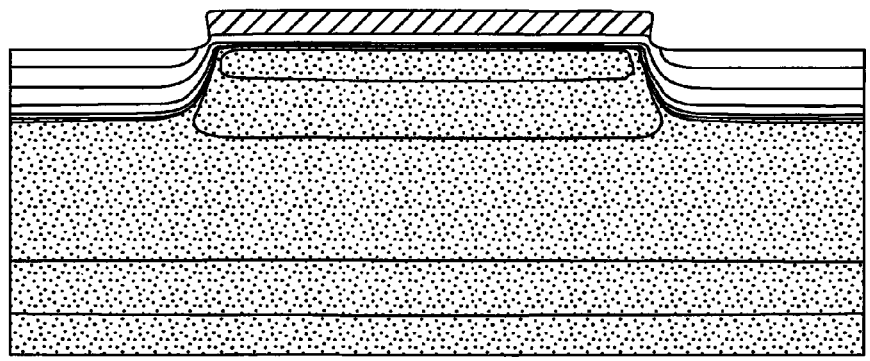
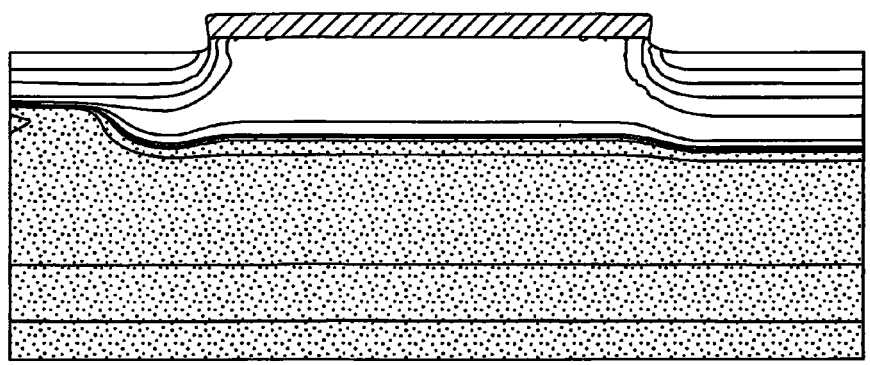
FIG. 37B

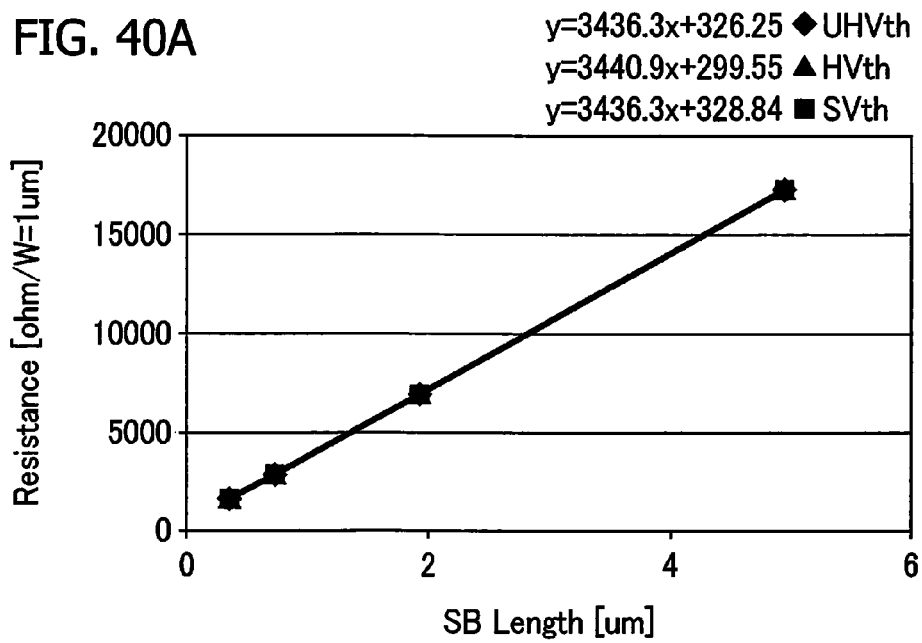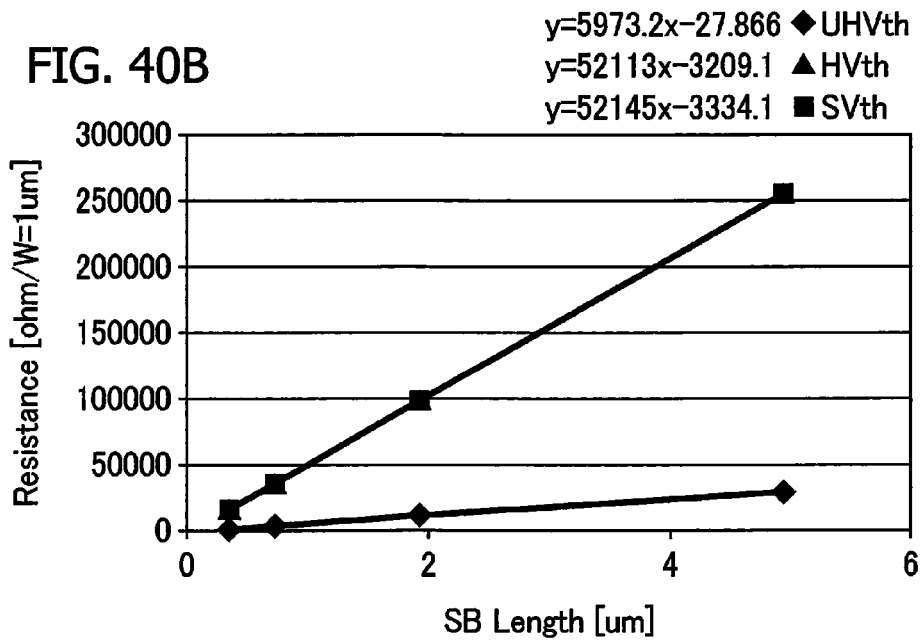

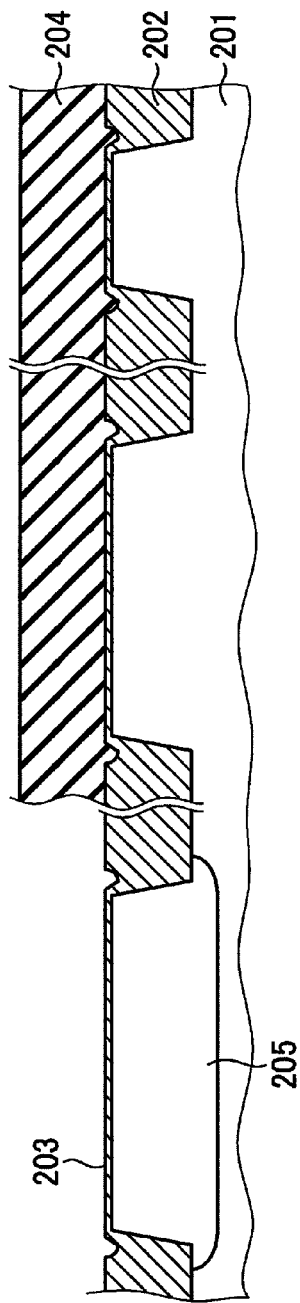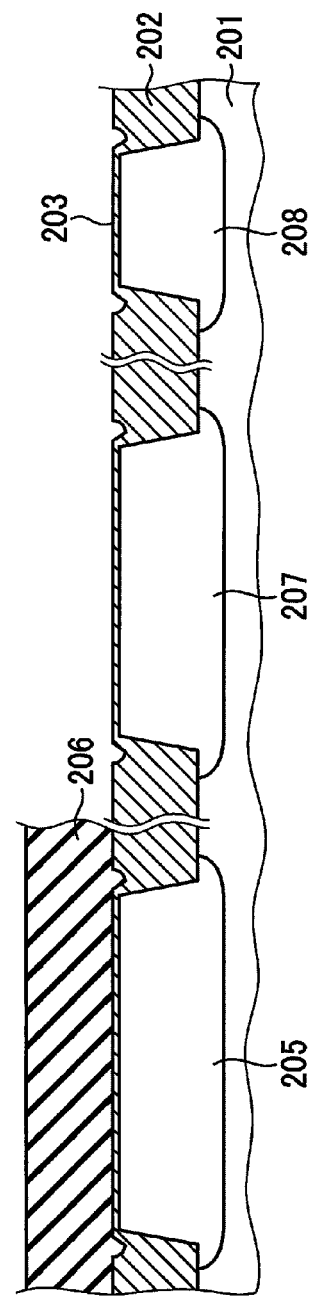
FIG. 42A
FIG. 42B
Related Art

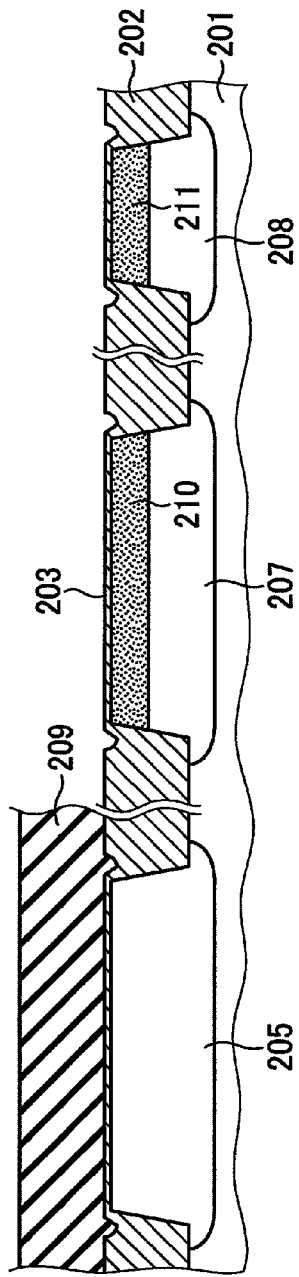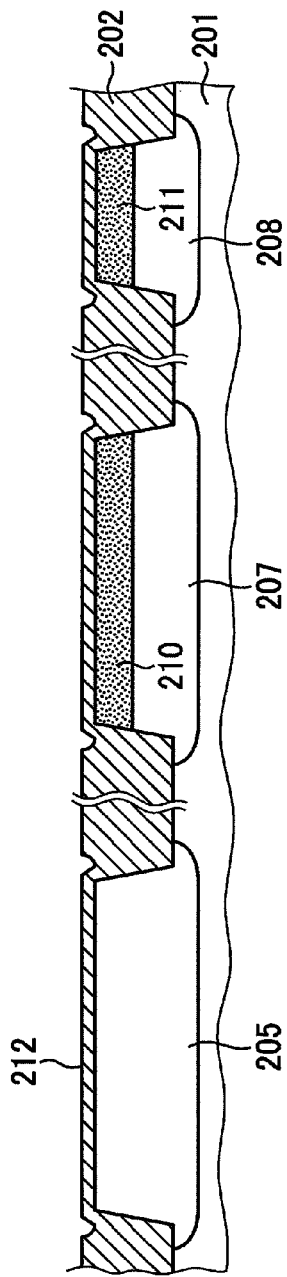
FIG. 42C
FIG. 42D
Related Art

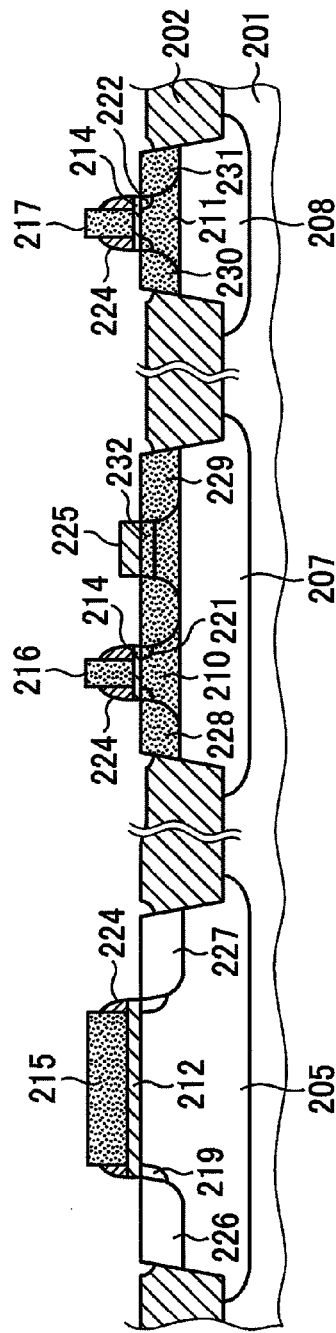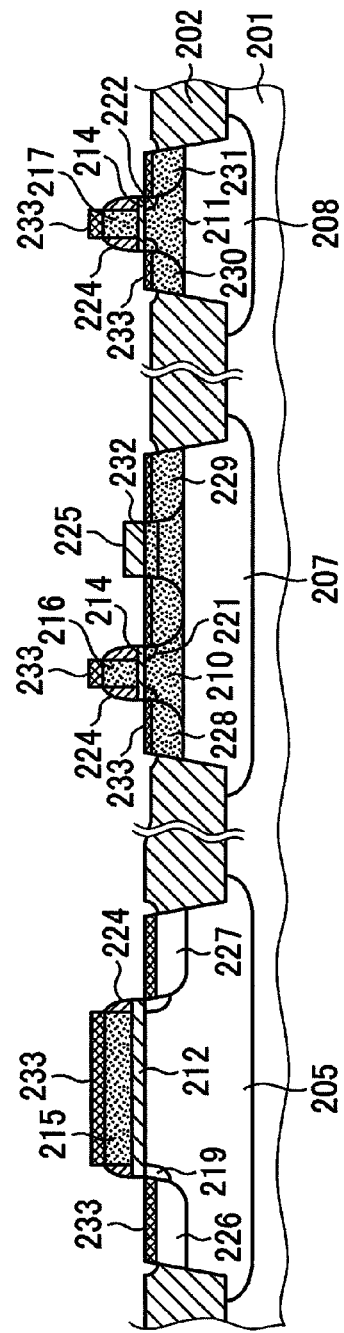

SEMICONDUCTOR INTEGRATED CIRCUIT APPARATUS AND MANUFACTURING METHOD FOR SAME

CROSS-REFERENCE TO RELATED APPLICATION

This application is a Divisional of co pending U.S. patent application Ser. No. 14/594,848 filed on Jan. 12, 2015, which is based upon and claims the benefit of priority of the prior Japanese Patent Application No. 2014-003914, filed on Jan. 14, 2014, the entire contents of which are incorporated herein by reference.

FIELD

The present invention relates to a semiconductor integrated circuit apparatus and a manufacturing method for the same, and in particular, to a reduction of the leak current in transistors having a ballast resistor as well as a reduction in the inconsistency of the transistors.

BACKGROUND

The off-state voltage (BVsd) of a high voltage (HV) drive transistor is determined by band-to-band tunneling (BTBT) that flows between the substrate beneath the gate and the drain. Accordingly, it is effective to form the junction for forming the drain region as gradual as possible in order to increase the off-state voltage. Therefore, the tilt angle for ion implantation for the formation of a lightly doped drain (LDD) region in a high voltage drive transistor is set to 45° so that channeling is generated and the LDD region is formed deep and with a low concentration.

Another idea for the conversion of Twist 45°, according to which the angle of direction of the ion implantation relative to the direction in which the gate electrode extends is set to 45°, has been proposed for the pocket implantation of a low voltage drive transistor (see Patent Documents 1: Japanese Unexamined Patent Publication 2010-129980 and Patent Documents 2: Domestic Re-publication of PCT International Publication for Patent Application 2006-126245).

In addition, a transistor having a ballast resistor close to the drain region is used as an electrostatic discharge (ESD) element used in the input/output unit (I/O unit). This ballast resistor is gained together with a salicide block, which is a mask for preventing the conversion to silicide during the salicide process, and therefore, this process is described in reference to FIG. 41.

FIG. 41 is a schematic cross-sectional diagram illustrating a semiconductor integrated circuit apparatus with a conventional ESD element. This semiconductor integrated circuit apparatus is provided with a high voltage drive transistor (HVTr), a low voltage drive I/O transistor (LVI/OTr), and a low voltage drive transistor (LVTr).

The HVTr is provided with: a gate electrode 215, which is provided on top of a p type well region 205 surrounded by an element isolation region 202 provided in a silicon substrate 201 with a SiO2 film 212 that becomes a gate insulating film in between; an n type LDD region 219; an n+ type source region 226; and an n+ type drain region 227.

The LVI/OTr is provided with: a gate electrode 216 that is provided on top of a p type channel dope region 210 with a SiO2 film 214 that becomes a gate insulating film in between, where the p type channel dope region 210 is provided on the surface of the p type well region 207 surrounded by an element isolation region 202 provided in the silicon substrate 201; an n type extension region 221; an n+ type source region 228; and an n+ type drain region 229. In addition, an n type layer that is simultaneously formed directly beneath the salicide block 225 during the process for forming the n type extension region 221 is provided as a ballast resistor 232 so as to divide the n+ type drain region 229.

The LVTr that forms an internal logic circuit is provided with: a gate electrode 217 that is provided on top of a p type channel dope region 211 with a SiO2 film 214 that becomes a gate insulating film in between, where the p type channel dope region 211 is provided on the surface of a p type well region 208 surrounded by an element isolation region 202 provided in the silicon substrate 201; an n type extension region 222; an n+ type source region 230; and an n+ type drain region 231.

Next, a manufacturing process for a conventional semiconductor integrated circuit apparatus with an ESD element is described in reference to FIGS. 42A to 42L. First, as illustrated in FIG. 42A, an element isolation region 202 is formed in a silicon substrate 201 by means of shallow trench isolation (STI), and after that, a SiO2 film 203 with a thickness of 10 nm that becomes a sacrificial oxide film is formed on the surface. Next, the surface other than the region for forming a high voltage drive Tr is covered with a resist pattern 204 and ion implanted with B so that a p type well region 205 of $1 \times 10^{17}$ cm$^{-3}$ to $3 \times 10^{17}$ cm$^{-3}$, for example, is formed.

Next, as illustrated in FIG. 42B, the resist pattern 204 is removed, and after that, a new resist pattern 206 is formed so as to cover the p type well region 205. Then, B ions are implanted to form p type well regions 207 and 208 of $8 \times 10^{17}$ cm$^{-3}$ to $12 \times 10^{17}$ cm$^{-3}$, for example.

Next, as illustrated in FIG. 42C, the resist pattern 206 is removed, and after that, a new resist pattern 209 is formed so as to cover the p type well region 205 and again ion implanted with B so that p type channel dope regions 210 and 211 are formed. Then, as illustrated in FIG. 42D, the resist pattern 209 is removed followed by the removal of the SiO2 film 203. After that, a SiO2 film 212 with a thickness of 10 nm to 20 nm, for example, which becomes a gate insulating film of a high voltage drive Tr, is formed through thermal oxidation.

Next, as illustrated in FIG. 42E, a resist pattern 213 is formed so as to cover the p type well region 205, and after that, the SiO2 film 212 on the exposed p type well regions 207 and 208 is removed through etching. After that, as illustrated in FIG. 42F, the resist pattern 213 is removed, and then, thermal oxidation is carried out again so that a SiO2 film 214 with a thickness of 1 nm to 3 nm, for example, which becomes a gate insulating film of a low voltage drive Tr, is formed on the surface of the p type well regions 207 and 208.

Next, as illustrated in FIG. 42G, a polycrystalline silicon layer is deposited on the p type well regions 205, 207, and 208 and then etched so that gate electrodes 215 to 217 are formed. After that, as illustrated in FIG. 42H, a resist pattern 218 is formed so as to cover the p type well regions 207 and 208. Then, this resist pattern 218 is used as a mask so that P ions are implanted in four directions at a tilt angle of 45° with an acceleration energy of 40 keV to 50 keV so that the amount of dosage becomes $5 \times 10^{12}$ cm$^{-2}$ to $10 \times 10^{12}$ cm$^{-2}$, and thus, an n type LDD region 219 is formed in the p type well region 205.

Next, as illustrated in FIG. 42I, the resist pattern 218 is removed, and after that, a new resist pattern 220 is formed so as to cover the p type well region 205. This resist pattern 220 is used as a mask so that B ions are implanted in four directions at a tilt angle of 28° with an acceleration energy of 10 keV to 20 keV so that the amount of dosage becomes $5 \times 10^{12}$ cm$^{-2}$ to $10 \times 10^{12}$ cm$^{-2}$, and thus, pocket regions (not shown) are formed. Subsequently, P ions are implanted in four directions at a tilt angle of 0° with an acceleration energy of 1 keV to 2 keV so that the amount of dosage becomes $3 \times 10^{13}$ cm$^{-2}$ to $9 \times 10^{13}$ cm$^{-2}$, and As ions are implanted in four directions at a tilt angle of 0° with an acceleration energy of 1 keV to 2 keV so that the amount of dosage becomes $1 \times 10^{14}$ cm$^{-2}$ to $2 \times 10^{14}$ cm$^{-2}$, and thus, n type extension regions 221 and 222 are formed in the p type well regions 207 and 208.

Next, as illustrated in FIG. 42J, the resist pattern 220 is removed, and after that, a SiO2 film is deposited on the entire surface, and then, a resist pattern 223 is formed so as to cover the region where a ballast resistor is to be formed and is subjected to anisotropic etching so that side walls 224 are formed. At this time, the SiO2 film that remains under the resist pattern 223 becomes a salicide block 225.

Next, as illustrated in FIG. 42K, the resist pattern 223 is removed, and after that, P ions are implanted at a tilt angle of 0° with an acceleration energy of 5 keV to 10 keV so that the amount of dosage becomes $1 \times 10^{16}$ cm$^{-2}$ to $2 \times 10^{16}$ cm$^{-2}$, and thus, n+ type source regions 226, 228, and 230 and n+ type drain regions 227, 229, and 231 are formed. At this time, the n− type region directly beneath the salicide block 225 becomes a ballast resistor 232.

Next, as illustrated in FIG. 42L, a Co film is deposited on the entire surface, and after that, heat treatment is carried out so that a Co silicide layer 233 is formed on the surfaces of the gate electrodes 215 to 217, the n+ type source regions 226, 228, and 230 as well as the n+ type drain regions 227, 229, and 231. Then, the unreacted Co film is removed, and after that, heat treatment is again carried out so that the resistance of the Co silicide layer 233 is lowered. After that, though the figures are not shown, an interlayer insulating film is formed, and then, plugs that reach the Co silicide layer 233 are formed, and wires connected to these plugs are formed. The formation of such a wire structure is repeated for the required number of layers. The transistor on the left is a high voltage drive transistor (HVTr), the transistor at the center is a low voltage drive transistor with a ballast resistor (LVI/OTr), and the transistor on the right is a typical low voltage drive transistor (LVTr).

SUMMARY

In a conventional semiconductor integrated circuit apparatus with a ESD element, a leak current from the LVI/OTr that becomes the ESD element becomes a problem, and this state is described in reference to FIGS. 43A to 45B. FIGS. 43A to 44 illustrate leak current characteristics of a low voltage drive transistor formed in a conventional semiconductor integrated circuit apparatus with a transistor having a ballast resistor.

FIGS. 43A and 43B illustrate the results of the measurements of the leak currents of n channel type MOS transistors. FIG. 43A is a characteristic diagram of a transistor having a ballast resistor, and FIG. 43B is a characteristic diagram of a typical transistor. Here, the low voltage drive transistors are ultra-high threshold NMOS transistors where the gate width W is 10 μm, the gate length L is 0.14 μm, and the drive voltage is 1.2 V, and the results of the measurements are gained from plots of 71 NMOS transistors. As illustrated in the figures, the leak current characteristics of the typical transistors have a small inconsistency, whereas the leak current characteristics of the transistors having a ballast resistor have a large inconsistency.

FIG. 44 illustrates the median values of the leak currents from n channel type MOS transistors and depicts the median values of the results of the measurements in FIGS. 43A and 43B. As is clear from the figure, the leak current from the transistors with a ballast resistor is greater. This is considered to be because the leak current has increased due to the salicide block. In addition, it is possible for the inconsistency to increase due to the effects of the CoSi spike that occurs at the time of the formation of silicide electrodes.

Thus, the current distribution of each transistor is simulated, and the results thereof are described in reference to FIGS. 45A and 45B. FIGS. 45A and 45B illustrate the current distributions in the case where the gate voltage VG is 0 V and the drain voltage VD is 3 V. FIG. 45A is a current distribution diagram of an LVTr, and FIG. 45B is a current distribution diagram of an LVI/OTr. Here, the solid lines in the figures are equal current lines for demonstrating current distribution and the broken lines depict the locations of pn junctions, and the single-dotted chain lines depict the locations of the depletion layers.

It can be seen from the comparison between FIG. 45A and FIG. 45B that a leak current that is greater than the junction leak current in the extension region of Tr flows under the salicide block in the case of an LVI/OTr. In addition, this junction leak current flows at the bottom of the salicide block instead of an end portion of the salicide block. The extension region and the ballast resistor share the same impurity profile, and therefore, it is possible for a leak current that is greater than the junction leak current in the extension region of Tr to flow under the salicide block because the area of the ballast resistor is great and the location is close to the drain electrode to which 3 V is applied.

One disclosed aspect provides a semiconductor integrated circuit apparatus, including a first insulated gate transistor that includes: a semiconductor substrate with at least a first well region of a first conductivity type; a first gate electrode provided in the first well region of the first conductivity type with a first gate insulating film in between; a first channel dope region of the first conductivity type provided directly beneath the first gate electrode; a first extension region of a second conductivity type that is a conductivity type opposite the first conductivity type, a first source region of the second conductivity type, and a first drain region of the second conductivity type provided on both sides of the first gate electrode; and a first ballast resistor of the second conductivity type that separates the first drain region, wherein the first insulated gate transistor includes a second conductivity type channel, characterized in that the peak impurity concentration of the first ballast resistor is lower than the peak impurity concentration of the first extension region, and the depth of the first ballast resistor is greater than the depth of the first extension region.

Another disclosed aspect provides a manufacturing method for a semiconductor integrated circuit apparatus, characterized by including: forming a number of element forming regions that are isolated from each other by an element isolation region in a semiconductor substrate; introducing impurities of a first conductivity type into at least two element forming regions from among the element forming regions so as to form a first well region of the first conductivity type for forming a low voltage drive transistor and a second well region of the first conductivity type for a high voltage drive transistor that is driven by a voltage higher than that of the transistor formed in the first well region of the first conductivity type; introducing impurities into the semiconductor substrate in such a state that the second well region of the first conductivity type and a portion of the first well region of the first conductivity type are masked so as to form a first channel dope region of the first conductivity type on the surface of another portion of the first well region of the first conductivity type; forming a first gate electrode in the first channel dope region with a first gate insulating film in between, and at the same time forming a second gate electrode in the second well region of the first conductivity type with a second gate insulating film in between; introducing impurities into the second well region of the first conductivity type using the second gate electrode as a mask so as to form a low concentration source/drain region of a second conductivity type that is a conductivity type opposite the first conductivity type, and at the same time masking the first channel dope region in the first well region of the first conductivity type so as to form a first resistor forming layer of the second conductivity type; introducing impurities into the first channel dope region using the first gate electrode as a mask so as to form a first extension region of the second conductivity type; and introducing impurities into the first well region of the first conductivity type and the second well region of the first conductivity type using side walls of the first gate electrode and the second gate electrode as well as an insulating film pattern selectively provided on the first resistor forming layer as a mask so as to form a first source region and a first drain region of the second conductivity type of which the concentration is higher than that in the low concentration source/drain region as well as a second source region and a second drain region of the second conductivity type, of which the concentration is higher than that of the low concentration source/drain region, respectively, and thus converting the first resistor forming layer directly beneath the insulating film pattern to a first ballast resistor.

Still another disclosed aspect provides a manufacturing method for a semiconductor integrated circuit apparatus including: forming a number of element forming regions isolated from each other by an element isolation region in a semiconductor substrate; introducing impurities of a first conductivity type into at least one element forming region from among the element forming regions so as to form a first well region of the first conductivity type; introducing impurities of a second conductivity type into at least one element forming region from among the other element forming regions so as to form a first well region of the second conductivity type; forming a first channel dope region of the first conductivity type in a portion of the first well region of the first conductivity type, and at the same time forming a first resistor forming layer of the first conductivity type in a portion of the first well region of the second conductivity type; forming a second resistor forming layer of the second conductivity type in a region of the first well region of the first conductivity type other than the first channel dope region, and at the same time forming a second channel dope region of the second conductivity type in a region of the first well region of the second conductivity type other than the first resistor forming region; providing a first gate electrode in the first well region of the first conductivity type with a first gate insulating film in between; providing a second gate electrode in the first well region of the second conductivity type with a second gate insulating film in between; introducing impurities into the first well region of the first conductivity type using first side walls on the first gate electrode and the first insulating film pattern provided on the second resistor forming layer as a mask so as to form a first source region and a first drain region of the second conductivity type, of which the impurity concentration is higher than that of the second resistor forming layer, and at the same time to convert the second resistor forming layer directly beneath the first insulating film pattern to a second ballast resistor; introducing impurities into the first well region of the second conductivity type using the second side walls provided on the second gate electrode and the second insulating film pattern provided on the first resistor forming layer as a mask so as to form a second source region and a second drain region of the first conductivity type, of which the impurity concentration is higher than that of the first resistor forming layer, and at the same time to convert the first resistor forming layer directly beneath the second insulating film pattern to a first ballast resistor.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIGS. 16A and 16B are diagrams for illustrating a step in the middle of the manufacturing process for a semiconductor integrated circuit apparatus according to the first embodiment of the present invention;

FIGS. 16E and 16F are diagrams for illustrating a step after the step in FIG. 16D of the manufacturing process for a semiconductor integrated circuit apparatus according to the first embodiment of the present invention;

FIGS. 16G and 16H are diagrams for illustrating a step after the step in FIG. 16F of the manufacturing process for a semiconductor integrated circuit apparatus according to the first embodiment of the present invention;

FIGS. 26C and 26D are diagrams for illustrating the flash memory unit in a step after the step in FIG. 26B of the manufacturing process for a semiconductor integrated circuit apparatus according to the second embodiment of the present invention;

FIGS. 26G and 26H are diagrams for illustrating the flash memory unit in a step after the step in FIG. 26F of the manufacturing process for a semiconductor integrated circuit apparatus according to the second embodiment of the present invention;

FIGS. 26I and 26J is a diagram for illustrating the flash memory unit in a step after the step in FIG. 26H of the manufacturing process for a semiconductor integrated circuit apparatus according to the second embodiment of the present invention;

FIGS. 27A and 27B are diagrams for illustrating a step in the middle of the manufacturing process for a semiconductor integrated circuit apparatus according to the third embodiment of the present invention;

FIGS. 27E and 27F are diagrams for illustrating a step after the step in FIG. 27D of the manufacturing process for a semiconductor integrated circuit apparatus according to the third embodiment of the present invention;

FIGS. 27G and 27H are diagrams for illustrating a step after the step in FIG. 27F of the manufacturing process for a semiconductor integrated circuit apparatus according to the third embodiment of the present invention;

FIGS. 27I and 27J is a diagram for illustrating a step after the step in FIG. 27H of the manufacturing process for a semiconductor integrated circuit apparatus according to the third embodiment of the present invention;

FIGS. 30A and 30B are diagrams for illustrating a step in the middle of the manufacturing process for a semiconductor integrated circuit apparatus according to the fourth embodiment of the present invention;

FIGS. 30G and 30H are diagrams for illustrating a step after the step in FIG. 30F of the manufacturing process for a semiconductor integrated circuit apparatus according to the fourth embodiment of the present invention;

FIGS. 30I and 30J are diagrams for illustrating a step after the step in FIG. 30H of the manufacturing process for a semiconductor integrated circuit apparatus according to the fourth embodiment of the present invention;

FIGS. 31E and 31F are diagrams for illustrating a step after the step in FIG. 31D of the manufacturing process for a complementary type semiconductor integrated circuit apparatus according to the fifth embodiment of the present invention;

FIGS. 31G and 31H are diagrams for illustrating a step after the step in FIG. 31F of the manufacturing process for a complementary type semiconductor integrated circuit apparatus according to the fifth embodiment of the present invention;

FIGS. 31I and 31J are diagrams for illustrating a step after the step in FIG. 31H of the manufacturing process for a complementary type semiconductor integrated circuit apparatus according to the fifth embodiment of the present invention;

FIGS. 35A and 35B are diagrams illustrating the results of simulation of the distribution of the impurity concentration in an n channel type low voltage drive transistor with a ballast resistor according to the fifth embodiment of the present invention;

FIGS. 37A and 37B are diagrams illustrating the results of simulation of the distribution of the impurity concentration in a p channel type low voltage drive transistor with a ballast resistor according to the fifth embodiment of the present invention;

FIGS. 40A and 40B are graphs illustrating the sheet resistance selectivity in a p channel type MOS transistor;

FIGS. 42A and 42B are diagrams for illustrating a step in the middle of the manufacturing process for a conventional semiconductor integrated circuit apparatus with a ESD element;

FIGS. 42C and 42D are diagrams for illustrating a step after the step in FIG. 42B of the manufacturing process for a conventional semiconductor integrated circuit apparatus with an ESD element;

FIGS. 42K and 42L are diagrams for illustrating a step after the step in FIG. 42J of the manufacturing process for a conventional semiconductor integrated circuit apparatus with an ESD element;

DESCRIPTION OF EMBODIMENTS

Figure 1:
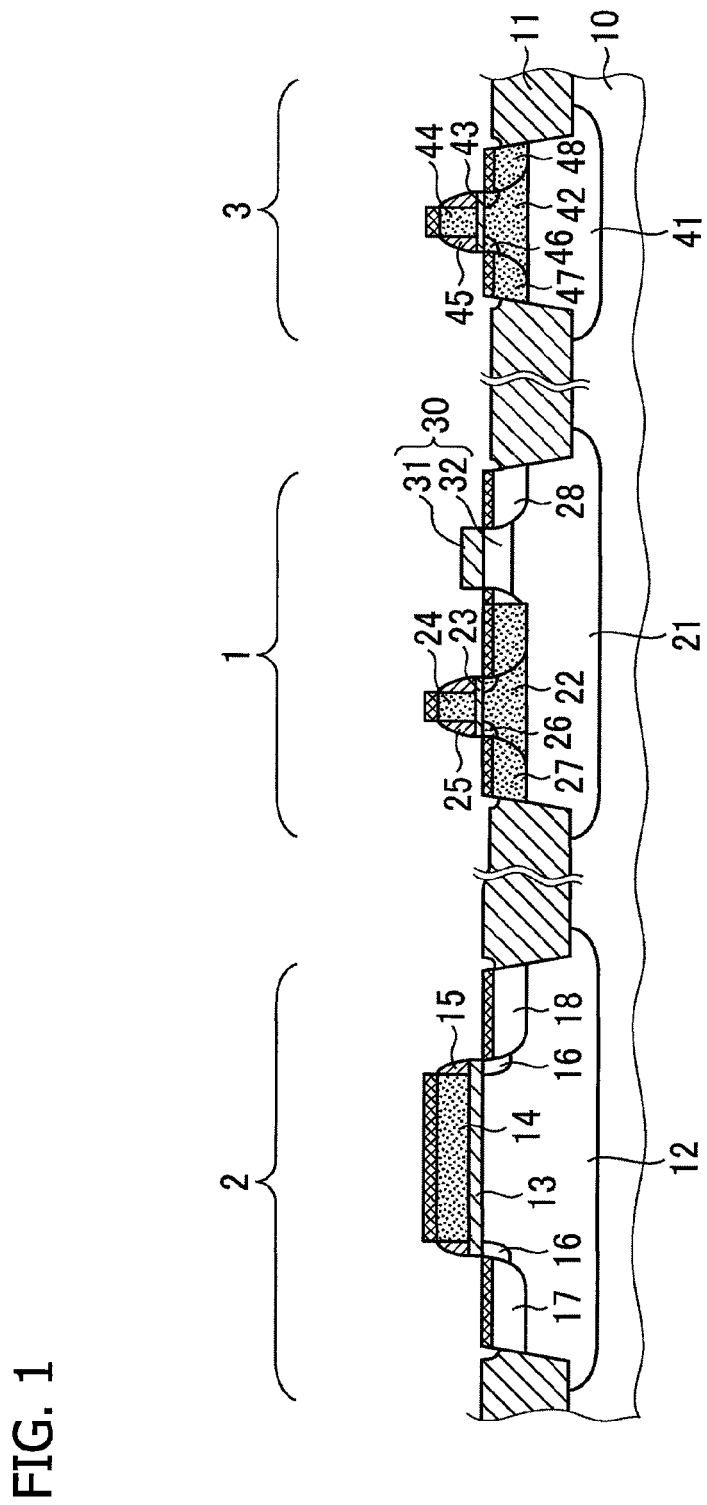
FIG. 1 is a schematic cross-sectional diagram illustrating the semiconductor integrated circuit apparatus with an insulated gate transistor having a ballast resistor according to an embodiment of the present invention.

Here, the semiconductor integrated circuit apparatus with an insulated gate transistor having a ballast resistor according to embodiments of the present invention is described in reference to FIGS. 1 to 15. FIG. 1 is a schematic cross-sectional diagram illustrating the semiconductor integrated circuit apparatus with an insulated gate transistor having a ballast resistor according to an embodiment of the present invention. The semiconductor integrated circuit apparatus is provided with a first insulated gate transistor 1 having a ballast resistor and a second insulated gate transistor 2 that is driven by a voltage higher than that of the first insulated gate transistor 1.

The second insulated gate transistor 2 is provided in a first well region 12 of a first conductivity type that is surrounded by an element isolation region 11 formed in a semiconductor substrate 10. A gate insulating film 13 and a gate electrode 14 are provided on the surface of a first well region 12 together with side walls 15, LDD regions 16 of a second conductivity type that is a conductivity type opposite the first conductivity type, and a source region 17 and a drain region 18 of the second conductivity type on the two sides of the gate electrode 14.

The first insulated gate transistor 1 is provided in a second well region 21 of the first conductivity type surrounded by the element isolation region 11 formed in the semiconductor substrate 10. A channel dope region 22 is provided in the vicinity of the surface of the second well region 21, and a gate insulating film 23 and a gate electrode 24 are provided on top of the surface. Side walls 25 are provided on the two sides of the gate electrode 24 together with extension regions 26 on the second conductivity type as well as a source region 27 and a drain region 28 of the second conductivity type. In addition, a ballast resistor unit 30 is provided in the drain region 28. This ballast resistor unit 30 is provided with a resistor layer 32 of the second conductivity type directly beneath the insulating film pattern 31 that becomes a salicide block. This resistor layer 32 is formed in the step of forming the LDD regions 16 of the second insulated gate transistor 2, and therefore effectively has the same depth and the same impurity concentration of the second conductivity type as the LDD regions 16.

In addition, a third well region 41 of the first conductivity type surrounded by the element isolation region may be formed in the semiconductor substrate 10 so that a third insulated gate transistor 3 that is driven by a voltage lower than that of the second insulated gate transistor can be provided in the third well region 41. The third insulated gate transistor 3 is formed during the manufacturing process for the first insulated gate transistor 1, and thus is formed in the same steps, excluding the steps of forming a ballast resistor unit 30 in the first insulated gate transistor 1.

Figure 2A:
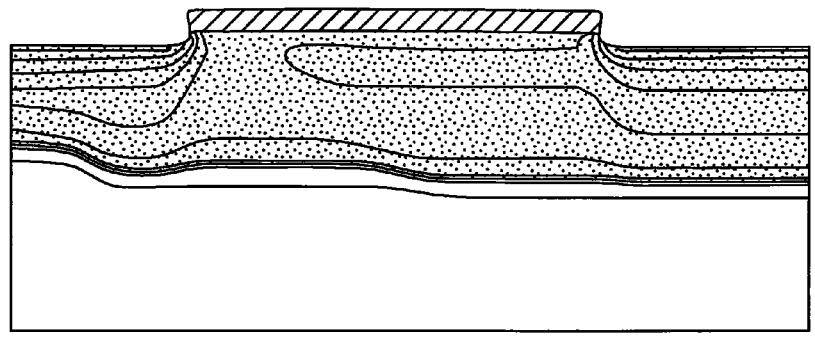
FIGS. 2A and 2B are a diagram and a graph illustrating the distribution of the impurity concentration directly beneath the ballast resistor in the n channel insulated gate transistor having a ballast resistor according to an embodiment of the present invention.
Figure 2B:
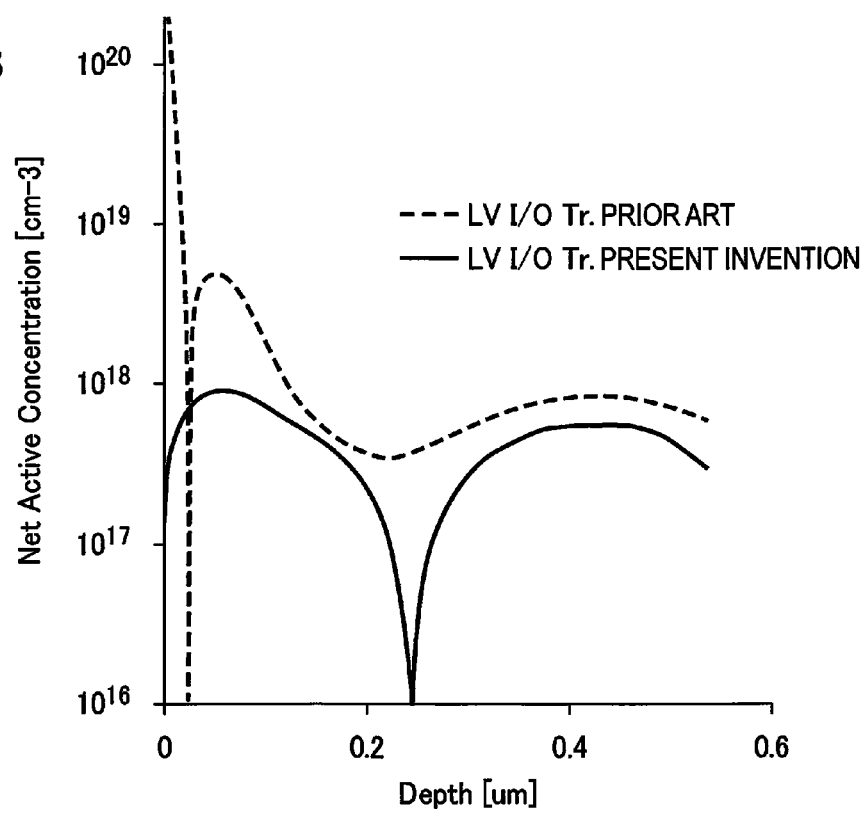
Figure 41:
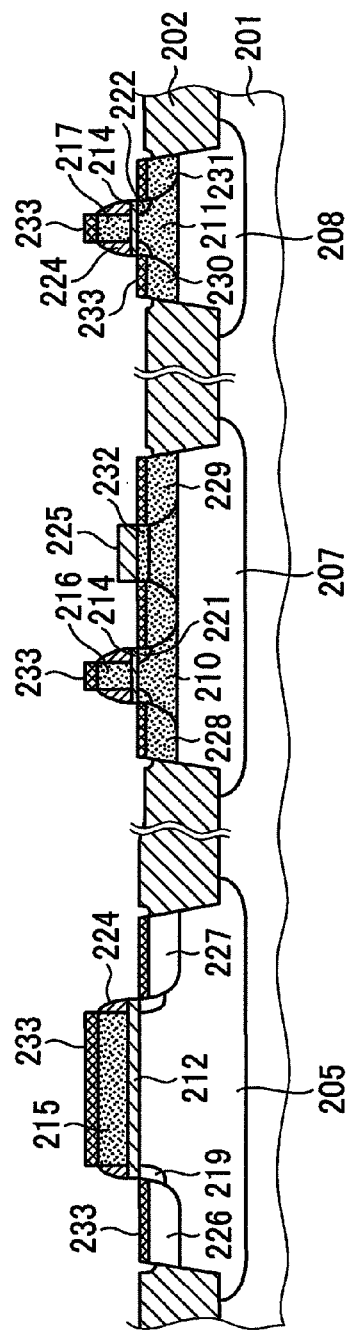
FIG. 41 is a schematic cross-sectional diagram illustrating a conventional semiconductor integrated circuit apparatus with an ESD element.
Figure 42E:
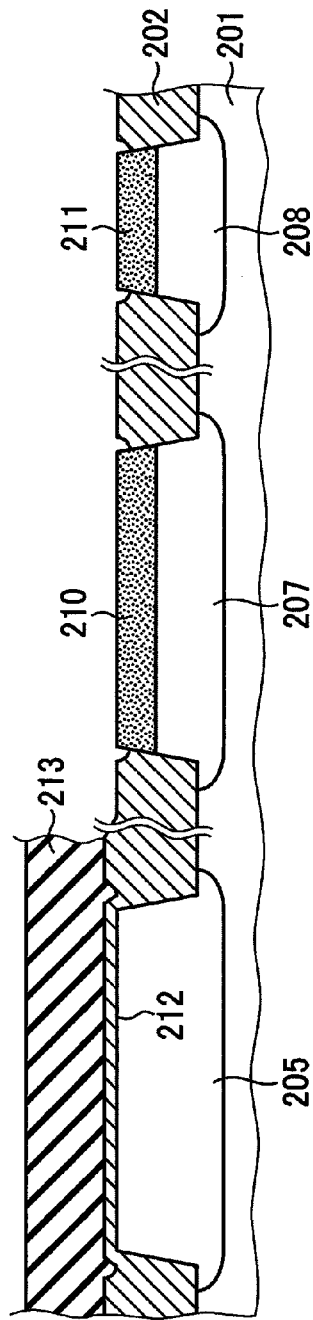
FIGS. 42E and 42F are diagrams for illustrating a step after the step in FIG. 42D of the manufacturing process for a conventional semiconductor integrated circuit apparatus with an ESD element.
Figure 42F:
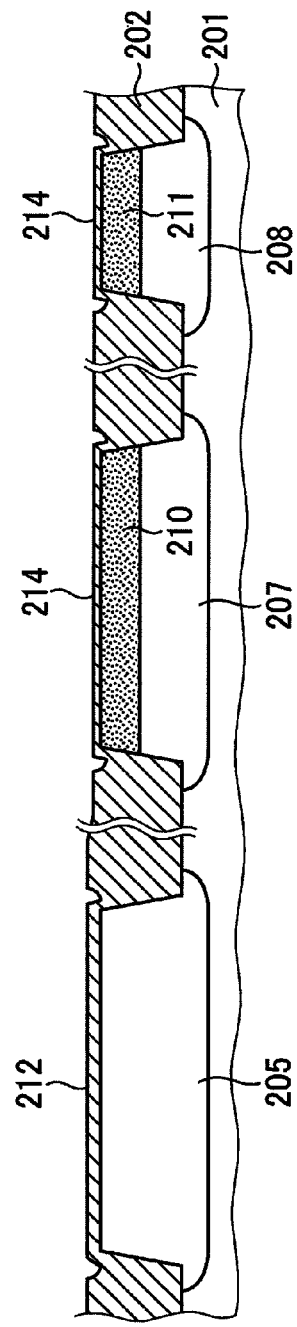
Figure 42G:
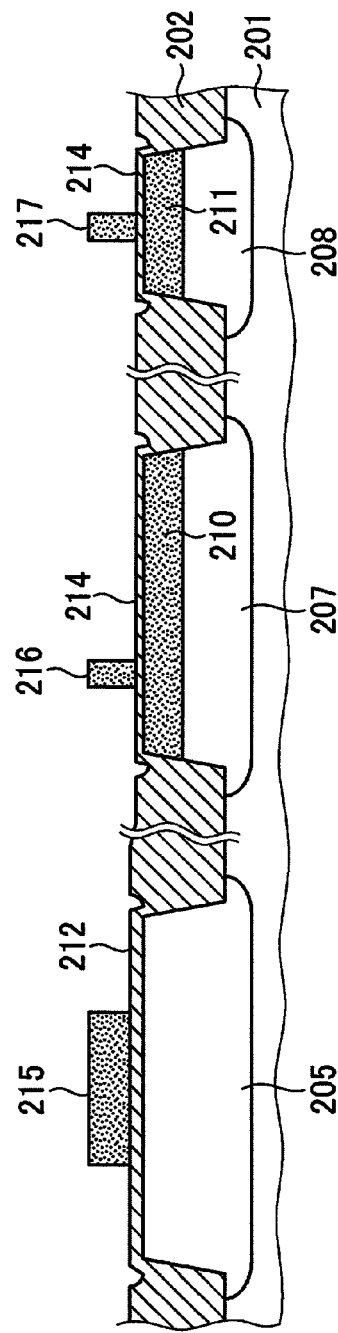
FIGS. 42G and 42H are diagrams for illustrating a step after the step in FIG. 42F of the manufacturing process for a conventional semiconductor integrated circuit apparatus with an ESD element.
Figure 42H:
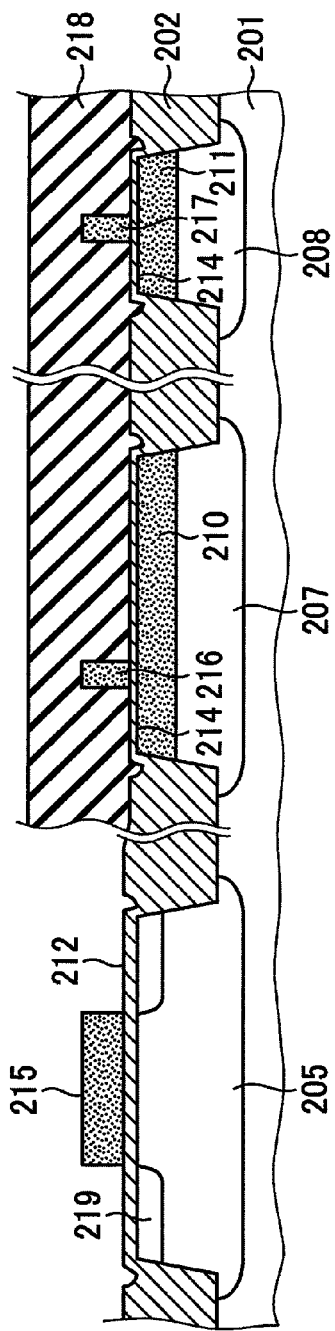
Figure 42I:
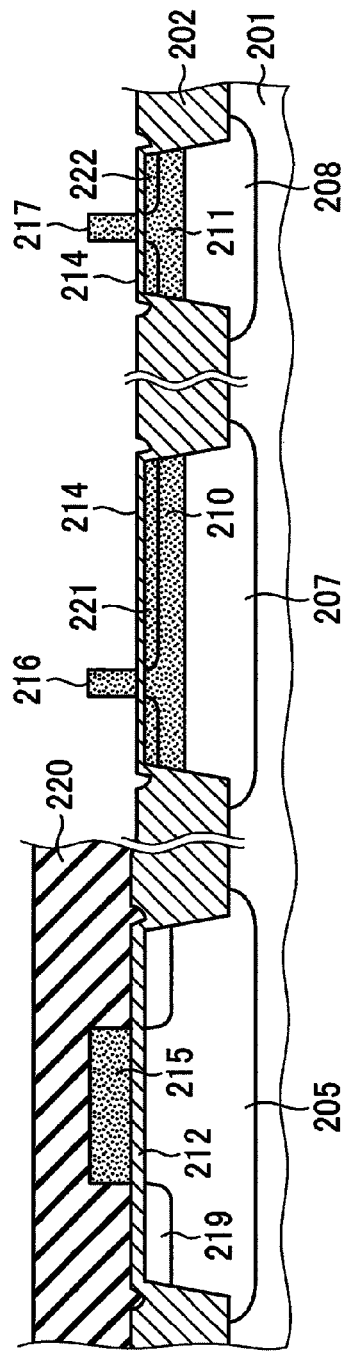
FIGS. 42I and 42J are diagrams for illustrating a step after the step in FIG. 42H of the manufacturing process for a conventional semiconductor integrated circuit apparatus with an ESD element.
Figure 42J:
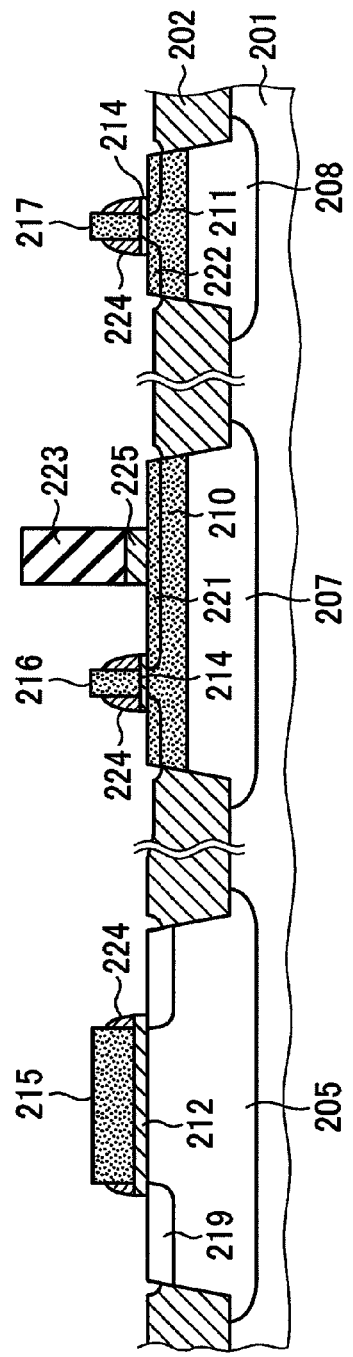
Figure 43A:
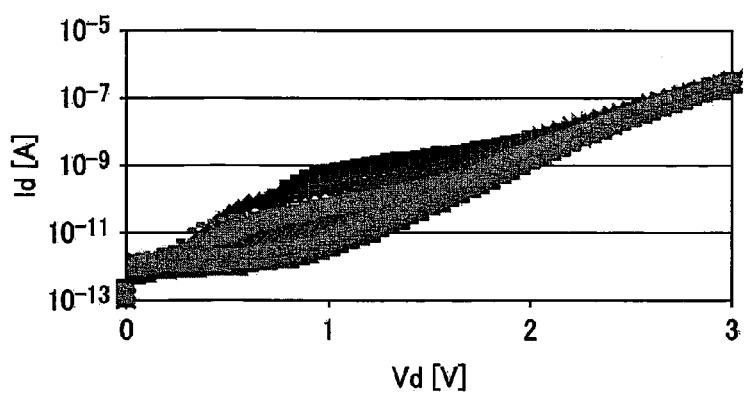
FIGS. 43A and 43B illustrate the results of the measurements of the leak currents of n channel type MOS transistors.
Figure 43B:
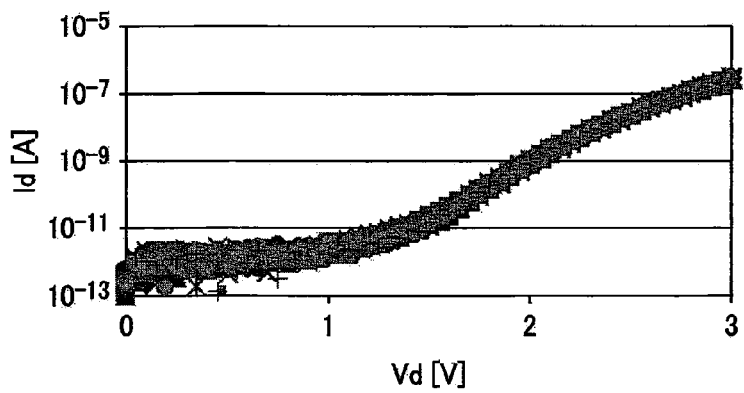
Figure 44:
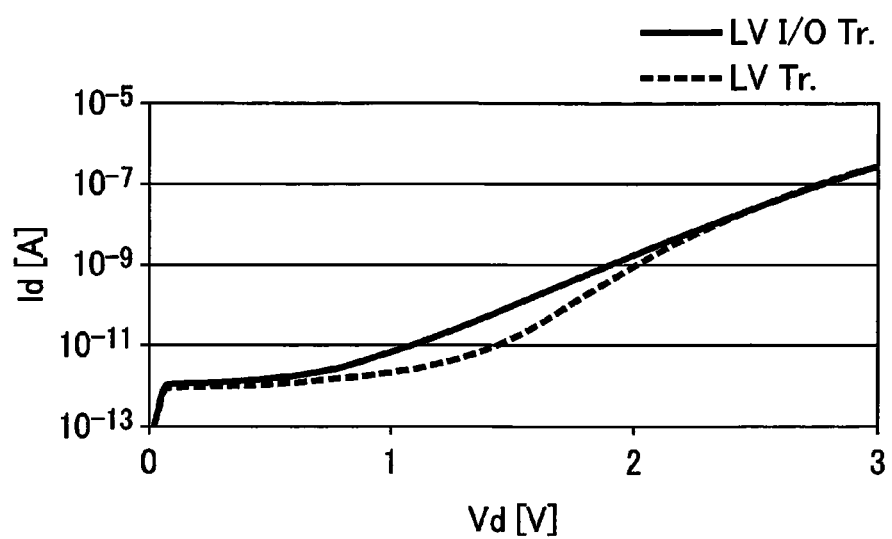
FIG. 44 illustrates the median values of the leak currents from n channel type MOS transistors.
Figure 45A:
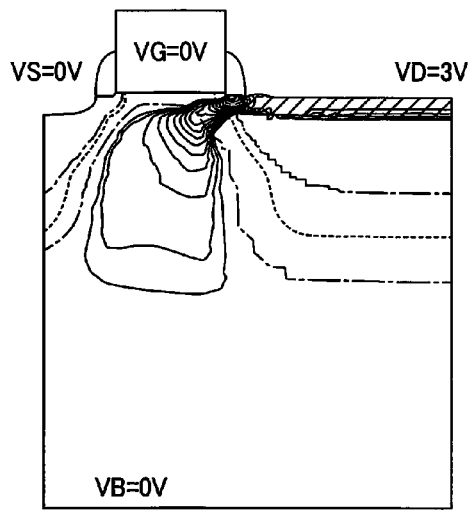
FIGS. 45A and 45B illustrate the current distributions in the case where the gate voltage VG is 0 V and the drain voltage VD is 3 V.
Figure 45B:
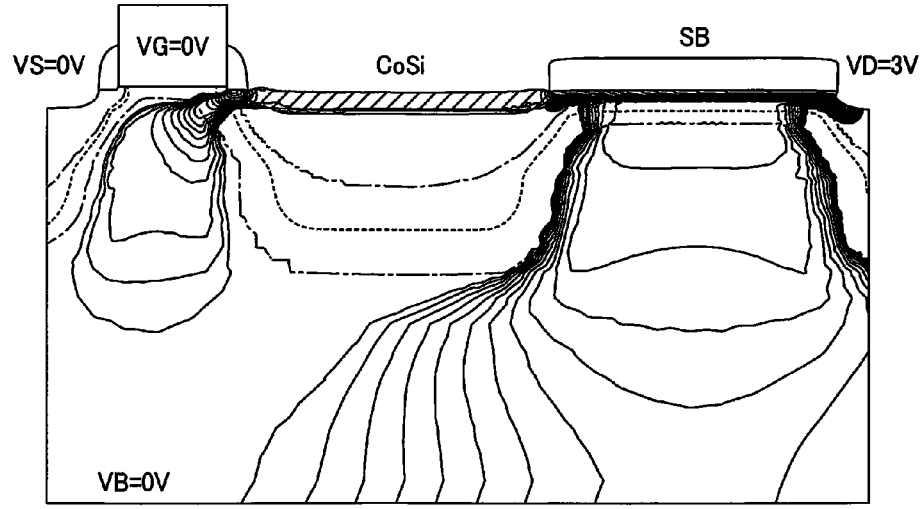

FIGS. 2A and 2B are a diagram and a graph illustrating the distribution of the impurity concentration directly beneath the ballast resistor in the n channel insulated gate transistor having a ballast resistor according to an embodiment of the present invention. FIG. 2A is a distribution diagram along a cross-section, and FIG. 2B illustrates a profile of the effective impurity concentration in the ballast resistor unit. FIG. 2B also illustrates a profile of the effective impurity concentration in the ballast resistor unit in the conventional LVI/OTr in FIG. 41. As is clearly seen from FIG. 2A, the distribution of the impurity concentration in the mode of the present invention is gradual. As is also clearly seen from the comparison with the conventional LVI/OTr in FIG. 2B, the location of the pn junction is deeper and the peak impurity concentration is greatly lower in the mode of the present invention. Here, the n type region is depicted by the grainy area and the p type region is depicted by the white area, and the same depictions are used in the following diagram illustrating the distribution of the impurity concentrations.

Figure 3A:
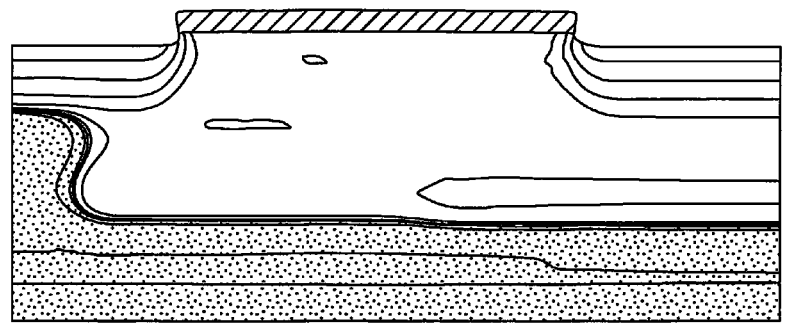
FIGS. 3A and 3B are a diagram and a graph illustrating the distribution of the impurity concentration directly beneath the ballast resistor in the p channel insulated gate transistor having a ballast resistor according to an embodiment of the present invention.
Figure 3B:
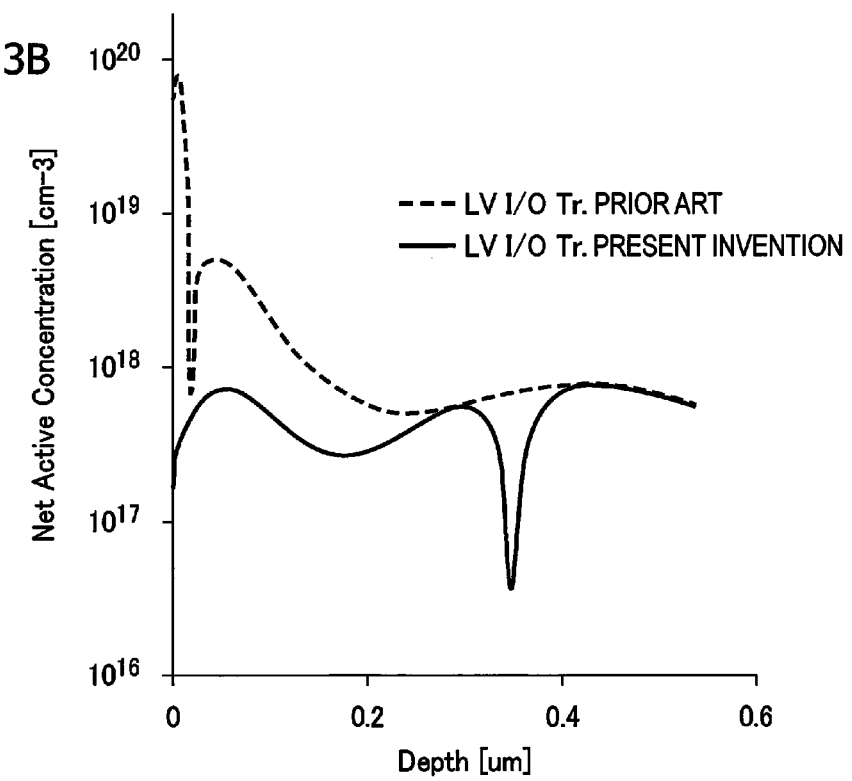

FIGS. 3A and 3B are a diagram and a graph illustrating the distribution of the impurity concentration directly beneath the ballast resistor in the p channel insulated gate transistor having a ballast resistor according to an embodiment of the present invention. FIG. 3A is a distribution diagram along a cross-section, and FIG. 3B illustrates a profile of the effective impurity concentration in the ballast resistor unit. As is clearly seen from FIG. 3A in this case as well, the distribution of the impurity concentration in the mode of the present invention is gradual. As is also clearly seen from the comparison with the conventional LVI/OTr in FIG. 3B, the location of the pn junction is deeper and the peak impurity concentration is greatly lower in the mode of the present invention.

Figure 4A:
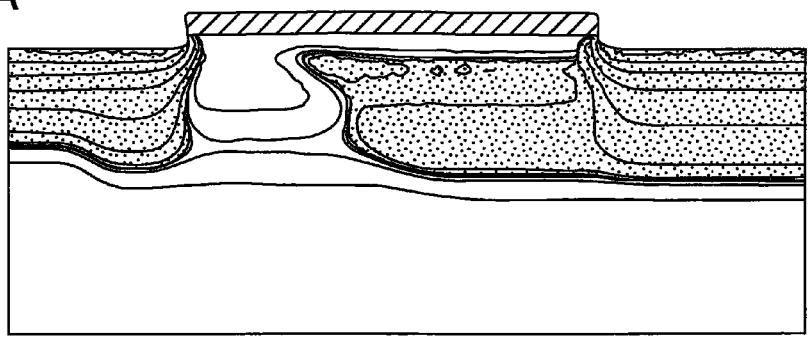
FIGS. 4A and 4B are diagrams illustrating the effects of the channel dope region in the step of forming an n type ballast resistor.
Figure 4B:
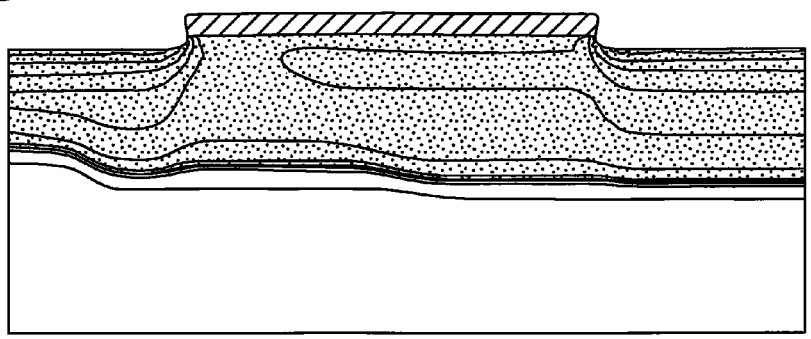

FIGS. 4A and 4B are diagrams illustrating the effects of the channel dope region in the step of forming an n type ballast resistor. FIG. 4A is a diagram illustrating for the purpose of comparison the distribution of the impurity concentration along a cross-section in the vicinity of the ballast resistor in the case where a channel dope region is provided in the ballast resistor forming region. FIG. 4B is a diagram illustrating the distribution of the impurity concentration along a cross-section in the vicinity of the ballast resistor according to the mode of the present invention. As illustrated in FIG. 4A, in the case where a channel dope region is provided, the n type layer for forming the ballast resistor is divided instead of being formed in the surface portion. Meanwhile, as can be seen from FIG. 4B, an excellent n type layer is formed in the case where a channel dope region is not formed.

Figure 5A:
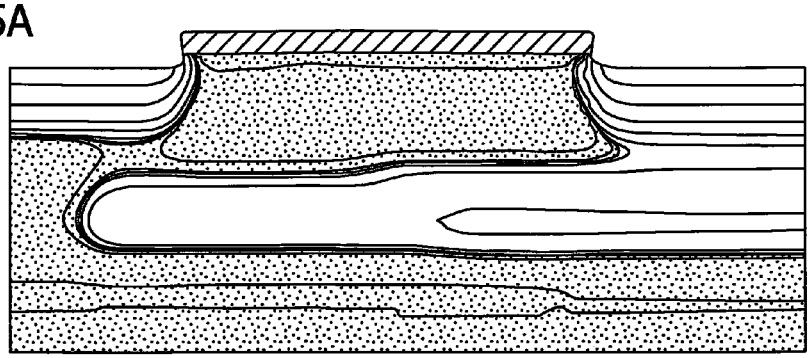
FIGS. 5A and 5B are diagrams illustrating the effects of the channel dope region in the step of forming a p type ballast resistor.
Figure 5B:
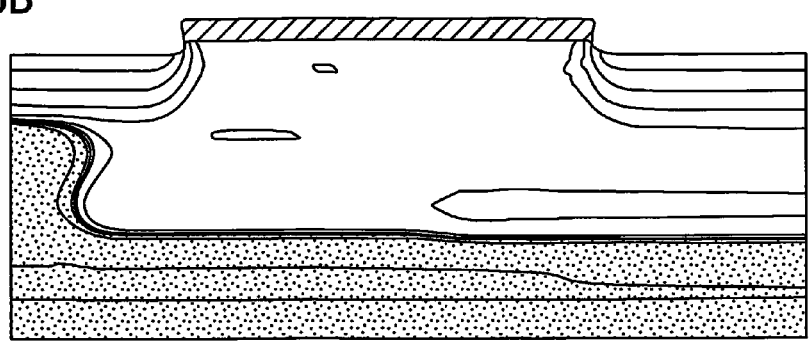

FIGS. 5A and 5B are diagrams illustrating the effects of the channel dope region in the step of forming a p type ballast resistor. FIG. 5A is a diagram illustrating for the purpose of comparison the distribution of the impurity concentration along a cross-section in the vicinity of the ballast resistor in the case where a channel dope region is provided in the ballast resistor forming region. FIG. 5B is a diagram illustrating the distribution of the impurity concentration along a cross-section in the vicinity of the ballast resistor according to the mode of the present invention. As illustrated in FIG. 5A, in the case where a channel dope region is provided, the p type layer for forming the ballast resistor is divided instead of being formed in the surface portion. Meanwhile, as can be seen from FIG. 5B, an excellent p type layer is formed in the case where a channel dope region is not formed.

Figure 6A:
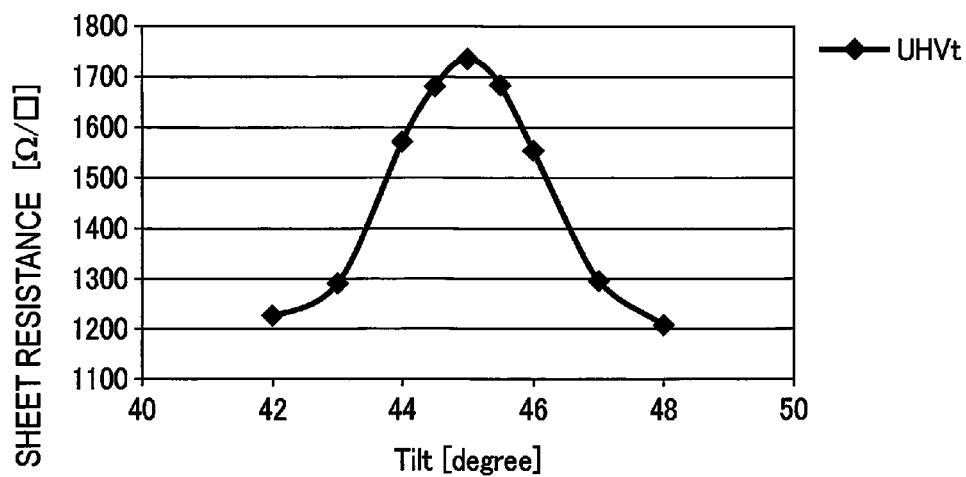
FIGS. 6A and 6B are graphs illustrating the inconsistency in the sheet resistance in the case where the through-oxide film is 0 nm during the process of forming a ballast resistor.
Figure 6B:
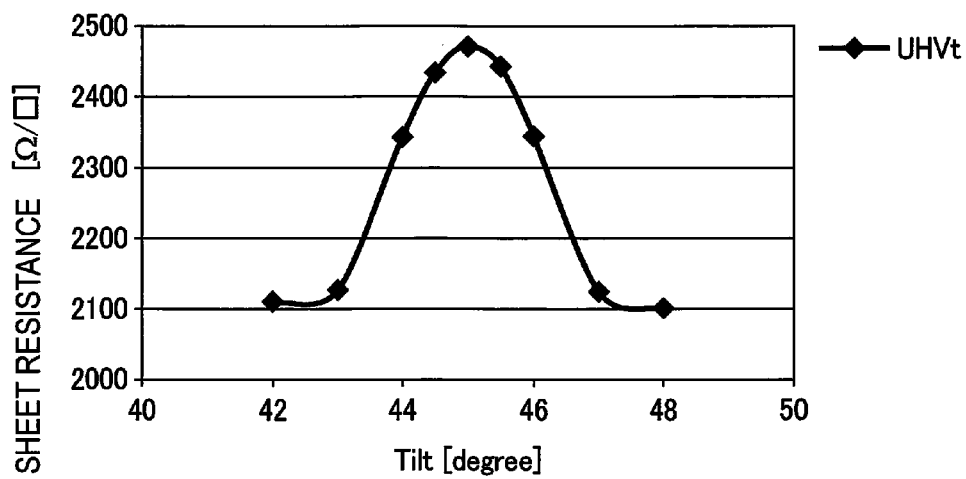
Figure 7:
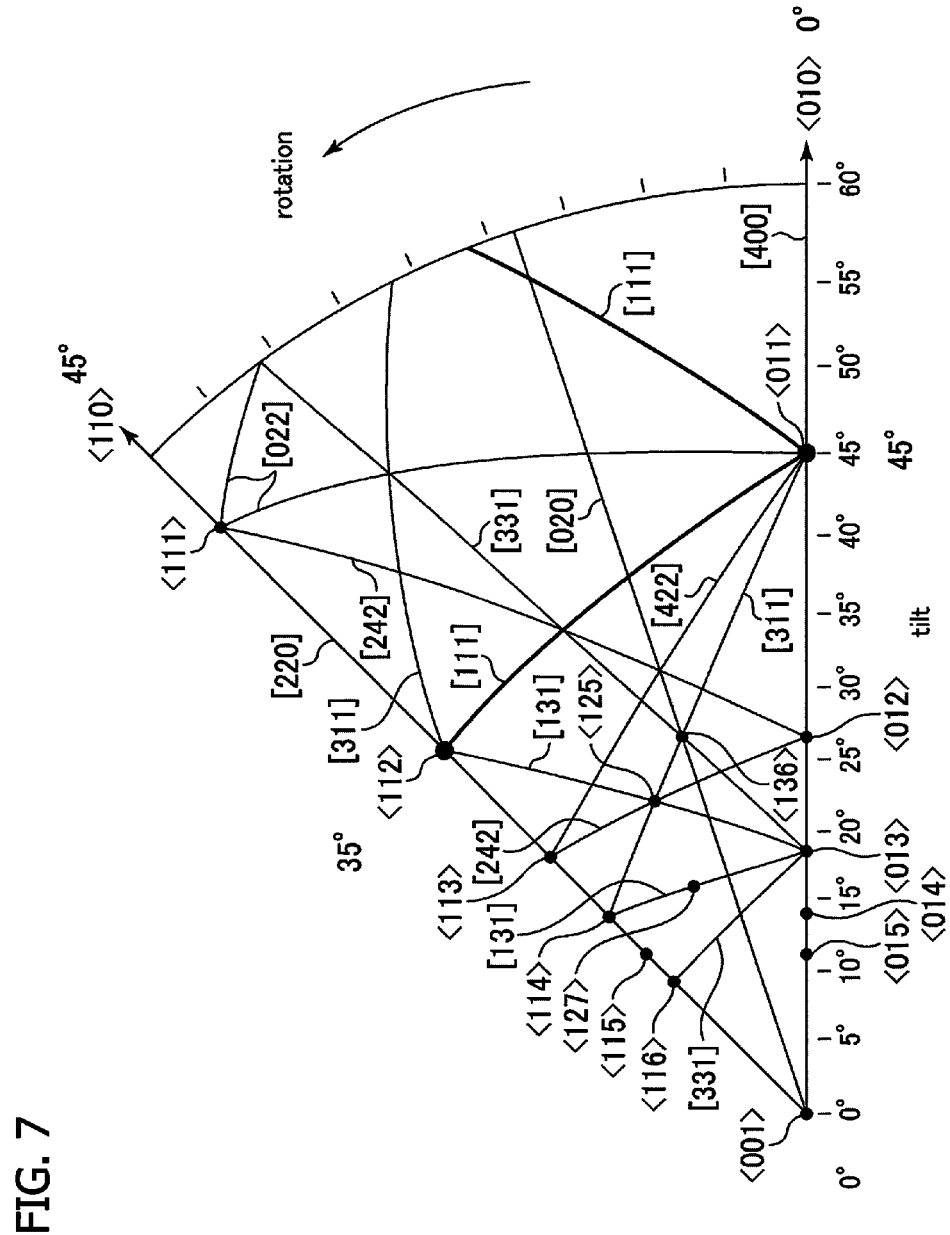
FIG. 7 is a diagram illustrating channeling during the step of ion implantation.

Next, the effects of a through-oxide film during the step of forming a ballast resistor are examined in reference to FIGS. 6A, 6B, and 7. FIGS. 6A and 6B are graphs illustrating the inconsistency in the sheet resistance in the case where the through-oxide film is 0 nm during the process of forming a ballast resistor. FIG. 6A is a graph illustrating the inconsistency in the sheet resistance of an NMOS, and FIG. 6B is a graph illustrating the inconsistency in the sheet resistance of a PMOS. Here, the characteristics of transistors (UHVt) with an ultra-high threshold voltage that are driven by a low voltage are illustrated. As is clear from the figures, the channeling factor becomes great and the inconsistency in the sheet resistance due to the tilt angle becomes significant in the case where no through-oxide films are provided in both cases of an NMOS and a PMOS.

FIG. 7 is a diagram illustrating channeling during the step of ion implantation, where a 45° substrate is illustrated, on which elements are formed in the direction <100>, which is the direction rotated by 45° relative to a notch or an orientation flat that is the standard of the crystal orientation provided in the wafer. The line of 0° in the figure denotes the direction of the crystal surface as viewed from the direction of 0° relative to the standard line of the 45° substrate, and the lateral axis denotes a tilt angle. Meanwhile, 45° denotes the direction of the crystal surface as viewed from the direction rotated by 45° relative to the standard line of the 45° substrate. Here, the direction <100> denotes the direction that is equivalent to the direction [100], and the direction [100] means the direction perpendicular to the surface (100).

In the step of forming the LDDs of a high voltage drive transistor, such conditions that allow channeling to occur are selected because impurities are implanted relatively deeply. Accordingly, in the case where the rotation angle is 0°, channeling occurs by adjusting the tilt angle to 45° so that the direction <011> is brought about. In the case where ions are implanted in the direction rotated by 45°, the direction <112> is brought about by adjusting the tilt angle to 35°.

Thus, LDD regions are formed under the conditions where channeling occurs, but the LDD forming regions have a SiO2 film that becomes a gate insulating film as a through-oxide film, and therefore, the dispersion in the sheet resistance is low. Meanwhile, the thin SiO2 film that becomes a gate insulating film is removed from the ballast resistor forming region in the step of etching for the formation of a gate electrode, and the through oxide film becomes essentially 0 nm. Accordingly, as illustrated in FIGS. 6A and 6B, the inconsistency in the sheet resistance due to the tilt angle becomes very great.

Figure 8A:
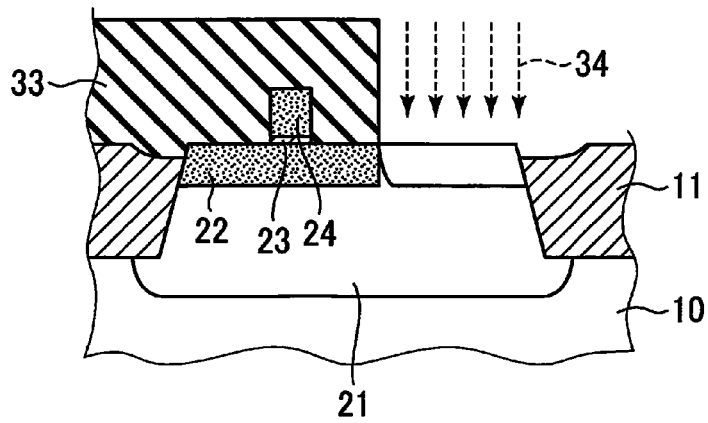
FIGS. 8A and 8B are diagrams illustrating a second mode of the step of forming a ballast resistor.
Figure 8B:
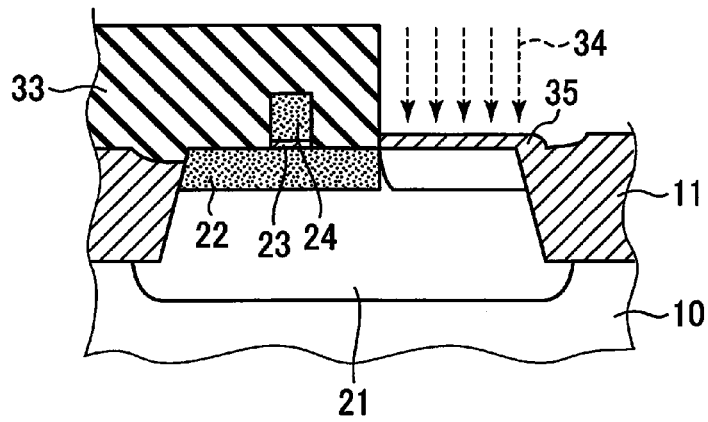

Taking the above into consideration, a second mode of the step of forming a ballast resistor is described in reference to FIGS. 8A and 8B. FIGS. 8A and 8B are diagrams illustrating a second mode of the step of forming a ballast resistor. FIG. 8A is a cross-sectional diagram in the case where the through-oxide film is 0 nm, and FIG. 8B is a cross-sectional diagram in the case where a through-oxide film is provided. In the second mode, a through-oxide film 35 is formed in the ballast resistor forming region, and therefore, the inconsistency in the sheet resistance due to a tilt angle can be reduced. In this case, the SiO2 film that remains in the ballast resistor forming region and becomes a gate oxide film of a high voltage drive transistor is used as a through-oxide film.

Figure 9A:
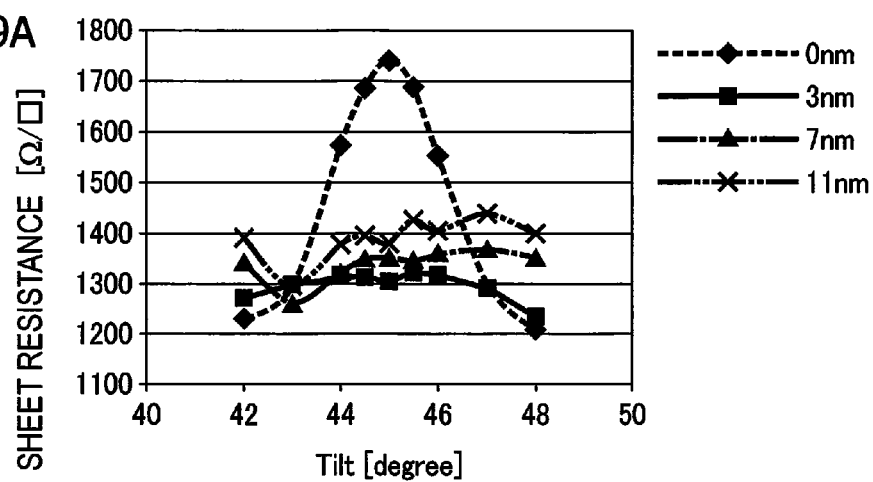
FIGS. 9A and 9B are graphs illustrating the dependency of the inconsistency in the sheet resistance due to a tilt angle on the thickness of the through oxide film.
Figure 9B:
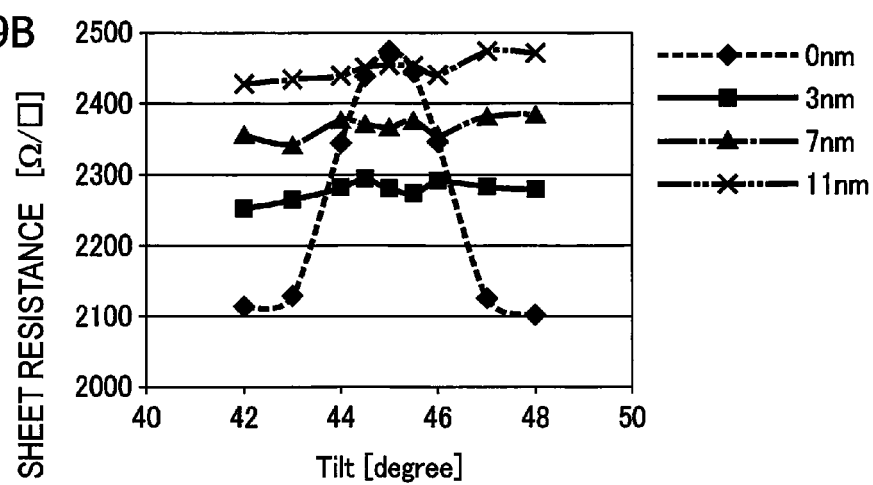

FIGS. 9A and 9B are graphs illustrating the dependency of the inconsistency in the sheet resistance due to a tilt angle on the thickness of the through oxide film. FIG. 9A is a graph illustrating the dependency of the inconsistency in the sheet resistance due to a tilt angle in an NMOS on the thickness of the through oxide film, and FIG. 9B is a graph illustrating the dependency of the inconsistency in the sheet resistance due to a tilt angle in an PMOS on the thickness of the through oxide film. Here, the conditions for ion implantation in the step of forming the LDDs in an HVTr are used. As can be clearly seen from the figures, the inconsistency is small when the film thickness of the through oxide film is 3 nm or greater in either case. Accordingly, it is desirable for the film thickness to be 3 nm or greater in the case where a through-oxide film is provided.

Figure 10A:
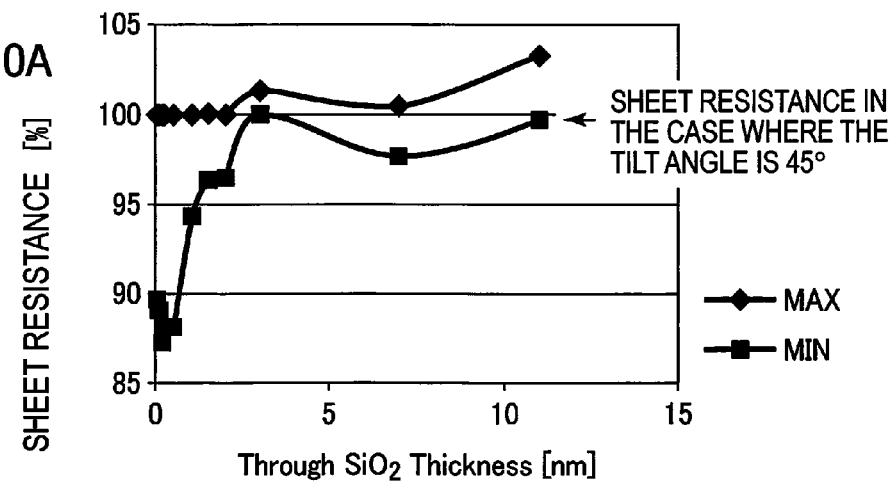
FIGS. 10A and 10B are graphs illustrating the dependency of the sheet resistance on the thickness of the through-oxide film in the case where the tilt angle is 45°±1°.
Figure 10B:
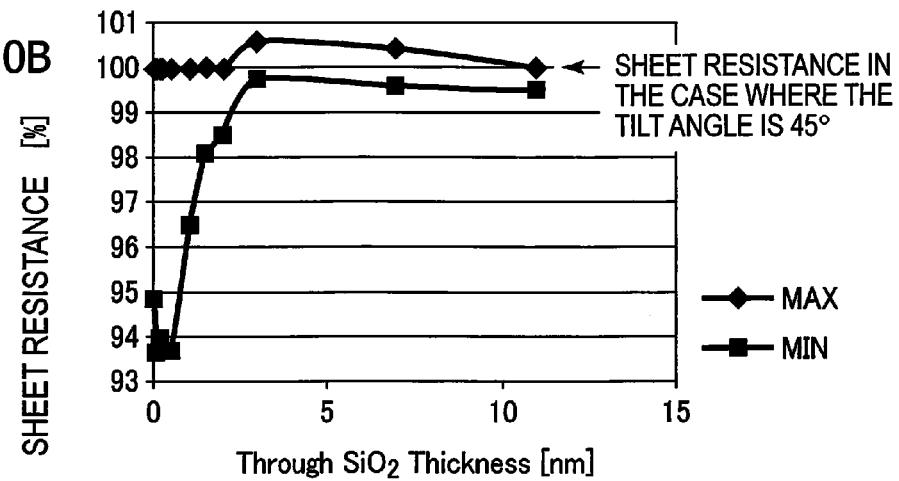

FIGS. 10A and 10B are graphs illustrating the dependency of the sheet resistance on the thickness of the through-oxide film in the case where the tilt angle is 45°±1°. FIG. 10A is a graph illustrating the dependency of the sheet resistance on the thickness of the through-oxide film in an NMOS, and FIG. 10B is a graph illustrating the dependency of the sheet resistance on the thickness of the through-oxide film in a PMOS. Here, the ion implantation conditions in the step of forming the LDDs in an HVTr are again used. In this case as well, as can be clearly seen from the figures, the inconsistency in the resistance can be made small in the case where the film thickness of the through-oxide film is 3 nm or greater.

Figure 11A:
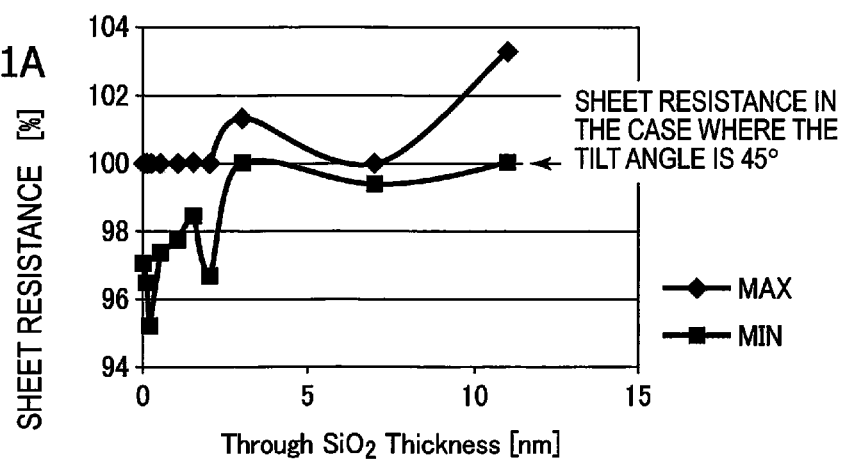
FIGS. 11A and 11B are graphs illustrating the dependency of the sheet resistance on the thickness of the through oxide film in the case where the tilt angle is 45°±0.5°.
Figure 11B:
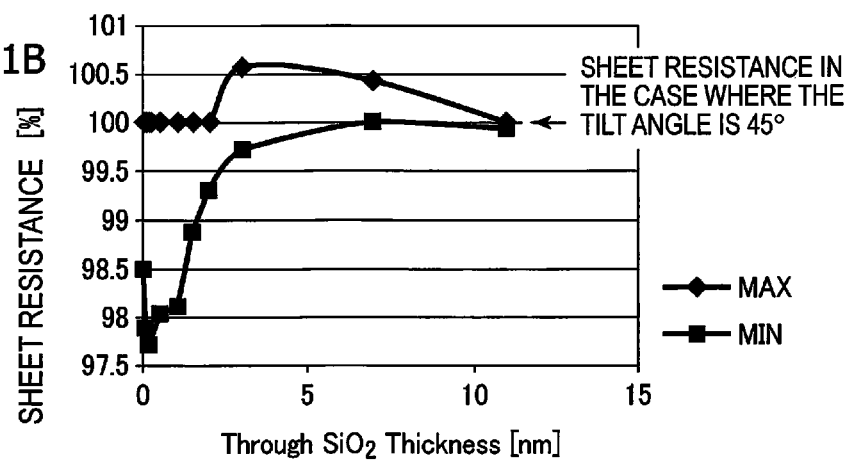

FIGS. 11A and 11B are graphs illustrating the dependency of the sheet resistance on the thickness of the through oxide film in the case where the tilt angle is 45°±0.5°. FIG. 11A is a graph illustrating the dependency of the sheet resistance on the thickness of the through-oxide film in an NMOS, and FIG. 11B is a graph illustrating the dependency of the sheet resistance on the thickness of the through-oxide film in a PMOS. Here, the ion implantation conditions in the step of forming the LDDs in an HVTr are again used. In this case as well, as can be clearly seen from the figures, the inconsistency in the resistance can be made small in the case where the film thickness of the through-oxide film is 3 nm or greater.

In the case where the same oxide film as the gate oxide film of the HVTr is used as a through-oxide film as in the second mode, the impurity concentration and the depth of the ballast resistor are essentially equal to the impurity concentration and the depth of the LDD regions of the HVTr.

Figure 12:
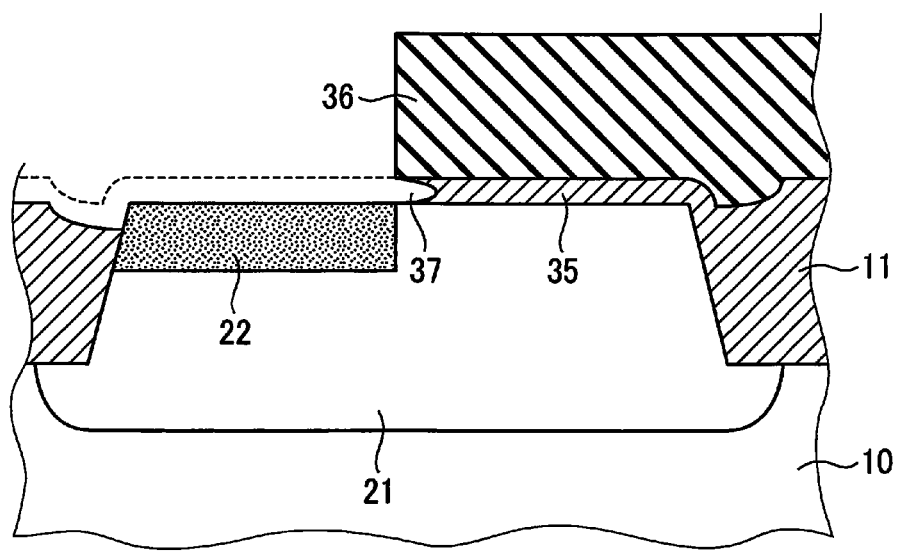
FIG. 12 is a diagram illustrating the effects of side etching at the time of through-oxide film patterning.

Next, the effects of side etching at the time of through-oxide film patterning in the second mode are described in reference to FIG. 12. FIG. 12 is a diagram illustrating the effects of side etching at the time of through-oxide film patterning. A SiO2 film that becomes a gate insulating film of an HVTr is formed in a first well region 21 of the first conductivity type and is etched using the resist pattern 36 as a mask so as to be kept as a through-oxide film 35. At this time, the etchant having HF permeates the through-oxide film 35 from the side portion directly beneath the resist pattern 36 so that a side etched portion 37 is created, and there is a risk that the side etched portion 37 may reach the region in which a salicide block is to be formed.

As a result, there is a risk that a region having no through-oxide film may be created at the time of ion implantation for forming a layer of the second conductivity type that becomes a ballast resistor, and there is a concern that the inconsistency in the ballast resistance may increase, and thus, it is possible to form a through-oxide film of a deposited oxide film so that no side etched portion is created.

Figure 13:
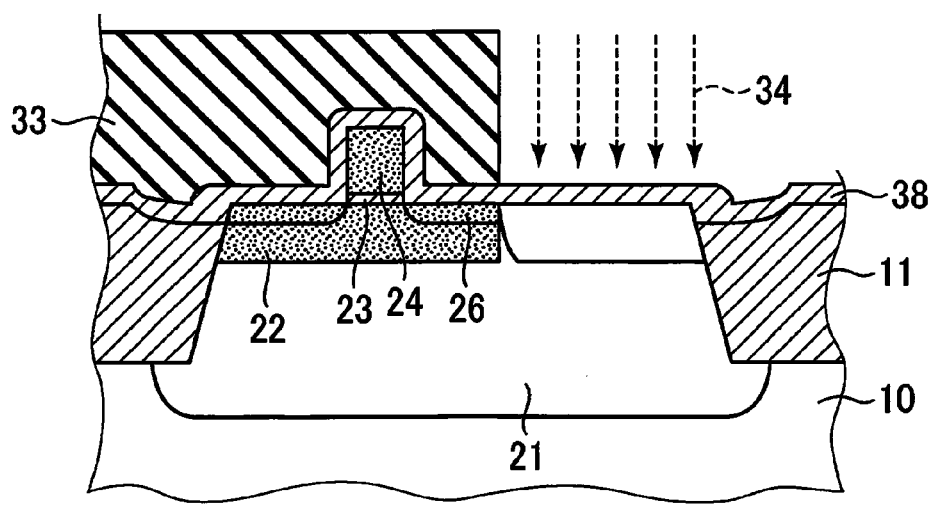
FIG. 13 is a diagram illustrating a third mode of the step of forming a ballast resistor.

FIG. 13 is a diagram illustrating a third mode of the step of forming a ballast resistor where a through-oxide film is formed as a deposited through-oxide film 38, and after that, the resist pattern 33 is used as a mask to implant impurities 34 of the second conductivity type. The deposited through-oxide film 38 may be formed after the formation of the extension regions 26 of the second conductivity type.

Figure 14:
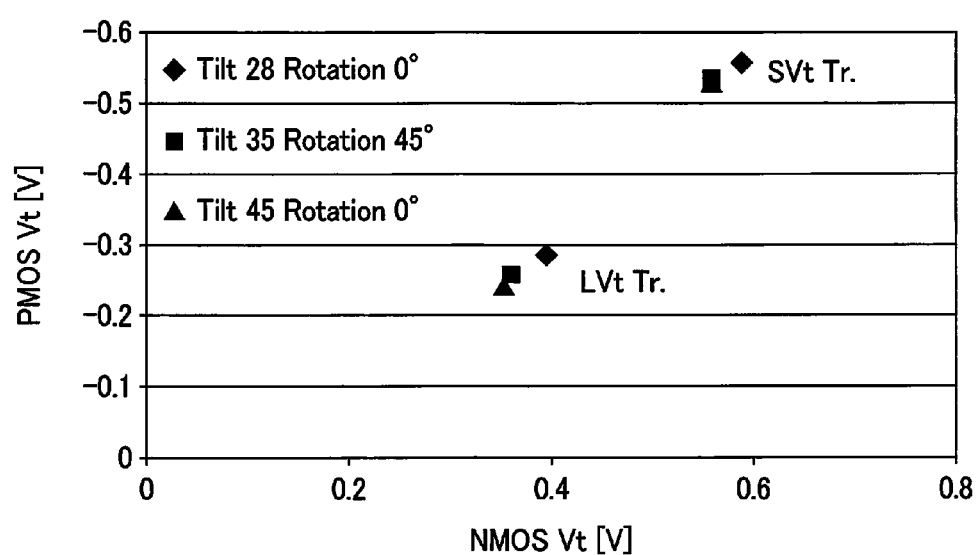
FIG. 14 is a graph illustrating the dependency of the threshold voltage on the tilt angle in the case where no deposited through-oxide film is provided.

FIG. 14 is a graph illustrating the dependency of the threshold voltage on the tilt angle in the case where no deposited through-oxide film is provided. Here, the characteristics of a low threshold voltage transistor (LVthTr) and a standard threshold voltage transistor (SVthTr), of which the gate width W is 10 μm and the gate length is 0.7 μm, are examined. Approximately the same characteristics are gained in the cases of tilt angle 45°/rotation angle 0° and tilt angle 35°/rotation angle 45° when channeling occurs, while the tendency of the threshold voltage Vth to increase is observed in the case of tilt angle 28°/rotation angle 0° when it is difficult for channeling to occur.

Figure 15A:
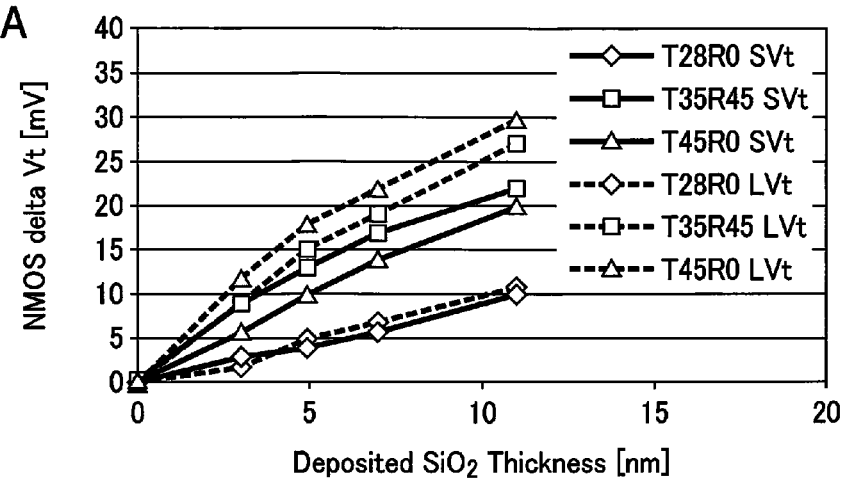
FIGS. 15A and 15B are graphs illustrating the dependency of the deviation ΔVth in the threshold voltage on the thickness of the deposited through-oxide film.
Figure 15B:
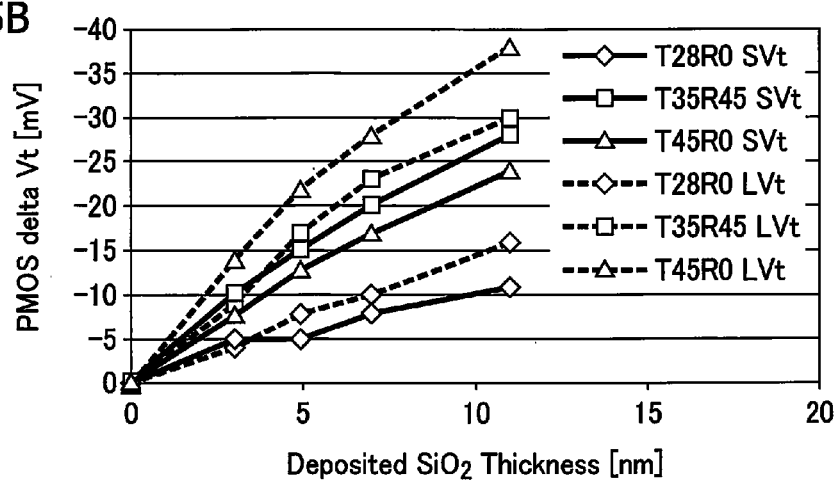

FIGS. 15A and 15B are graphs illustrating the dependency of the deviation ΔVth in the threshold voltage on the thickness of the deposited through-oxide film, and the deviation of the threshold voltage Vth in the case where a deposited through-oxide film is provided from the threshold voltage Vth in the case where no deposited through oxide film is provided, as in FIG. 14, is illustrated. FIG. 15A illustrates the dependency of the deviation ΔVth in the threshold voltage of an NMOS on the thickness of the deposited through-oxide film, and FIG. 15B illustrates the dependency of the deviation ΔVth in the threshold voltage of a PMOS on the thickness of the deposited through-oxide film. Provided that the tolerance range of the deviation ΔVth in the threshold voltage is within 30 mV, the deviation ΔVth in the threshold voltage of an NMOS is within the tolerance range under any implantation conditions as long as the film thickness of the deposited through-oxide film is 11 nm or less.

Meanwhile, in the case of a PMOS, it is necessary for the film thickness to be 7 nm or less under the conditions of tilt angle 45°/rotation angle 0°, and it is necessary for the film thickness to be 11 nm or less in the case of tilt angle 35°/rotation angle 45°. Though ΔVth is smaller in the case of tilt angle 28°/rotation angle 0°, the withstand voltage cannot be secured as part of the element characteristics.

In the case where a deposited oxide film is provided as a through-oxide film as in the third mode, the impurity concentration and the depth of the ballast resistor are approximately equal to the impurity concentration and the depth of the LDD regions in an HVTr and depend on the film thickness.

In the case of a CMOS, ballast resistors may be formed in well regions, of which the conductivity types are opposite each other, in the steps of forming channel dope regions of different conductivity types. In this case, the impurity concentration of a ballast resistor has the same value that is gained by subtracting the value of the impurity concentration of the well region containing the ballast resistor from the value of the impurity concentration of the channel dope region formed in the well region of the opposite conductivity type. In addition, the depth of the ballast resistor becomes the same as the depth of the channel dope region formed in the well region of the opposite conductivity type.

According to the disclosed semiconductor integrated circuit apparatus and manufacturing method for the same, it is possible to reduce a leak current caused by a ballast resistor and to reduce the inconsistency in the leak current.

First Embodiment

Figure 16C:
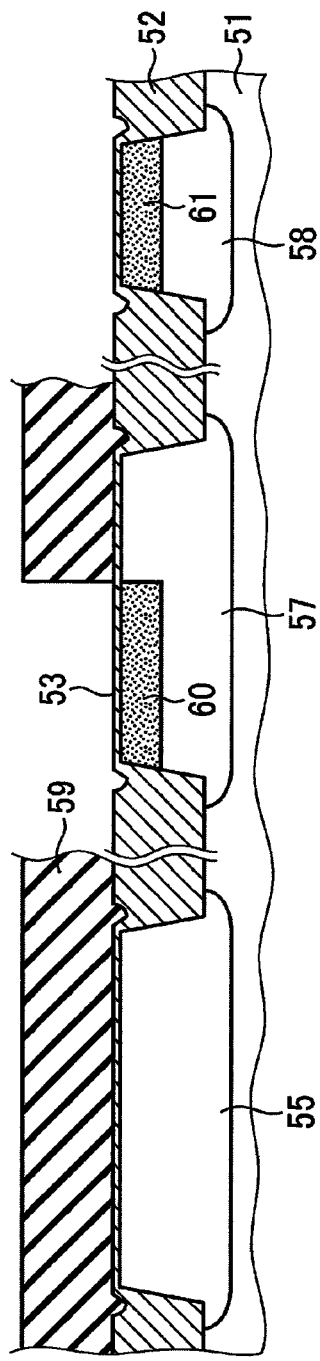
FIGS. 16C and 16D are diagrams for illustrating a step after the step in FIG. 16B of the manufacturing process for a semiconductor integrated circuit apparatus according to the first embodiment of the present invention.

Next, the semiconductor integrated circuit apparatus according to the first embodiment of the present invention is described in reference to FIGS. 16A to 24. First, the manufacturing process for the semiconductor integrated circuit apparatus according to the first embodiment of the present invention is described in reference to FIGS. 16A to 16J. As illustrated in FIG. 16A, an element isolation region 52 is formed in a silicon substrate 51 by means of shallow trench isolation (STI), and after that, a SiO2 film 53, of which the thickness is 10 nm, for example, and which becomes a sacrificial oxide film, is formed on the surface. Then, the silicon substrate 51 is covered with a resist pattern 54, excluding the high voltage drive Tr forming region, and is ion implanted with B so that a p type well region 55 of $2.2 \times 10^{17}$ cm$^{-3}$, for example, is formed.

Next, as illustrated in FIG. 16B, the resist pattern 54 is removed, and then, a new resist pattern 56 is formed so as to cover the p type well region 55. After that, B ions are implanted so as to form p type well regions 57 and 58 of $9.6 \times 10^{17}$ cm$^{-3}$, for example.

Figure 16D:
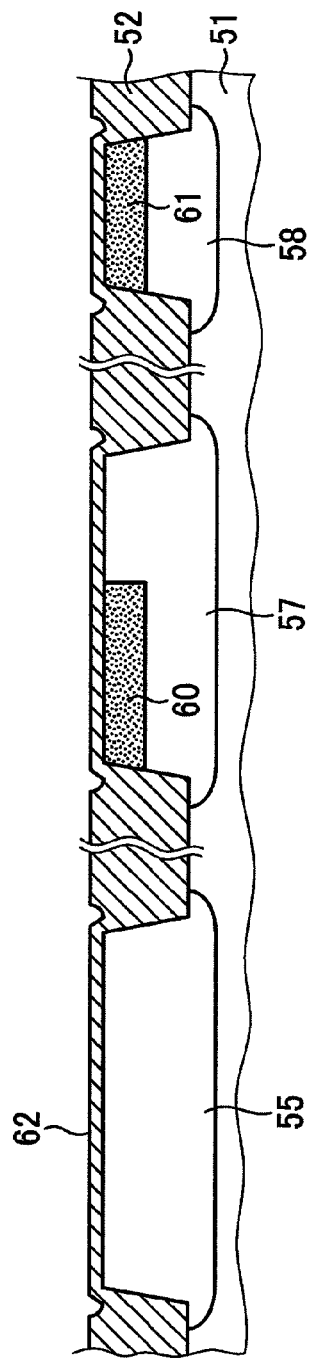

Next, as illustrated in FIG. 16C, the resist pattern 56 is removed, and then, a new resist pattern 59 is formed so as to cover the p type well region 55 and a portion of the p type well region 57, and B ions are again implanted so as to form p type channel dope regions 60 and 61. Next, as illustrated in FIG. 16D, the resist pattern 59 is removed, and then, the SiO2 film 53 is removed. After that, a SiO2 film 62, of which the thickness is 16 nm, for example, and which becomes the gate insulating film of a high voltage drive Tr, is formed through thermal oxidation.

Next, as illustrated in FIG. 16E, a resist pattern 63 is formed so as to cover the p type well region 55, and then, the SiO2 film 62 on the exposed p type well regions 57 and 58 is removed through etching. After that, as illustrated in FIG. 16F, the resist pattern 63 is removed, and then, thermal oxidation is again carried out so that a SiO2 film 64, of which the thickness is 1.8 nm and which becomes the gate insulating film of a low voltage drive Tr, is formed on the surface of the p type well regions 57 and 58.

Next, as illustrated in FIG. 16G, a polycrystalline silicon layer is deposited on the p type well regions 55, 57, and 58, and then is etched so as to form gate electrodes 65 to 67. In this etching step, the thin SiO2 film 64 that has been exposed essentially disappears. After that, a resist pattern 68 is formed so as to cover the region in the p type well region 57 where the p type channel dope region 60 is formed as well as the p type well region 58. Then, the resist pattern 68 is used as a mask when P ions are implanted in four directions at a tilt angle of 45° with an acceleration energy of 46 keV, for example, so that the amount of dosage becomes $8.0 \times 10^{12}$ cm$^{-2}$, for example, and thus, an n type LDD region 69 is formed in the p type well region 55, and at the same time, n− type region 70 is formed in the exposed portion of the p type well region 57.

Next, as illustrated in FIG. 16H, the resist pattern 68 is removed, and then, a new resist pattern 71 is formed so as to cover the p type well region 55 and the n− type region 70. This resist pattern 71 is used as a mask when B ions are implanted in four directions at a tilt angle of 28° with an acceleration energy of 15 keV, for example, so that the amount of dosage becomes $7.4 \times 10^{12}$ cm$^{-2}$, and thus, pocket regions (not shown) are formed. Subsequently, P ions are implanted in four directions at a tilt angle of 0° with an acceleration energy of 1 keV, for example, so that the amount of dosage becomes $6.0 \times 10^{13}$ cm$^{-2}$, for example, and As ions are implanted in four directions at a tilt angle of 0° with an acceleration energy of 1 keV, for example, so that the amount of dosage becomes $1.0 \times 10^{14}$ cm$^{-2}$, for example, and thus, n type extension regions 72 and 73 are formed in the p type well regions 57 and 58.

Figure 16I:
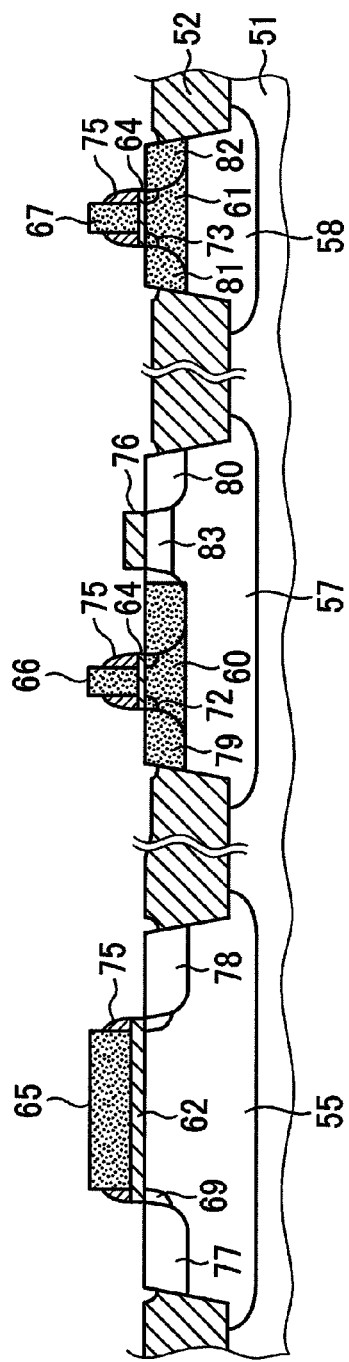
FIGS. 16I and 16J are diagrams for illustrating a step after the step in FIG. 16H of the manufacturing process for a semiconductor integrated circuit apparatus according to the first embodiment of the present invention.

Next, as illustrated in FIG. 16I, the resist pattern 71 is removed, and then, a SiO2 film is deposited on the entire surface, a resist pattern (not shown) is formed so as to cover the ballast resistor forming region, and anisotropic etching is carried out so as to form side walls 75. At this time, the SiO2 film that remains beneath the resist pattern becomes a salicide block 76.

Next, the resist pattern is removed, and then, P ions are implanted in four directions at a tilt angle of 0° with an acceleration energy of 8 keV, for example, so that the amount of dosage becomes $1.2 \times 10^{16}$ cm$^{-2}$, for example, and thus, n+ type source regions 77, 79, and 81 as well as n+ plus type drain regions 78, 80, and 82 are formed. At this time, the n− type region directly beneath the salicide block 76 becomes a ballast resistor 83.

Figure 16J:
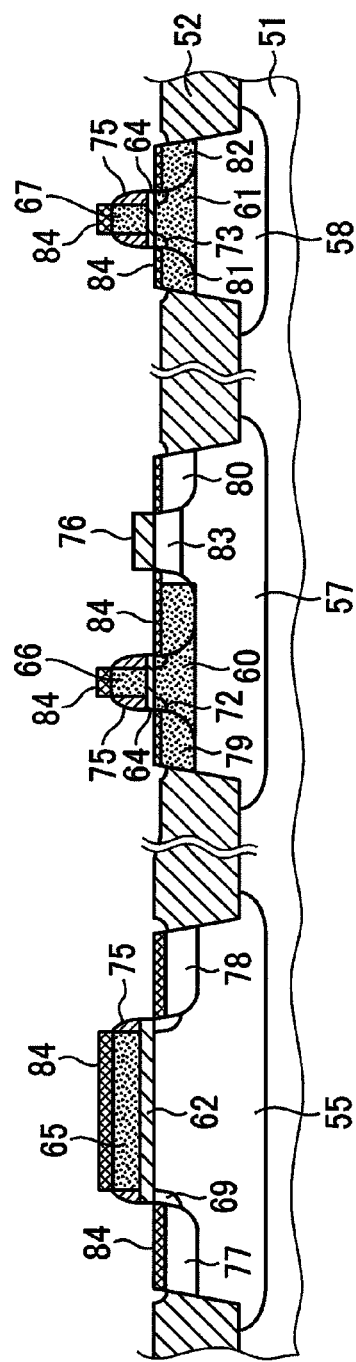

Next, as illustrated in FIG. 16J, a Co film is deposited on the entire surface, and then, heat treatment is carried out so that Co silicide layers 84 are formed on the surface of the gate electrodes 65 to 67, the n+ type source regions 77, 79, and 81 as well as the n+ type drain regions 78, 80, and 82. Then, the unreacted portions of the Co film are removed, and then, heat treatment is again carried out so as to lower the resistance of the Co silicide layers 84. After that, though not shown, an interlayer insulating film is formed, and then, plugs are formed so as to reach the Co silicide layers 84, and wires connected to these plugs are formed. The formation of such a wire structure is repeated for the required number of layers, and as a result, the basic structure of the semiconductor integrated circuit apparatus according to the first embodiment of the present invention is complete. The transistor on the left side is a high voltage drive transistor (HVTr), the transistor at the center is a low voltage drive transistor with a ballast resistor (LVI/OTr), and the transistor on the right side is a typical low voltage drive transistor (LVTr).

Figure 17A:
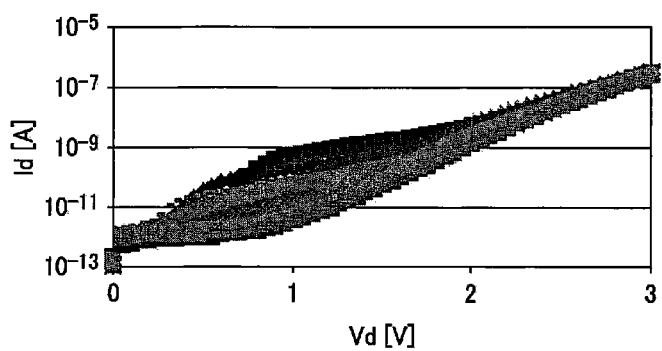
FIGS. 17A and 17B are graphs illustrating the results of the measurements of a leak current of an n channel type MOS transistor.
Figure 17B:
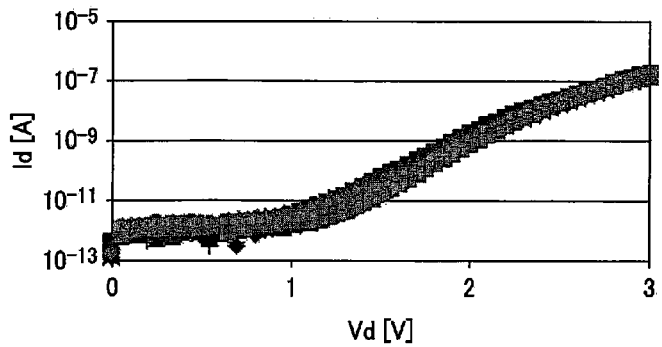
Figure 18:
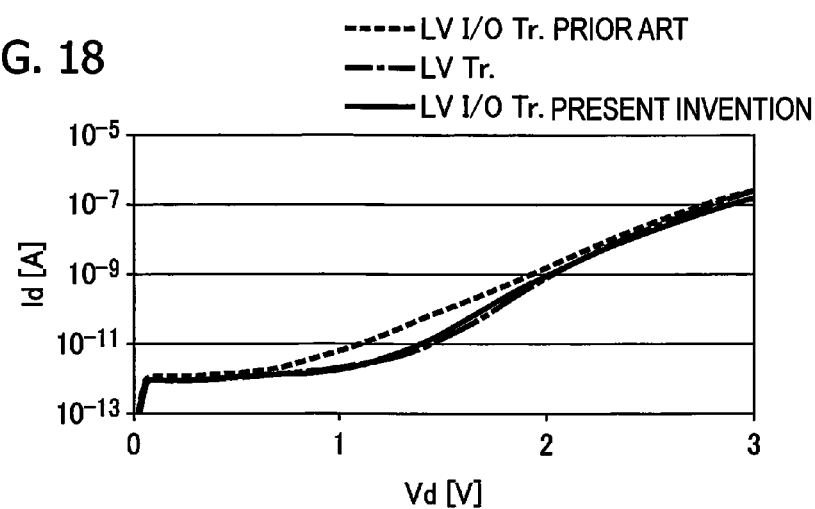
FIG. 18 is a graph illustrating the median values of the leak currents from n channel type MOS transistors.

FIGS. 17A, 17B, and 18 are graphs illustrating the characteristics of the low voltage drive transistor according to the first embodiment of the present invention. FIGS. 17A and 17B are graphs illustrating the results of the measurements of a leak current of an n channel type MOS transistor. FIG. 17A is a characteristic graph for a typical transistor to be compared, and FIG. 17B is a characteristic graph of the transistor according to the first embodiment of the present invention. Here, the low voltage drive transistors are ultra-high threshold NMOS transistors where the gate width W is 10 μm, the gate length L is 0.14 μm, and the drive voltage is 1.2 V, and the results of the measurements are gained from plots of 71 NMOS transistors, from which it can be seen that the inconsistency is small in the case of the first embodiment of the present invention. This is considered to be because CoSi spikes are suppressed.

FIG. 18 is a graph illustrating the median values of the leak currents from n channel type MOS transistors, and illustrates the median values of the results of the measurements in FIGS. 17A and 17B. Here, the median values of the LVI/OTr that has a ballast resistor and a typical LVTr that does not have a ballast resistor according to the first embodiment of the present invention are illustrated. As can be clearly seen from the figures, the leak current is reduced in the first embodiment of the present invention.

Figure 19A:
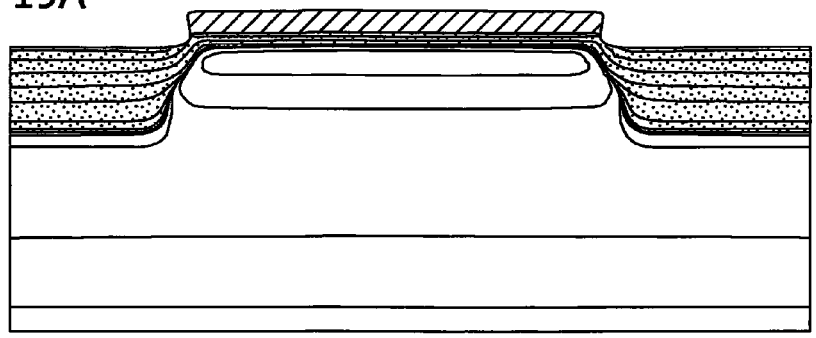
FIGS. 19A and 19B are diagrams illustrating the results of simulation of the distribution of the impurity concentration in the n channel type low voltage drive transistor with a ballast resistor according to the first embodiment of the present invention.
Figure 19B:
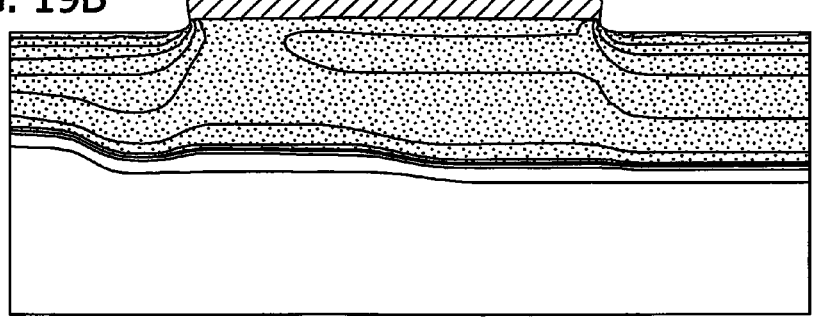

FIGS. 19A and 19B are diagrams illustrating the results of simulation of the distribution of the impurity concentration in the n channel type low voltage drive transistor with a ballast resistor according to the first embodiment of the present invention, and illustrate the distribution of the impurity concentration in the vicinity of the ballast resistor. FIG. 19A illustrates the distribution of the impurity concentration in a typical LVI/OTr to be compared, and FIG. 19B illustrates the distribution of the impurity concentration in the LVI/OTr according to the first embodiment of the present invention. As can be clearly seen from the figures, the junction position is deeper and the impurity concentration is lower in the first embodiment of the present invention.

Figure 20:
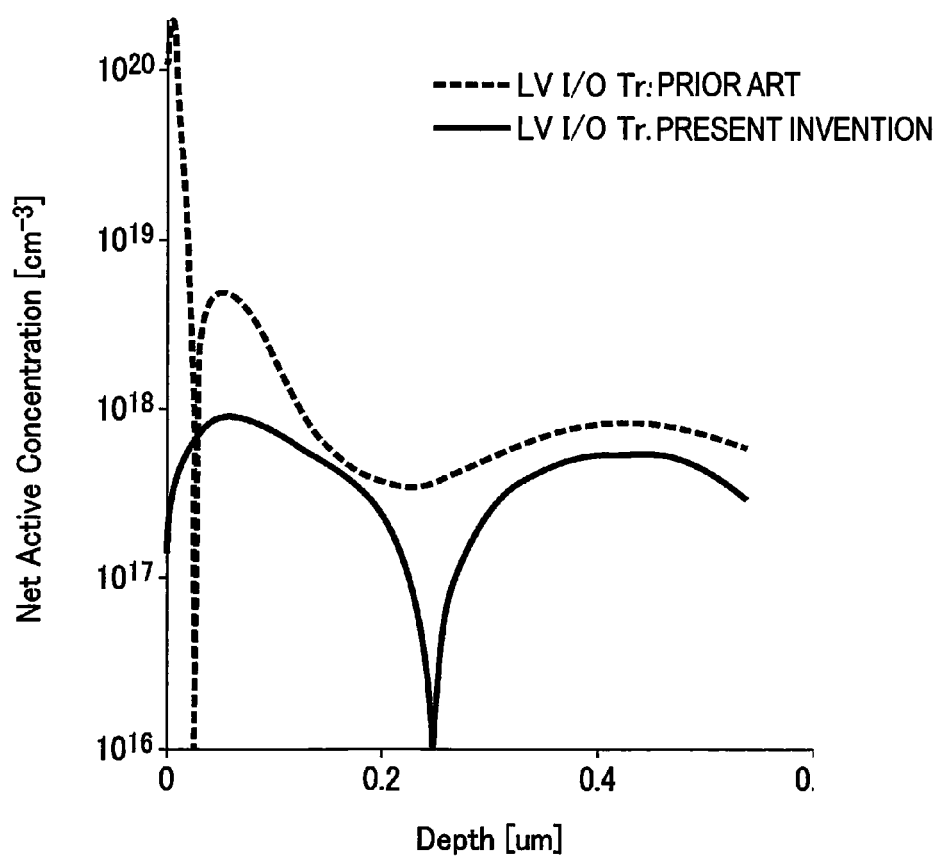
FIG. 20 is a graph illustrating the distribution of the effective impurity concentration.

FIG. 20 is a graph illustrating the distribution of the effective impurity concentration, and illustrates the profile of the effective impurity concentration in the ballast resistor portion in FIGS. 19A and 19B. As illustrated in the figure, the pn junction in the typical LVI/OTr is located approximately 0.02 µm from the surface while the pn junction in the LVI/OTr according to the first embodiment of the present invention is located approximately 0.24 µm from the surface. In addition, the effective impurity concentration is $1 \times 10^{18}$ cm$^{-3}$ or lower. Accordingly, band-to-band tunneling (BTBT) can be suppressed due to the low impurity concentration.

Figure 21A:
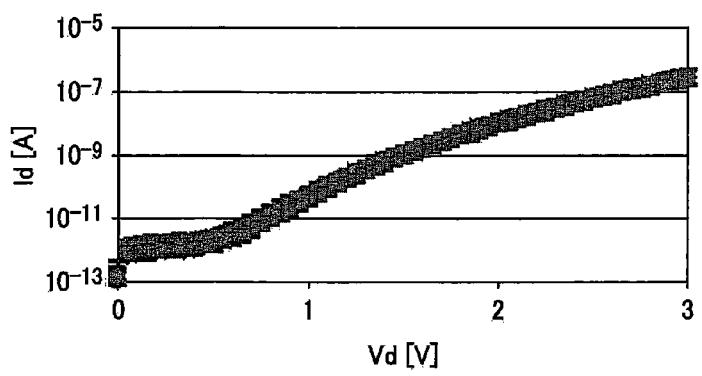
FIGS. 21A and 21B are graphs illustrating the results of the measurements of a leak current from a p channel type MOS transistor.
Figure 21B:
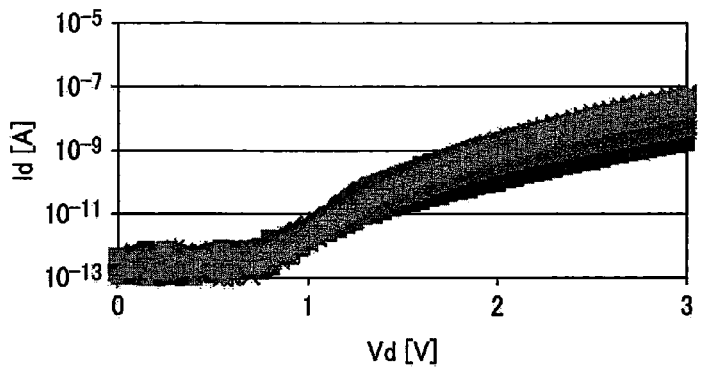
Figure 22:
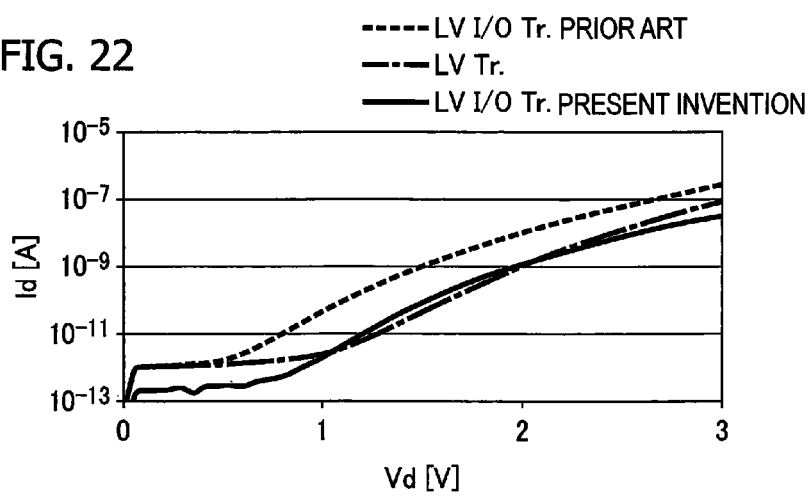
FIG. 22 is a graph illustrating the median value of the leak current from a p channel type MOS transistor.

FIGS. 21A, 21B, and 22 are graphs illustrating the characteristics of a p channel type low voltage drive transistor to which the structure according to the first embodiment of the present invention is applied. FIGS. 21A and 21B are graphs illustrating the results of the measurements of a leak current from a p channel type MOS transistor. FIG. 21A is a characteristic graph of a typical transistor to be compared, and FIG. 21B is a characteristic graph of the transistor according to the first embodiment of the present invention. Here as well, the low voltage drive transistors are ultra-high threshold PMOS transistors where the gate width W is 10 µm, the gate length L is 0.14 µm, and the drive voltage is 1.2 V, and the results of the measurements are gained from plots of 71 NMOS transistors.

FIG. 22 is a graph illustrating the median value of the leak current from a p channel type MOS transistor, and illustrates the median value of the results of the measurements in FIGS. 21A and 21B. Here, the median values of the LVI/OTr that has a ballast resistor and a typical LVTr that does not have a ballast resistor according to the first embodiment of the present invention are illustrated. As can be clearly seen from the figures, the leak current is reduced in the first embodiment of the present invention.

Figure 23A:
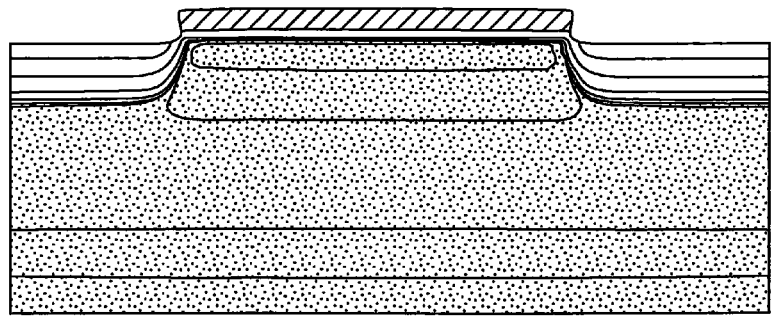
FIGS. 23A and 23B are diagrams illustrating the results of simulation of the distribution of the impurity concentration in the p channel type low voltage drive transistor with a ballast resistor according to the first embodiment of the present invention.
Figure 23B:
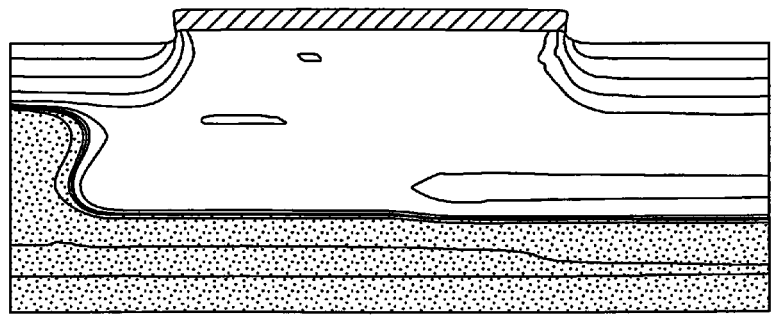

FIGS. 23A and 23B are diagrams illustrating the results of simulation of the distribution of the impurity concentration in the p channel type low voltage drive transistor with a ballast resistor according to the first embodiment of the present invention, and illustrates the distribution of the impurity concentration in the vicinity of the ballast resistor. FIG. 23A illustrates the distribution of the impurity concentration of a typical LVI/OTr to be compared, and FIG. 23B illustrates the distribution of the impurity concentration of the LVI/OTr according to the first embodiment of the present invention. As can be clearly seen from the figures, the junction position is deeper and the impurity concentration is lower in the first embodiment of the present invention.

Figure 24:
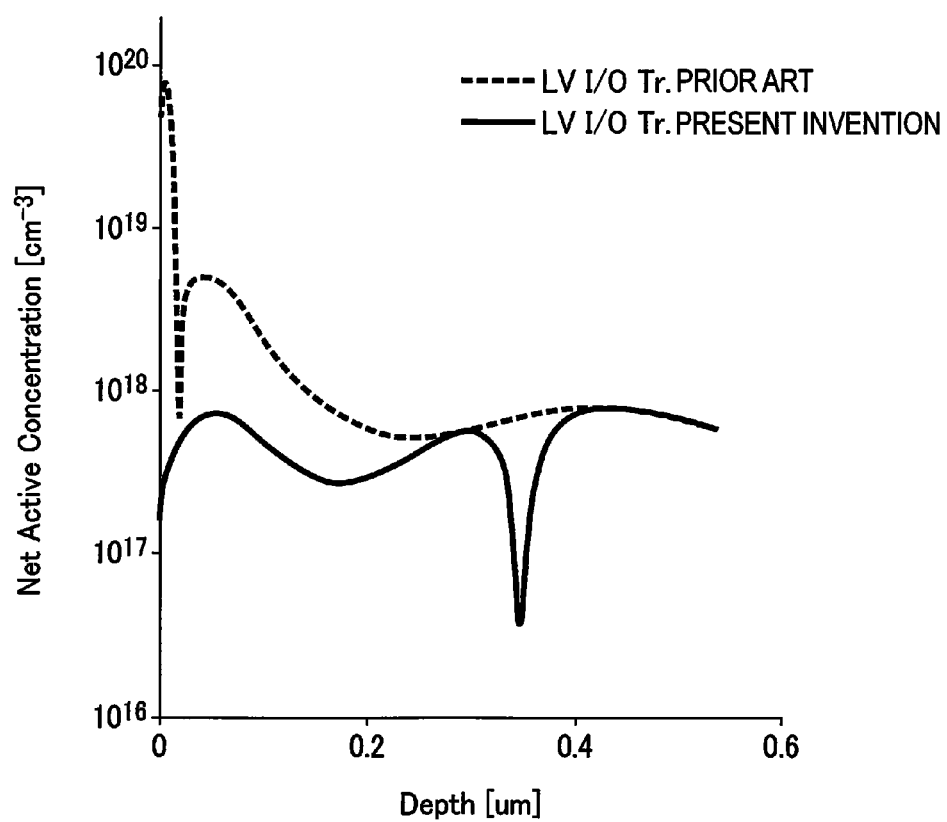
FIG. 24 is a graph illustrating the distribution of the effective impurity concentration.

FIG. 24 is a graph illustrating the distribution of the effective impurity concentration, and illustrates the profile of the effective impurity concentration in the ballast resistor portion in FIGS. 23A and 23B. As illustrated in the figure, the pn junction in the typical LVI/OTr is located approximately 0.02 µm from the surface while the pn junction in the LVI/OTr according to the first embodiment of the present invention is located approximately 0.36 µm from the surface. In addition, the effective impurity concentration is $1 \times 10^{18}$ cm$^{-3}$ or lower. Accordingly, band-to-band tunneling (BTBT) can be suppressed due to the low impurity concentration.

In the first embodiment of the present invention, the ballast resistor is formed in the process for forming LDD regions in a high voltage drive transistor, and therefore, the pn junction can be located deeper and made with a lower impurity concentration, and as a result, it is possible to reduce the leak current that occurs together with BTBT and lower the inconsistency.

Second Embodiment

Figure 25:
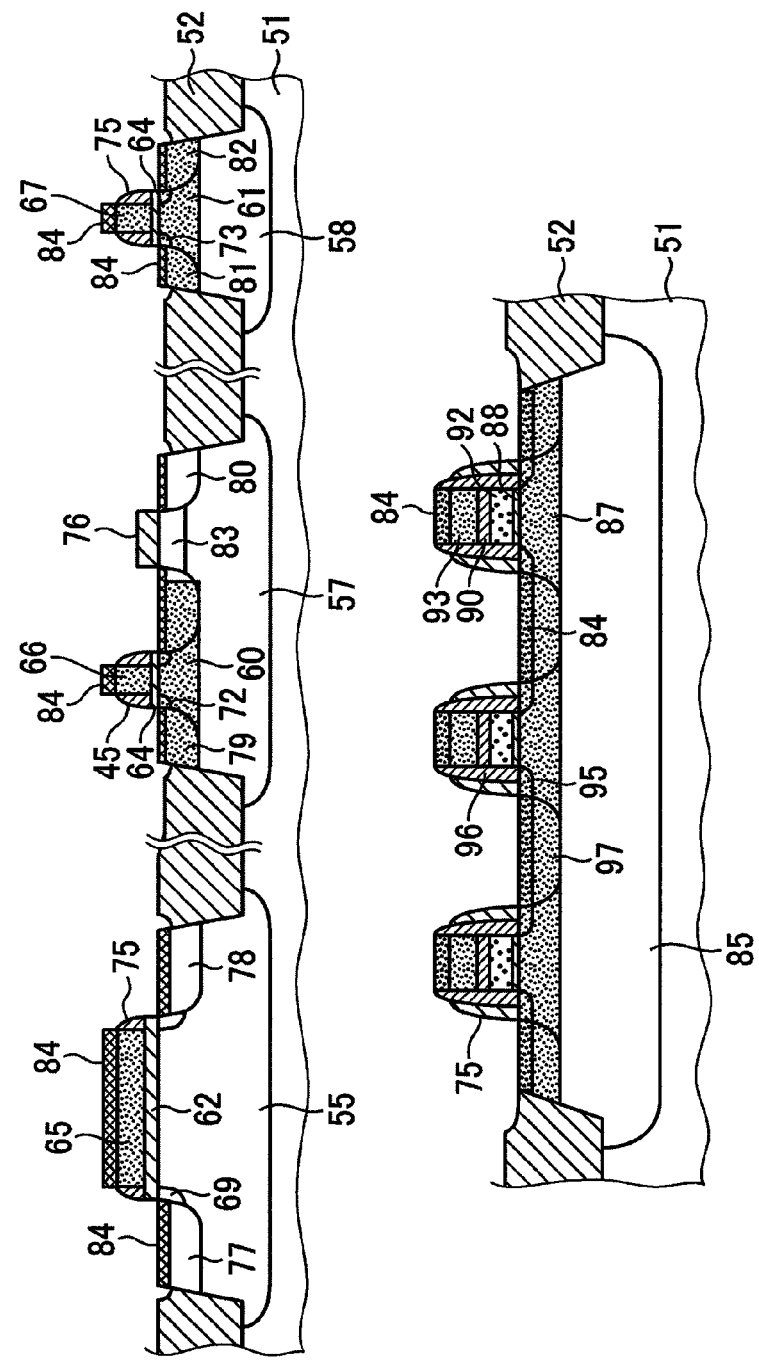
FIG. 25 is a schematic cross-sectional diagram illustrating the semiconductor integrated circuit apparatus according to the second embodiment of the present invention.

Next, the semiconductor integrated circuit apparatus according to the second embodiment of the present invention is described in reference to FIGS. 25 to 26J. FIG. 25 is a schematic cross-sectional diagram illustrating the semiconductor integrated circuit apparatus according to the second embodiment of the present invention where flash memory cells are added to the semiconductor integrated circuit apparatus according to the first embodiment. Though FIG. 25 illustrates the transistors that form a peripheral circuit, an internal logic circuit, and an I/O unit, and a flash memory cell portion at two separate levels in order to make the illustrating easy to understand, they are actually formed on the same substrate.

The transistors that form a peripheral circuit, an internal logic circuit, and an I/O unit are exactly the same as in the first embodiment, and therefore, the flash memory cell portion is described below. A flash memory element is provided with a gate electrode portion made of a tunnel oxide film 88, a floating gate 92, an ONO film 90, and a control gate 93, and with side walls 75 and 96 with a three-layer structure of an oxide film (not shown), an SiN film, and an oxide film.

Figure 26A:
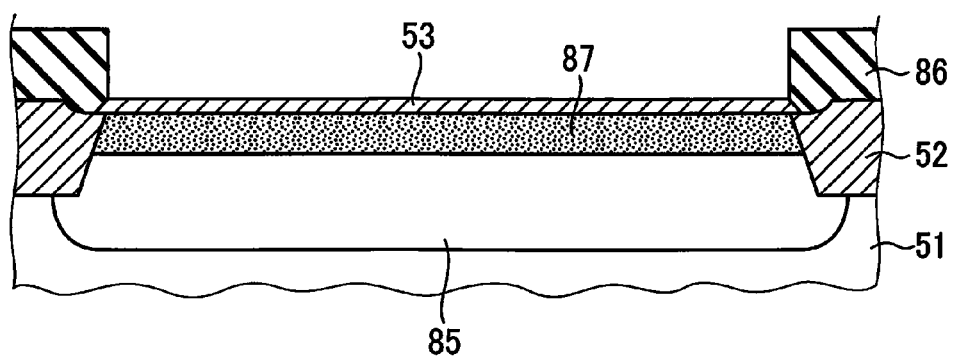
FIGS. 26A and 26B are diagrams for illustrating a flash memory unit in a step in the middle of the manufacturing process for a semiconductor integrated circuit apparatus according to the second embodiment of the present invention.

Next, the manufacturing process for the flash memory cell portion is described in reference to FIGS. 26A to 26J. First, as illustrated in FIG. 26A, a p type well region 85 is formed within the same process for a high voltage drive transistor (HVTr) during the process for forming respective wells for the transistors that form the peripheral circuit, the internal logic circuit, and the I/O unit. Then, a resist pattern 86 is used as a mask to implant B ions, and thus, a p type channel dope region 87 is formed.

Figure 26B:
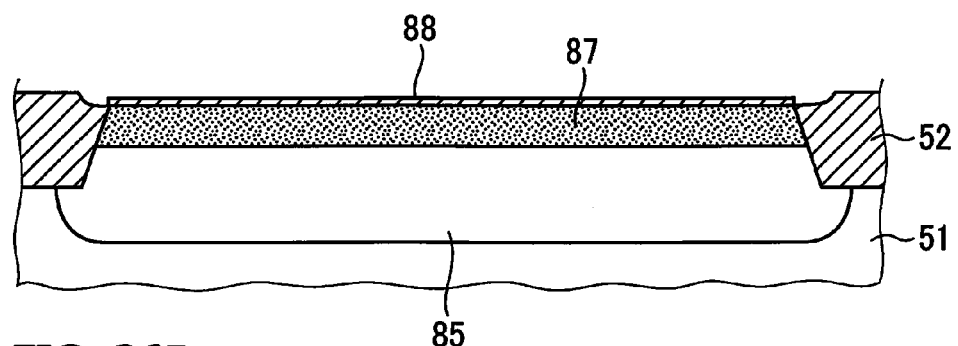

Next, as illustrated in FIG. 26B, the sacrificial oxide film made of a SiO2 film 53 is removed and a tunnel oxide film 88, of which the thickness is 10 nm, for example, is formed on the surface of the p type well region 85 through thermal oxidation before the formation of gate oxide films in other regions.

Next, as illustrated in FIG. 26C, an amorphous silicon layer 89, of which the thickness is 70 nm, for example, and into which P is doped, is formed and then etched so as to remain only on the p type well region 85. After that, a SiO2 film, of which the thickness is 5 nm, for example, and an SiN film, of which the thickness is 10 nm, for example, are deposited on the entire surface, which is then followed by thermal oxidation at 950° C. for 90 minutes, for example, so as to gain an ONO film 90, of which the total thickness is approximately 20 nm, for example. Then, as illustrated in FIG. 26D, the resist pattern 91 is used as a mask for etching so as to remove the ONO film 90 that has been deposited on the areas other than the p type well region 85.

Figure 26E:
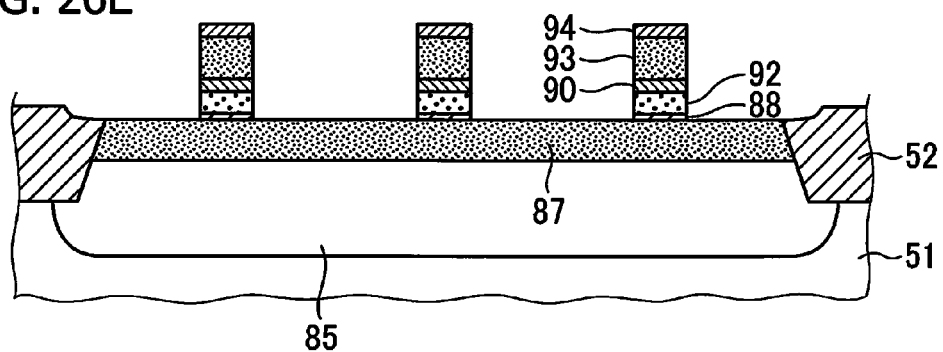
FIGS. 26E and 26F are diagrams for illustrating the flash memory unit in a step after the step in FIG. 26D of the manufacturing process for a semiconductor integrated circuit apparatus according to the second embodiment of the present invention.

Next, as illustrated in FIG. 26E, gate electrode portions made of a tunnel oxide film 88, a floating gate 92, an ONO film 90, a control gate 93, and an SiN film 94 are formed before processing the polycrystalline silicon layer that has been deposited on other regions into gate electrodes.

Figure 26F:
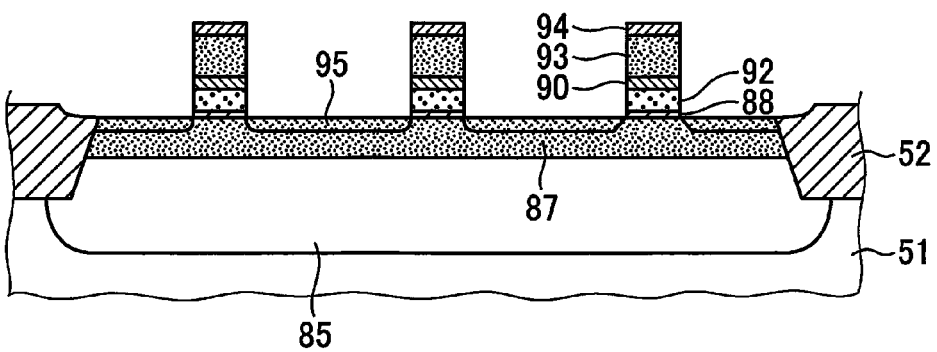

Next, as illustrated in FIG. 26F, the gate electrode portions are used as a mask so that As ions are implanted at a tilt angle of 0° with an acceleration energy of 50 keV so as to gain an amount of dosage of 6.0×10$^{14}$ cm$^{-2}$, for example, and thus, n type LDD regions 95 are formed.

Next, as illustrated in FIG. 26G, thin oxide films (not shown) are formed on the sides of the gate electrode portions through thermal oxidation, and after that, an SiN film is deposited on the entire surface, which is then followed by anisotropic etching so that side walls 96 made of the SiN film are formed. After this process, the polycrystalline silicon layer that has been deposited on other regions is etched so as to form gate electrodes (65 to 67).

Next, as illustrated in FIG. 26H, side walls 75 are formed of a SiO2 film on the sides of the gate electrode structures of flash memory elements during the process for forming side walls 75 on the sides of the gate electrodes that have been formed in other regions.

Next, as illustrated in FIG. 26I, the side walls 75 and 96 are used as a mask to implant P ions so that n+ type source/drain regions 97 are formed during the process for forming sources/drains in other regions.

Next, as illustrated in FIG. 26J, a Co silicide layer 84 is formed on the surfaces of the n+ type source/drain regions 97 and the control gates 93 during the process for forming a Co silicide layer 84 on the surfaces of the source/drain regions and the gate electrodes in other regions. After that, though not shown, an interlayer insulating film is formed, and then, plugs that reach a Co silicide layer 84 are formed, which is followed by the formation of wires connected to these plugs. The formation of such a wire structure is repeated for the required number of layers, and thus, the basic structure of the semiconductor integrated circuit apparatus according to the second embodiment of the present invention is complete.

In the semiconductor integrated circuit apparatus with flash memory elements according to the second embodiment of the present invention as well, the ballast resistor in the LVI/OTr is formed during the LDD forming process for the HVTr, and therefore, the leak current can be reduced and the inconsistency in the sheet resistance can also be reduced.

Third Embodiment

Figure 27C:
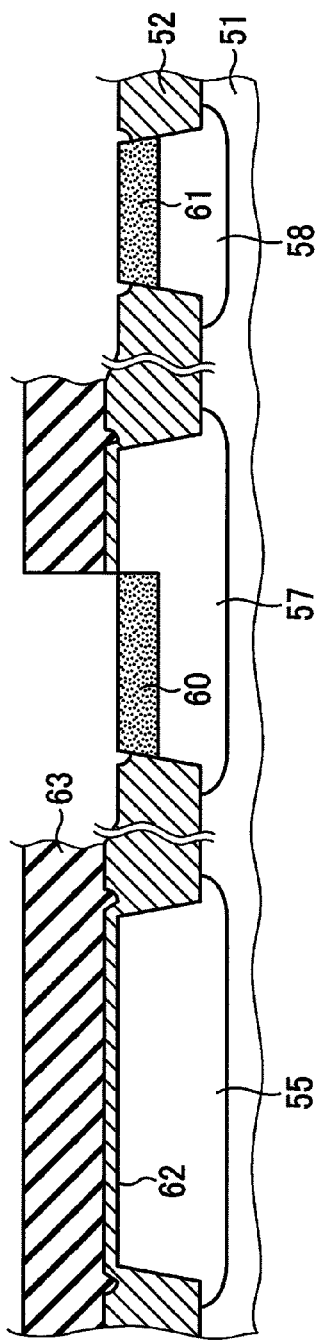
FIGS. 27C and 27D are diagrams for illustrating a step after the step in FIG. 27B of the manufacturing process for a semiconductor integrated circuit apparatus according to the third embodiment of the present invention.

Next, the semiconductor integrated circuit apparatus according to the third embodiment of the present invention is described in reference to FIGS. 27A to 29B. First, the manufacturing method for the semiconductor integrated circuit apparatus according to the third embodiment of the present invention is described in reference to FIGS. 27A to 27J. As illustrated in FIG. 27A, in the same manner as in the first embodiment, an element isolation region 52 is formed on a silicon substrate 51 by means of STI, and then, a p type well region 55 of 2.2×10$^{17}$ cm$^{-3}$, for example, is formed in the high voltage drive Tr forming region. After that, p type well regions 57 and 58 of 9.6×10$^{17}$ cm$^{-3}$, for example, are formed in low voltage drive Tr forming regions. Then, the resist pattern 59 is used as a mask to form p type channel dope regions 60 and 61 on the surface of a portion of the p type well region 57 and the p type well region 58. After that, as illustrated in FIG. 27B, a SiO2 film 62, of which the thickness is 16 nm, for example, that becomes a gate insulating film of a high voltage drive Tr is formed through thermal oxidation.

Next, as illustrated in FIG. 27C, a resist pattern 63 is formed so as to cover the p type well region 55 and a portion of the p type well region 57, and then, the SiO2 film 62 on the exposed p type well regions 57 and 58 is removed through etching.

Figure 27D:
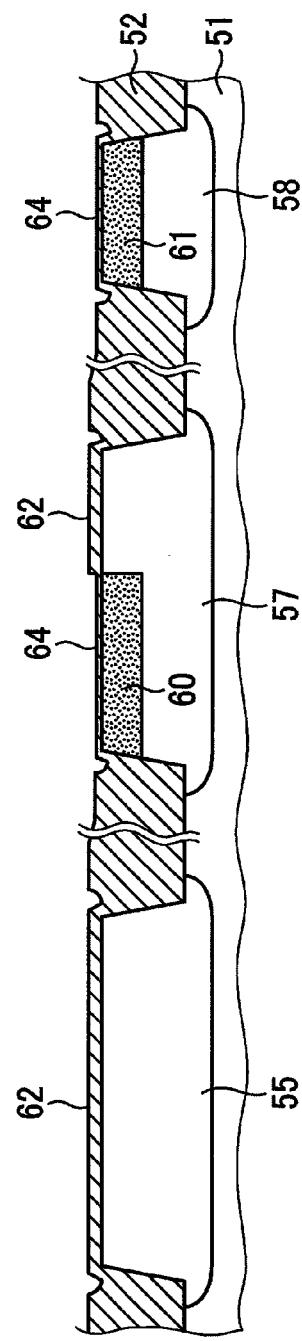

Next, as illustrated in FIG. 27D, the resist pattern 63 is removed, which is then followed by thermal oxidation again so that a SiO2 film 64, of which the thickness is 1.8 nm, for example, that becomes a gate insulating film of a low voltage drive Tr is formed on the surface of the p type well regions 57 and 58.

Next, as illustrated in FIG. 27E, a polycrystalline silicon layer is deposited on the p type well regions 55, 57, and 58, which is then followed by etching so that gate electrodes 65 to 67 are formed. At this time, the film thickness of the SiO2 film 62 on the ballast forming region is reduced by approximately 5 nm during the gate etching process, and at the same time, the thin SiO2 films 64 that have been exposed essentially disappear.

Next, as illustrated in FIG. 27F, a resist pattern 68 is formed so as to cover the region in the p type well region 57 where the p type channel dope region 60 is formed and the p type well region 58. After that, this resist pattern 68 is used as a mask so as to implant P ions in four directions at a tilt angle of 45° with an acceleration energy of 46 keV, for example, so that an amount of dosage becomes 8.0×10$^{12}$ cm$^{-2}$, and thus, n type LDD regions 69 are formed in the p type well region 55, and at the same time, an n− type region 70 is formed in the exposed portion of the p type well region 57. At this time, the SiO2 film 62 is provided on the n− type region 70, and therefore, the channeling factor is suppressed and the inconsistency due to the tilt angle is reduced, and thus, a stable sheet resistance value can be gained.

Next, as illustrated in FIG. 27G, the resist pattern 68 is removed, and then, a new resist pattern 71 is formed so as to cover the p type well region 55 and the n− type region 70. This resist pattern 71 is used as a mask so as to implant B ions in four directions at a tilt angle of 28° with an acceleration energy of 15 keV, for example, so that the amount of dosage becomes 7.4×10$^{12}$ cm$^{-2}$, for example, and thus, pocket regions (not shown) are formed. Subsequently, P ions are implanted in four directions at a tilt angle of 0° with an acceleration energy of 1 keV, for example, so that the amount of dosage becomes 6.0×10$^{13}$ cm$^{-2}$, and As ions are implanted in four directions at a tilt angle of 0° with an acceleration energy of 1 keV, for example, so that the amount of dosage becomes 1.0×10$^{14}$ cm$^{-2}$, for example, and thus, n type extension regions 72 and 73 are formed in the p type well regions 57 and 58.

Next, as illustrated in FIG. 27H, the resist pattern 71 is removed, and then, a SiO2 film is deposited on the entire surface. After that, a resist pattern 74 is formed so as to cover the ballast resistor forming region, which is then followed by anisotropic etching so that side walls 75 are formed. At this time, the SiO2 film that remains beneath the resist pattern 74 becomes a salicide block 76.

Next, as illustrated in FIG. 27I, the resist pattern 74 is removed, and then, P ions are implanted at a tilt angle of 0° with an acceleration energy of 8 keV, for example, so that the amount of dosage becomes 1.2×10$^{16}$ cm$^{-2}$, and thus, n+ type source regions 77, 79, and 81 as well as n+ type drain regions 78, 80, and 82 are formed. At this time, the n− type region directly beneath the salicide block 76 becomes a ballast resistor 83.

Next, as illustrated in FIG. 27J, a Co film is deposited on the entire surface, which is then followed by heat treatment so that a Co silicide layer 84 is formed on the surface of the gate electrodes 65 to 67, the n+ type source regions 77, 79, and 81 as well as the n+ type drain regions 78, 80, and 82. After that, the unreacted portions of the Co film are removed, which is then followed by heat treatment again so that the resistance of the Co silicide layer 84 is lowered.

After that, though not shown, an interlayer insulating film is formed, and then, plugs that reach a Co silicide layer 84 are formed, which is followed by the formation of wires connected to these plugs. The formation of such a wire structure is repeated for the required number of layers, and thus, the basic structure of the semiconductor integrated circuit apparatus according to the third embodiment of the present invention is complete.

Figure 28A:
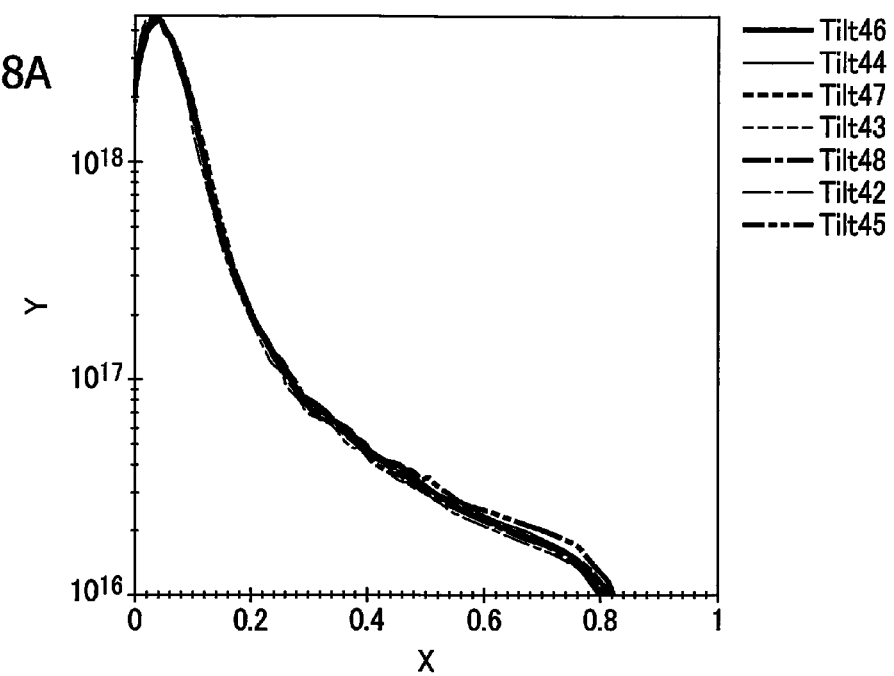
FIGS. 28A and 28B illustrate profiles of the impurity concentrations in the ballast resistor portion of an NMOS.
Figure 28B:
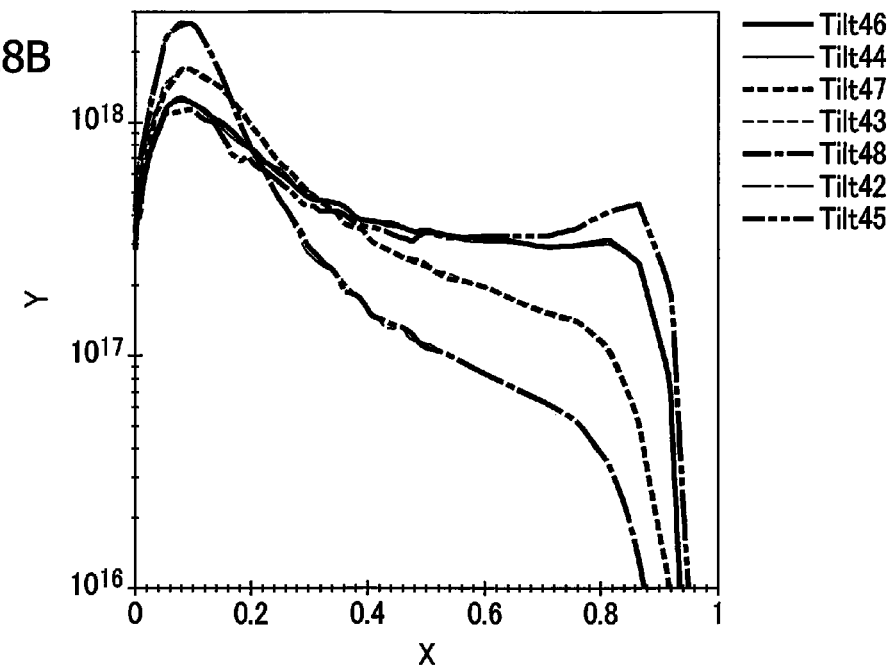

FIGS. 28A and 28B illustrate profiles of the impurity concentrations in the ballast resistor portion of an NMOS. FIG. 28A illustrates profiles of the impurity concentrations in the ballast resistor portion of the LVI/OTr according to the third embodiment of the present invention, and FIG. 28B illustrates profiles of the impurity concentrations in the ballast resistor portion of the LVI/OTr according to the first embodiment to be compared. As is clear from FIG. 28A, almost no change is observed in the profiles when the tilt angle is varied between 42° and 48° in the case where the thickness of the SiO2 film 62 is 11 nm. Meanwhile, as illustrated in FIG. 28B, inconsistency is observed in the profiles in the case where the thickness of the SiO2 film 62 is 0 nm.

As can be clearly seen from the comparison between FIGS. 28A and 28B, the channeling factor is reduced, and thus, the inconsistency in the profiles due to the tilt angle is reduced by providing a SiO2 film when an n type low impurity concentration layer is formed for the ballast resistor.

Figure 29A:
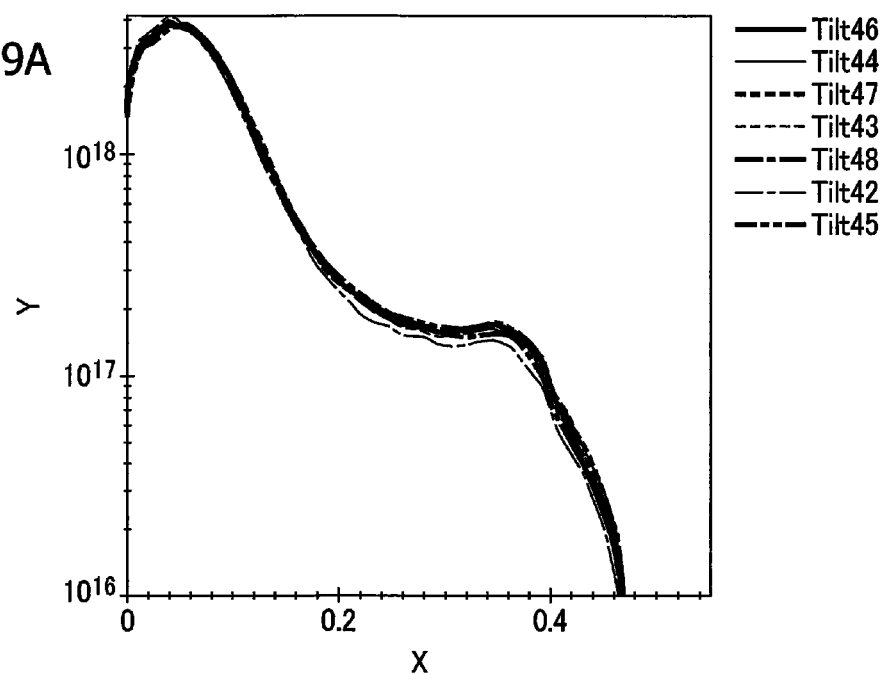
FIGS. 29A and 29B illustrate profiles of the impurity concentrations in the ballast resistor portion of a PMOS.
Figure 29B:
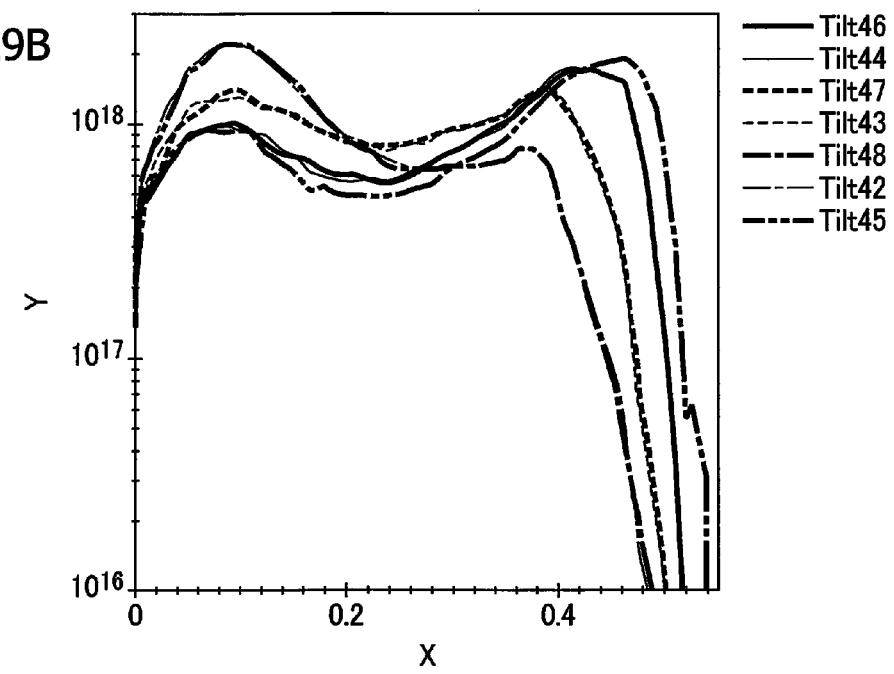

FIGS. 29A and 29B illustrate profiles of the impurity concentrations in the ballast resistor portion of a PMOS. FIG. 29A illustrates profiles of the impurity concentrations in the ballast resistor portion of the p channel type LVI/OTr, to which the second embodiment of the present invention is applied. FIG. 29B illustrates profiles of the impurity concentrations in the ballast resistor portion of the p channel type LVI/OTr, to which the first embodiment is applied for comparison. As is clear from FIG. 29A, almost no change is observed in the profiles when the tilt angle is varied between 42° and 48° in the case where the thickness of the SiO2 film 62 is 11 nm. Meanwhile, as illustrated in FIG. 29B, inconsistency is observed in the profiles in the case where the thickness of the SiO2 film 62 is 0 nm.

As can be clearly seen from the comparison between FIGS. 29A and 29B, the channeling factor is reduced, and thus, the inconsistency in the profiles due to the tilt angle is reduced by providing a SiO2 film when a p type low impurity concentration layer is formed for the ballast resistor.

In the third embodiment of the present invention as well, the ballast resistor is formed in the process for forming LDD regions in a high voltage drive transistor, and therefore, the pn junction can be located deeper and made with a lower impurity concentration, and as a result, it is possible to reduce the leak current that occurs together with BTBT and lower the inconsistency. In addition, ions are implanted through a SiO2 film for the formation of a ballast resistor during the process for forming the LDD regions in a high voltage drive transistor, and therefore, the channeling factor can be reduced and the inconsistency in the profiles due to the tilt angle can also be reduced.

Fourth Embodiment

Figure 30C:
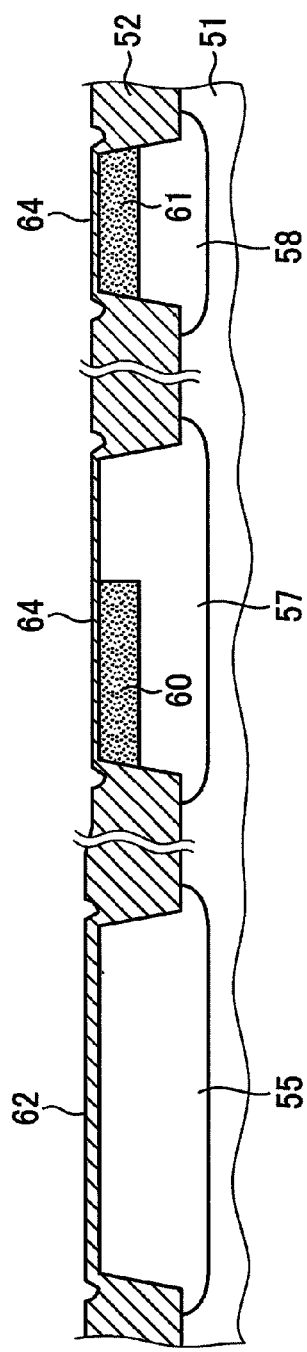
FIGS. 30C and 30D are diagrams for illustrating a step after the step in FIG. 30B of the manufacturing process for a semiconductor integrated circuit apparatus according to the fourth embodiment of the present invention.

Next, the semiconductor integrated circuit apparatus according to the fourth embodiment of the present invention is described in reference to FIGS. 30A to 30J. First, as illustrated in FIG. 30A, in the same manner as in the first embodiment, an element isolation region 52 is formed on a silicon substrate 51 by means of STI, and then, a p type well region 55 of $2.2 \times 10^{17}$ cm$^{-3}$, for example, is formed in the high voltage drive Tr forming region. After that, p type well regions 57 and 58 of $9.6 \times 10^{17}$ cm$^{-3}$, for example, are formed in low voltage drive Tr forming regions.

Next, p type channel dope regions 60 and 61 are formed on the surface of a portion of the p type well region 57 and the p type well region 58. After that, a SiO2 film 62, of which the thickness is 16 nm, for example, that becomes a gate insulating film of a high voltage drive Tr is formed through thermal oxidation.

Next, as illustrated in FIG. 30B, a resist pattern 63 is formed so as to cover the p type well region 55, and then, the SiO2 film 62 on the exposed p type well regions 57 and 58 is removed through etching.

Figure 30D:
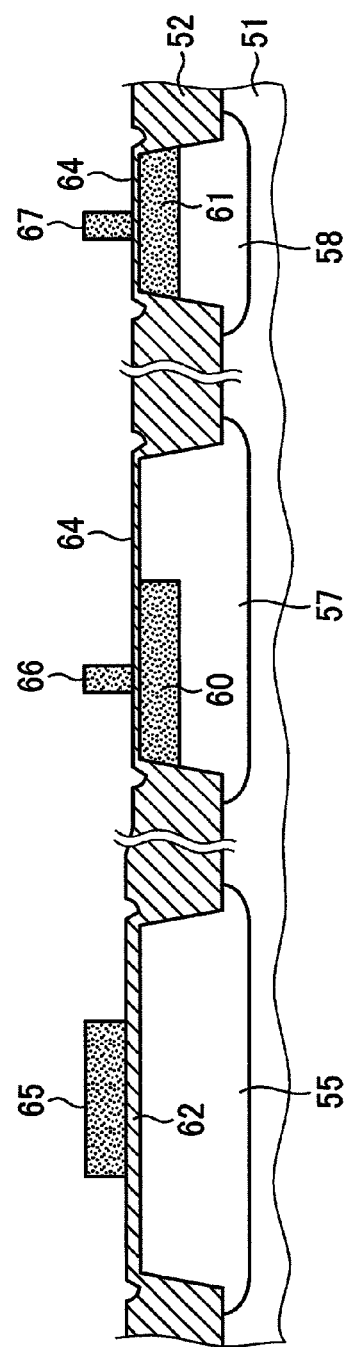

Next, as illustrated in FIG. 30C, the resist pattern 63 is removed, which is then followed by thermal oxidation again so that a SiO2 film 64, of which the thickness is 1.8 nm, for example, that becomes a gate insulating film of a low voltage drive Tr is formed on the surface of the p type well regions 57 and 58. Next, as illustrated in FIG. 30D, a polycrystalline silicon layer is deposited on the p type well regions 55, 57, and 58, and then etched so that gate electrodes 65 to 67 are formed.

Figures 30E, 30F:
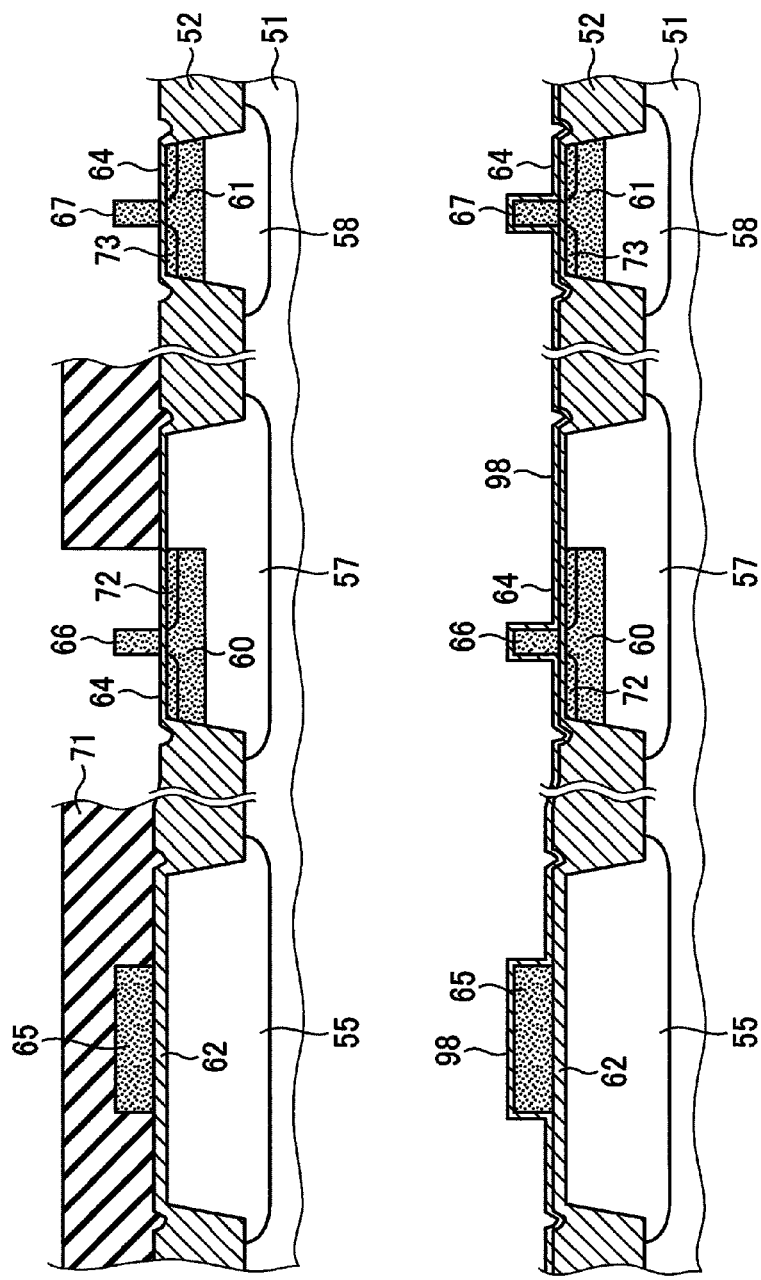
FIGS. 30E and 30F are diagrams for illustrating a step after the step in FIG. 30D of the manufacturing process for a semiconductor integrated circuit apparatus according to the fourth embodiment of the present invention.

Next, as illustrated in FIG. 30E, a new resist pattern 71 is formed so as to cover the p type well region 55 and the region in the p type well region 57 where the p type channel dope region 60 is not formed. This resist pattern 71 is used as a mask so as to implant B ions in four directions at a tilt angle of 0° with an acceleration energy of 15 keV, for example, so that the amount of dosage becomes $7.4 \times 10^{12}$ cm$^{-2}$, for example, and thus, pocket regions (not shown) are formed. Subsequently, P ions are implanted in four directions at a tilt angle of 0° with an acceleration energy of 1 keV, for example, so that the amount of dosage becomes $6.0 \times 10^{13}$ cm$^{-2}$, and As ions are implanted in four directions at a tilt angle of 0° with an acceleration energy of 1 keV, for example, so that the amount of dosage becomes $1.0 \times 10^{14}$ cm$^{-2}$, for example, and thus, n type extension regions 72 and 73 are formed in the p type well regions 57 and 58.

Next, as illustrated in FIG. 30F, the resist pattern 71 is removed, and then, a SiO2 film 98, of which the thickness is 3 nm, for example, is deposited on the entire surface in accordance with a CVD method.

Next, as illustrated in FIG. 30G, a resist pattern 68 is formed so as to cover the region in the p type well region 57 where the p type channel dope region 60 is formed and the p type well region 58. After that, this resist pattern 68 is used as a mask so as to implant P ions in four directions at a tilt angle of 45° with an acceleration energy of 46 keV, for example, so that an amount of dosage becomes $8.0 \times 10^{12}$ cm$^{-2}$, and thus, n type LDD regions 69 are formed in the p type well region 55, and at the same time, an n– type region 70 is formed in the exposed portion of the p type well region 57. At this time, the SiO2 film 98 is provided on the n– type region 70, and therefore, the channeling factor is suppressed and the inconsistency due to the tilt angle is reduced, and thus, a stable sheet resistance value can be gained.

Next, as illustrated in FIG. 30H, the resist pattern 68 is removed, and then, a SiO2 film is deposited on the entire surface. After that, a resist pattern 74 is formed so as to cover the ballast resistor forming region, which is then followed by anisotropic etching so that side walls 75 are formed. At this time, the SiO2 film that remains beneath the resist pattern 74 becomes a salicide block 76.

Next, as illustrated in FIG. 30I, the resist pattern 74 is removed, and then, P ions are implanted at a tilt angle of 0° with an acceleration energy of 8 keV, for example, so that the amount of dosage becomes $1.2\times10^{16}$ cm$^{-2}$, and thus, n+ type source regions 77, 79, and 81 as well as n+ type drain regions 78, 80, and 82 are formed. At this time, the n− type region directly beneath the salicide block 76 becomes a ballast resistor 83.

Next, as illustrated in FIG. 30J, a Co film is deposited on the entire surface, which is then followed by heat treatment so that a Co silicide layer 84 is formed on the surface of the gate electrodes 65 to 67, the n+ type source regions 77, 79, and 81 as well as the n+ type drain regions 78, 80, and 82. After that, the unreacted portions of the Co film are removed, which is then followed by heat treatment again so that the resistance of the Co silicide layer 84 is lowered. After that, though not shown, an interlayer insulating film is formed, and then, plugs that reach a Co silicide layer 84 are formed, which is followed by the formation of wires connected to these plugs. The formation of such a wire structure is repeated for the required number of layers, and thus, the basic structure of the semiconductor integrated circuit apparatus according to the fourth embodiment of the present invention is complete.

In the fourth embodiment of the present invention as well, in the same manner as in the third embodiment ions are implanted through a SiO2 film for the formation of a ballast resistor during the process for forming the LDD regions in a high voltage drive transistor, and therefore, the channeling factor is reduced. As a result, the inconsistency in the profiles due to the tilt angle can be reduced.

Fifth Embodiment

Figures 31A, 31B:
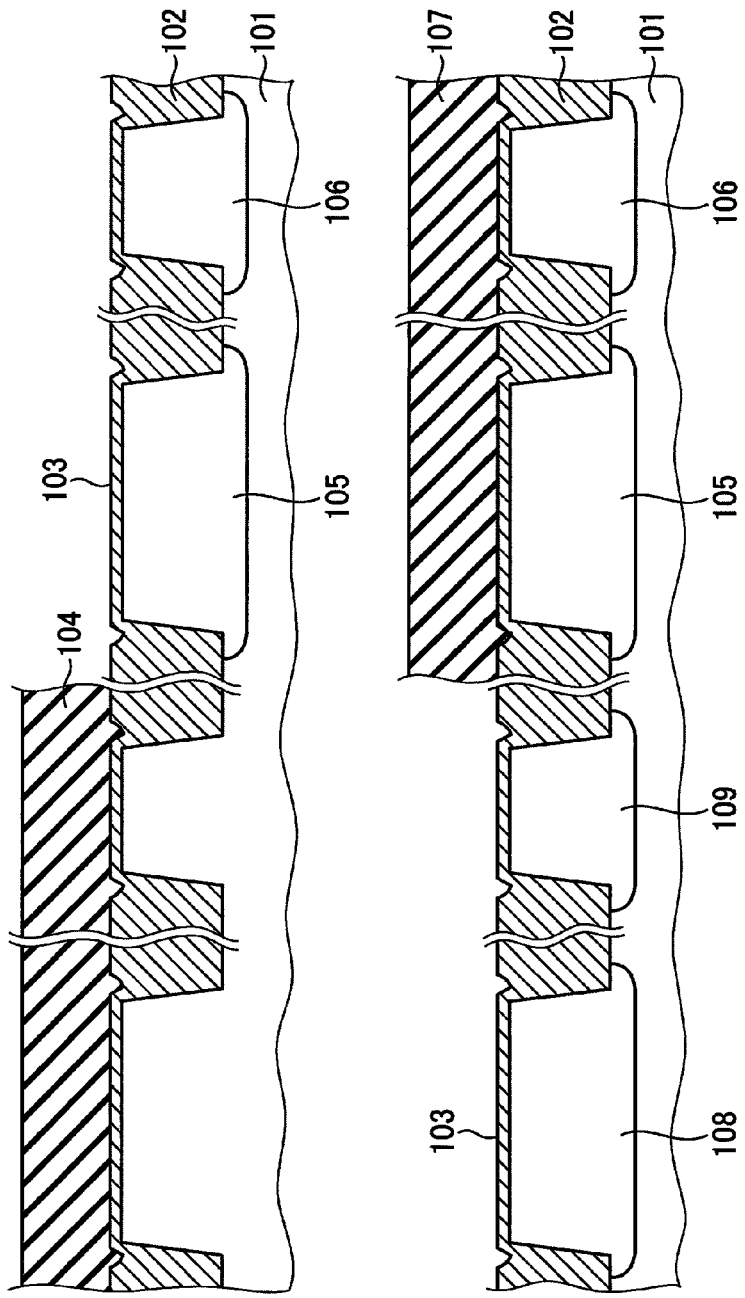
FIGS. 31A and 31B are diagrams for illustrating a step in the middle of the manufacturing process for a complementary type semiconductor integrated circuit apparatus according to the fifth embodiment of the present invention.

Next, the complementary type semiconductor integrated circuit apparatus according to the fifth embodiment of the present invention is described in reference to FIGS. 31A to 31L. First, as illustrated in FIG. 31A, an element isolation region 102 is formed in a silicon substrate 101 by means of STI, and then, a SiO2 film 103, of which the thickness is 10 nm, for example, that becomes a sacrificial oxide film is formed on the surface. After that, an n type low voltage drive Tr forming region is covered with a resist pattern 104 and ion implanted with P so that n type well regions 105 and 106 of $7.8\times10^{17}$ cm$^{-3}$, for example, are formed.

Next, as illustrated in FIG. 31B, the resist pattern 104 is removed, and then, a p type low voltage drive Tr forming region is covered with a resist pattern 107 and ion implanted with B so that p type well regions 108 and 109 of $9.6\times10^{17}$ cm$^{-3}$, for example, are formed.

Figure 31C:
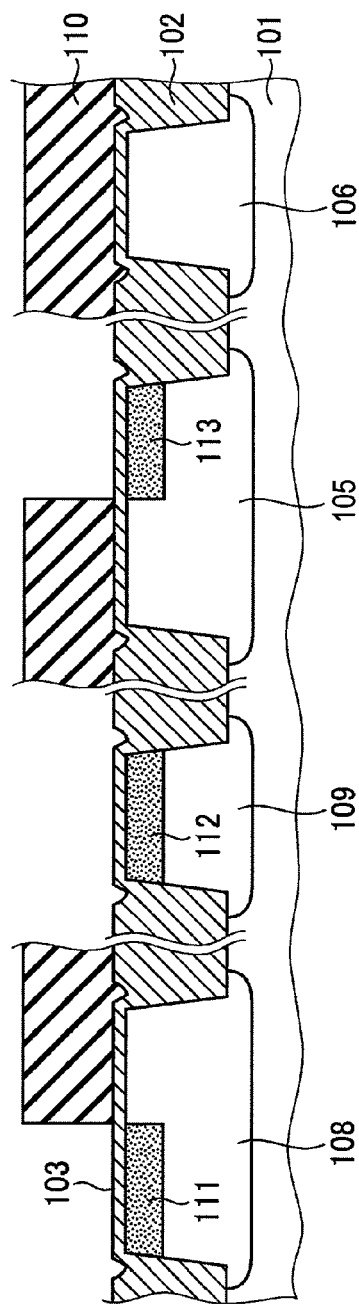
FIGS. 31C and 31D are diagrams for illustrating a step after the step in FIG. 31B of the manufacturing process for a complementary type semiconductor integrated circuit apparatus according to the fifth embodiment of the present invention.

Next, as illustrated in FIG. 31C, the resist pattern 107 is removed, and then, a resist pattern 110 is provided so as to cover a portion of the p type well region 108, a portion of the n type well region 105, and the entirety of the n type well region 106. After that, the resist pattern 110 is used as a mask to implant B ions at a tilt angle of 7° with an acceleration energy of 15 keV, for example, so that the amount of dosage becomes $6.5\times10^{12}$ cm$^{-2}$ to $1.9\times10^{13}$ cm$^{-2}$, for example, and thus, p type channel dope regions 111 and 112 are formed in the exposed portions of the p type well regions 108 and 109. At this time, a p− type region 113 is simultaneously formed in the exposed portion of the n type well region 105.

Figure 31D:
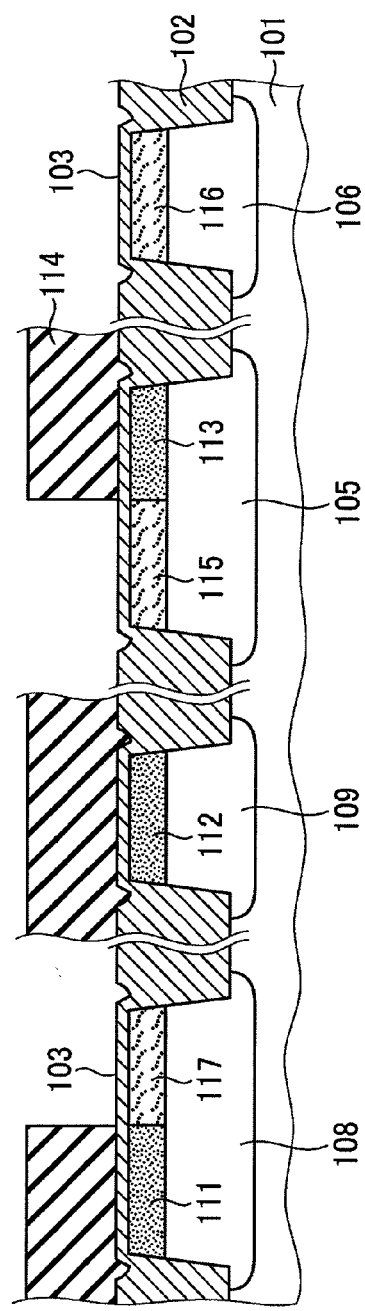

Next, as illustrated in FIG. 31D, the resist pattern 110 is removed, and then, a resist pattern 114 is provided so as to cover a portion of the p type well region 108, the entirety of the p type well region 109, and a portion of the n type well region 105. After that, the resist pattern 114 is used as a mask to implant P ions at a tilt angle of 7° with an acceleration energy of 65 keV, for example, so that the amount of dosage becomes $8.0\times10^{12}$ cm$^{-2}$ to $3.0\times10^{13}$ cm$^{-2}$, for example, and thus, n type channel dope regions 115 and 116 are formed in the exposed portions of n type well regions 105 and 106. At this time, an n− type region 117 is simultaneously formed in the exposed portion of the p type well region 108.

Next, as illustrated in FIG. 31E, the resist pattern 114 is removed, and then, the SiO2 film 103 is removed, which is then followed by thermal oxidation so that a SiO2 film 118, of which the thickness is 1.8 nm, for example, that becomes a gate insulating film is formed. After that, as illustrated in FIG. 31F, a polycrystalline silicon layer is deposited on the p type well regions 108 and 109 as well as the n type well regions 105 and 106, and then etched so as to form gate electrodes 119 to 122.

Next, as illustrated in FIG. 31G, a resist pattern 123 is formed so as to cover the n− type region 117 and the n type well regions 105 and 106. After that, this resist pattern 123 is used as a mask to implant B ions in four directions at a tilt angle of 28° with an acceleration energy of 15 keV, for example, so that the amount of dosage becomes $7.4\times10^{12}$ cm$^{-2}$, for example, and thus, pocket regions (not shown) are formed. Subsequently, P ions are implanted in four directions at a tilt angle of 0° with an acceleration energy of 1 keV, for example, so that the amount of dosage becomes $6.0\times10^{13}$ cm$^{-2}$, and As ions are implanted in four directions at a tilt angle of 0° with an acceleration energy of 1 keV, for example, so that the amount of dosage becomes $1.0\times10^{14}$ cm$^{-2}$, for example, and thus, n type extension regions 124 and 125 are formed in the p type well regions 108 and 109.

Next, as illustrated in FIG. 31H, a resist pattern 126 is formed so as to cover the p type well regions 108 and 109 as well as the p− type region 113. After that, this resist pattern 126 is used as a mask to implant P ions in four directions at a tilt angle of 28° with an acceleration energy of 40 keV, for example, so that the amount of dosage becomes $7.4\times10^{12}$ cm$^{-2}$, for example, and thus, pocket regions (not shown) are formed. Subsequently, B ions are implanted in four directions at a tilt angle of 0° with an acceleration energy of 0.3 keV, for example, so that the amount of dosage becomes $7.8\times10^{13}$ cm$^{-2}$, for example, and thus, p type extension regions 127 and 128 are formed in the n type well regions 105 and 106.

Next, as illustrated in FIG. 31I, the resist pattern 126 is removed, and then, a SiO2 film is deposited on the entire surface. After that, a resist pattern 129 is formed so as to cover the ballast resistor forming region, which is then followed by anisotropic etching so that side walls 130 are formed. At this time, the SiO2 film that remains beneath the resist pattern 129 becomes salicide blocks 131 and 132.

Next, as illustrated in FIG. 31J, the resist pattern 129 is removed, and then, a resist pattern 133 is formed so as to cover the n type well regions 105 and 106. After that, the resist pattern 133 is used as a mask to implant P ions at a tilt angle of 0° with an acceleration energy of 8 keV, for example, so that the amount of dosage becomes $2\times10^{16}$ cm$^{-2}$, for example, and thus, n+ type source regions 134 and 136 as well as n+ type drain regions 135 and 137 are formed. At this time, the n− type region directly beneath the salicide block 131 becomes a ballast resistor 138.

Figure 31K:
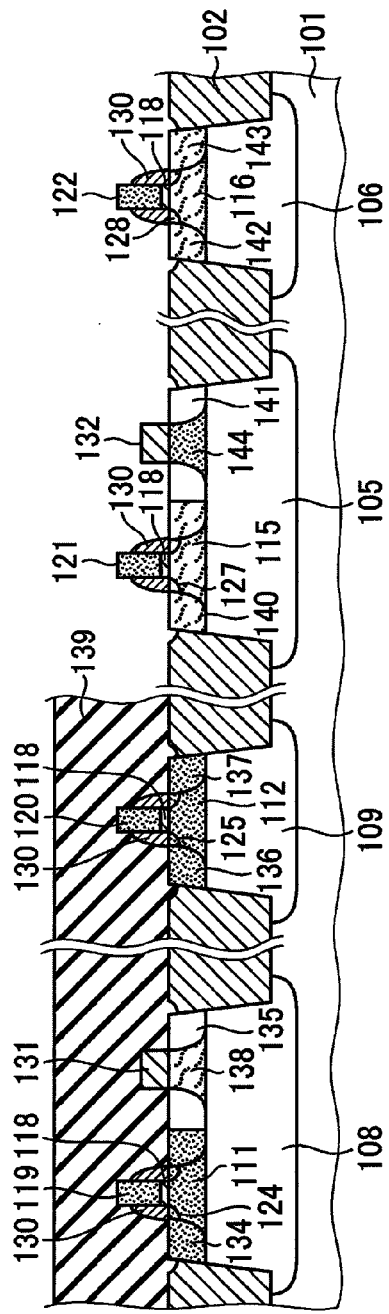
FIGS. 31K and 31L are diagrams for illustrating a step after the step in FIG. 31J of the manufacturing process for a complementary type semiconductor integrated circuit apparatus according to the fifth embodiment of the present invention.

Next, as illustrated in FIG. 31K, the resist pattern 133 is removed, and then, a resist pattern 139 is formed so as to cover the p type well regions 108 and 109. After that, the resist pattern 139 is used as a mask to implant B ions at a tilt angle of 0° with an acceleration energy of 4 keV, for example, so that the amount of dosage becomes $6.0\times10^{15}$ cm$^{-2}$, for example, and thus, p+ type source regions 140 and 142 as well as p+ type drain regions 141 and 143 are formed. At this time, the p− type region directly beneath the salicide block 132 becomes a ballast resistor 144.

Figure 31L:
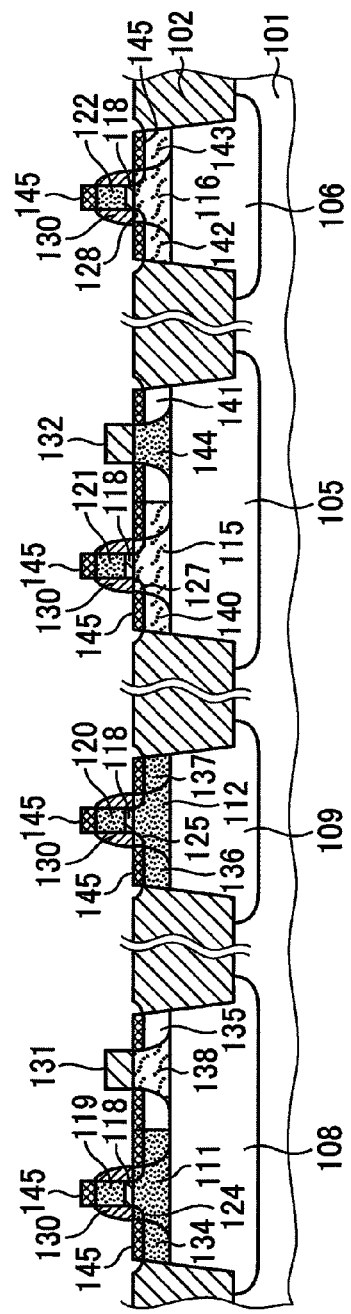

Next, as illustrated in FIG. 31L, a Co film is deposited on the entire surface, which is then followed by heat treatment so that a Co silicide layer 145 is formed on the surface of the gate electrodes 119 to 122, the n+ type source regions 134 and 136, the n+ type drain regions 135 and 137, and the p type source regions 140 and 142 as well as the p+ type drain regions 141 and 143. After that, the unreacted portions of the Co film are removed, which is then followed by heat treatment again so that the resistance of the Co silicide layer 145 is lowered. After that, though not shown, an interlayer insulating film is formed, and then, plugs that reach a Co silicide layer 145 are formed, which is followed by the formation of wires connected to these plugs. The formation of such a wire structure is repeated for the required number of layers, and thus, the basic structure of the complementary type semiconductor integrated circuit apparatus according to the fifth embodiment of the present invention is complete.

Figure 32A:
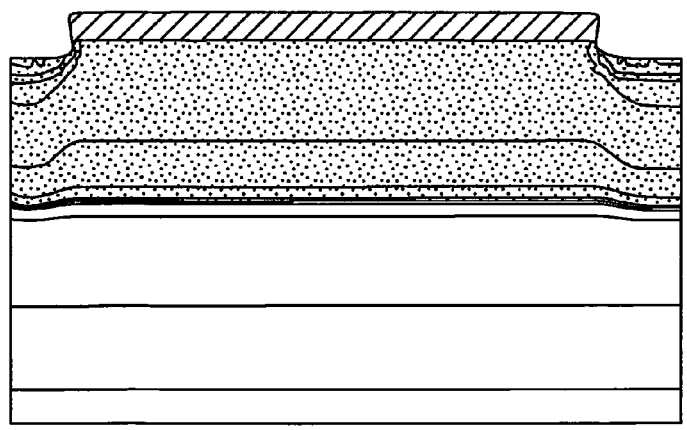
FIGS. 32A to 32C are diagrams illustrating the dependency of the distribution of the impurity concentration in an n type ballast resistor region.
Figure 32B:
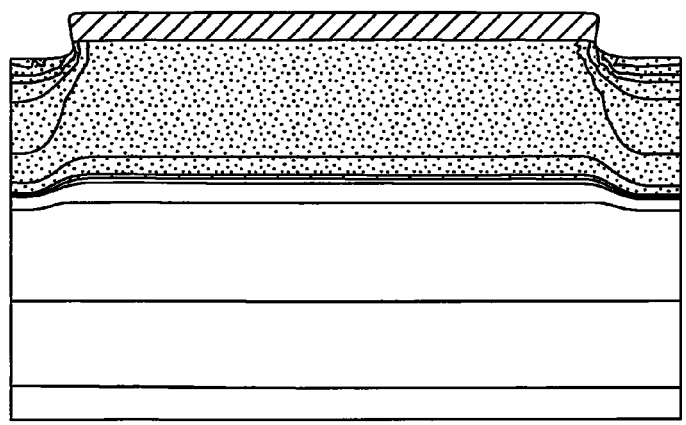
Figure 32C:
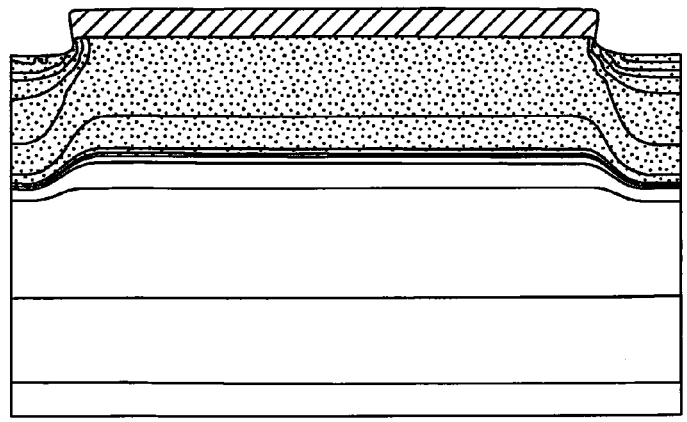

Here, the dispersion of the impurity concentration and the leak current in the ballast resistors are simulated, and therefore, the results of the examination are described in reference to FIGS. 32A to 40B. FIGS. 32A to 32C are diagrams illustrating the dependency of the distribution of the impurity concentration in an n type ballast resistor region. FIG. 32A is a diagram illustrating the distribution of the impurity concentration in an UHVth, FIG. 32B is a diagram illustrating the distribution of the impurity concentration in a HVth, and FIG. 32C is a diagram illustrating the distribution of the impurity concentration in a SVth. As illustrated in the figures, the UHVth with a large amount of channel dosage has a deep pn junction and a high impurity concentration.

Figure 33A:
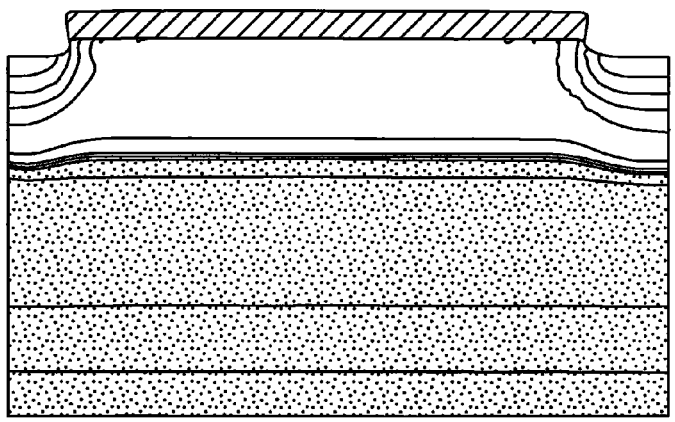
FIGS. 33A to 33C are diagrams illustrating the dependency of the distribution of the impurity concentration in a p type ballast resistor region on the amount of channel dosage.
Figure 33B:
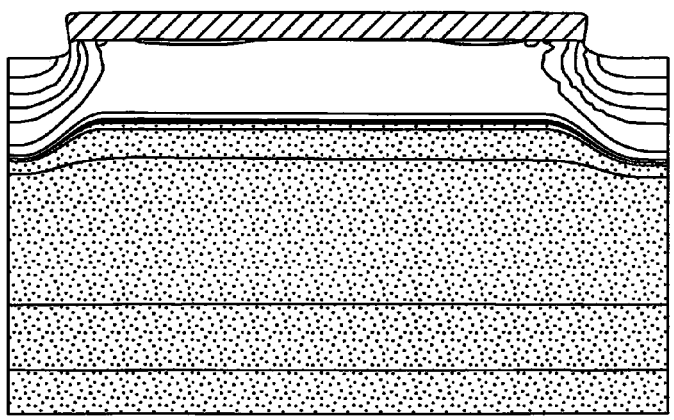
Figure 33C:
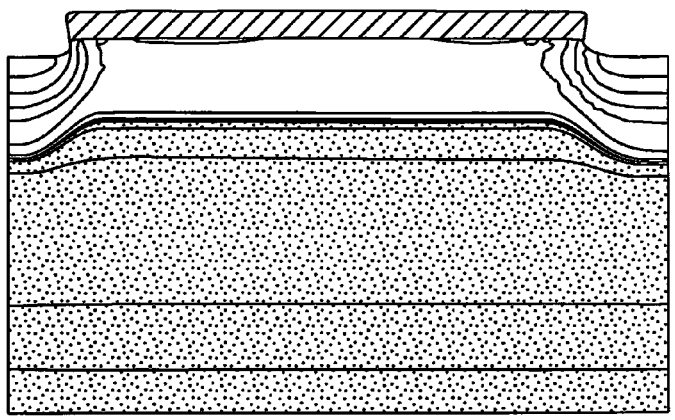

FIGS. 33A to 33C are diagrams illustrating the dependency of the distribution of the impurity concentration in a p type ballast resistor region on the amount of channel dosage. FIG. 33A is a diagram illustrating the distribution of the impurity concentration in an UHVth, FIG. 33B is a diagram illustrating the distribution of the impurity concentration in a HVth, and FIG. 33C is a diagram illustrating the distribution of the impurity concentration in a SVth. As illustrated in the figures, in the case of p type as well, the UHVth with a large amount of channel dosage has a deep pn junction and a high impurity concentration.

Figure 34A:
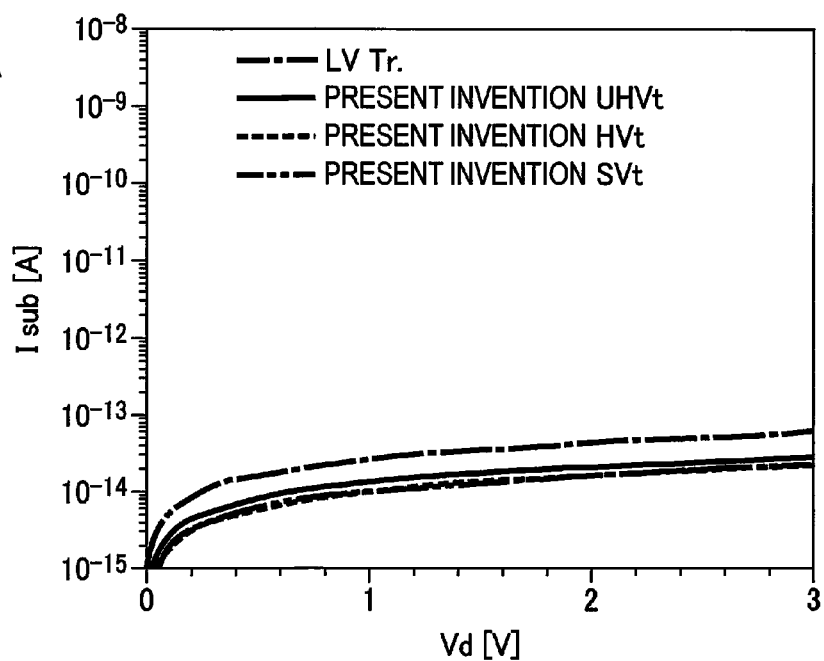
FIGS. 34A and 34B are graphs illustrating the results of evaluation of the leak current in ballast resistor regions.
Figure 34B:
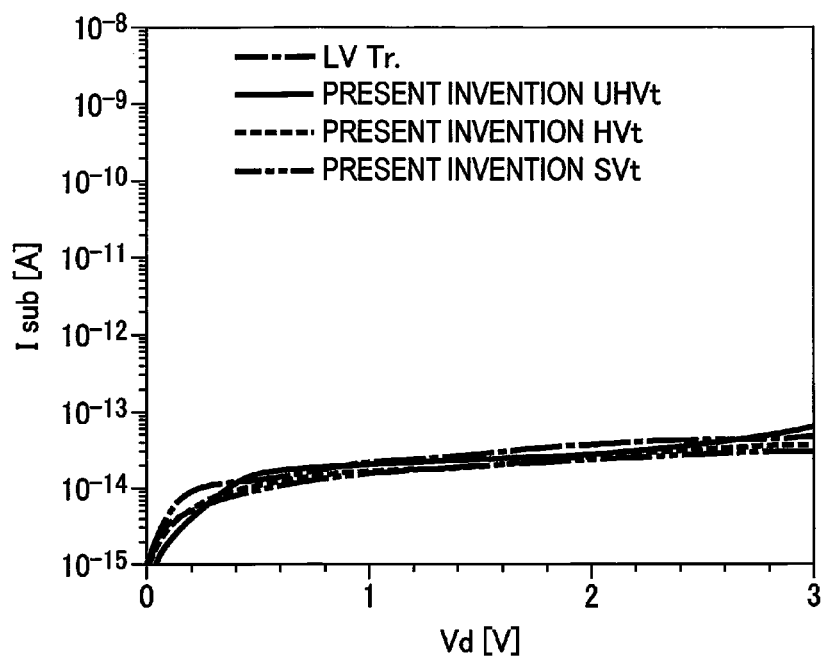

FIGS. 34A and 34B are graphs illustrating the results of evaluation of the leak current in ballast resistor regions. FIG. 34A is a graph illustrating the leak current in n channel type MOS transistors (NMOSs), and FIG. 34B is a graph illustrating the leak current in p channel type MOS transistors (PMOSs). As is clear from the figures, no increase in the leak current is observed in the same manner as in the LVTr in the first embodiment in either case of UHVth, HVth, or SVth.

FIGS. 35A and 35B are diagrams illustrating the results of simulation of the distribution of the impurity concentration in an n channel type low voltage drive transistor with a ballast resistor, which is the UHVth according to the fifth embodiment of the present invention, and illustrate the distribution of the impurity concentration in the vicinity of the ballast resistor. FIG. 35A illustrates the distribution of the impurity concentration in a typical LVI/OTr to be compared, and FIG. 35B illustrates the distribution of the impurity concentration in the LVI/OTr according to the fifth embodiment of the present invention. As can be clearly seen from the figures, the junction is located deeper and the impurity concentration is lower in the fifth embodiment of the present invention.

Figure 36:
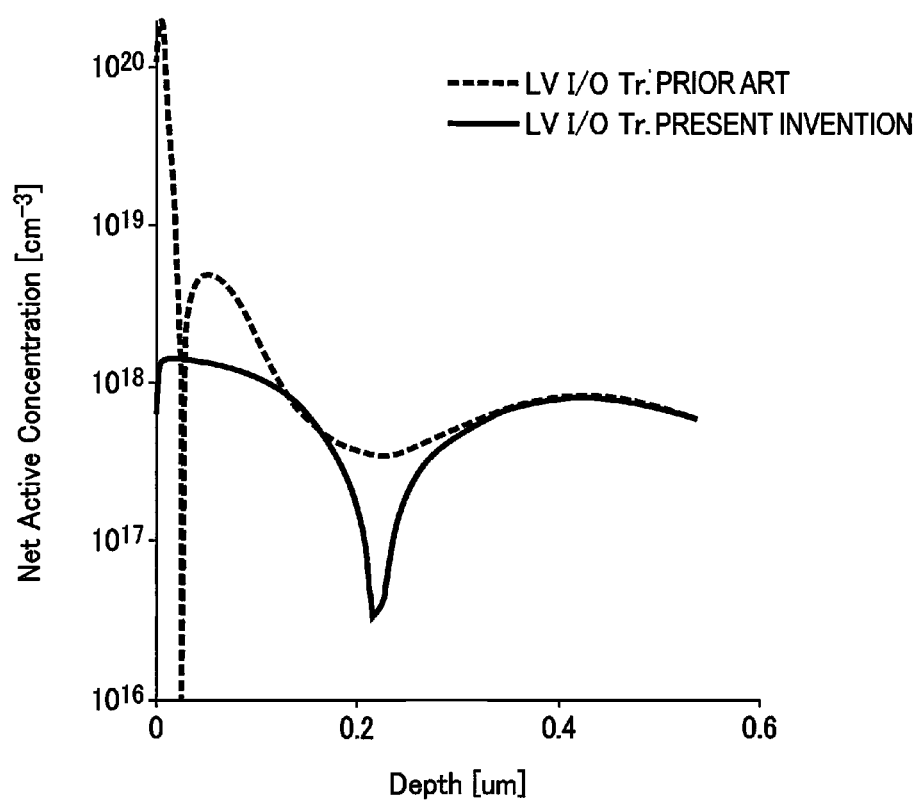
FIG. 36 is a graph showing the distribution of the effective impurity concentration.

FIG. 36 is a graph showing the distribution of the effective impurity concentration, and illustrates profiles of the effective impurity concentration in the ballast resistor portion in FIGS. 35A and 35B. As illustrated in the figures, the pn junction is located at approximately 0.02 μm from the surface in the typical LVI/OTr while the pn junction is located at approximately 0.22 μm from the surface in the LVI/OTr in the fifth embodiment of the present invention. In addition, the effective impurity concentration is approximately $1\times10^{18}$ cm$^{-3}$. Accordingly, the impurity concentration is low and band-to-band tunneling (BTBT) can be suppressed.

FIGS. 37A and 37B are diagram illustrating the results of simulation of the distribution of the impurity concentration in a p channel type low voltage drive transistor with a ballast resistor, which is the UHVth according to the fifth embodiment of the present invention, and illustrate the distribution of the impurity concentration in the vicinity of the ballast resistor. FIG. 37A illustrates the distribution of the impurity concentration in a typical LVI/OTr to be compared, and FIG. 37B illustrates the distribution of the impurity concentration in the LVI/OTr according to the fifth embodiment of the present invention. As can be clearly seen from the figures, the junction is located deeper and the impurity concentration is lower in the fifth embodiment of the present invention.

Figure 38:
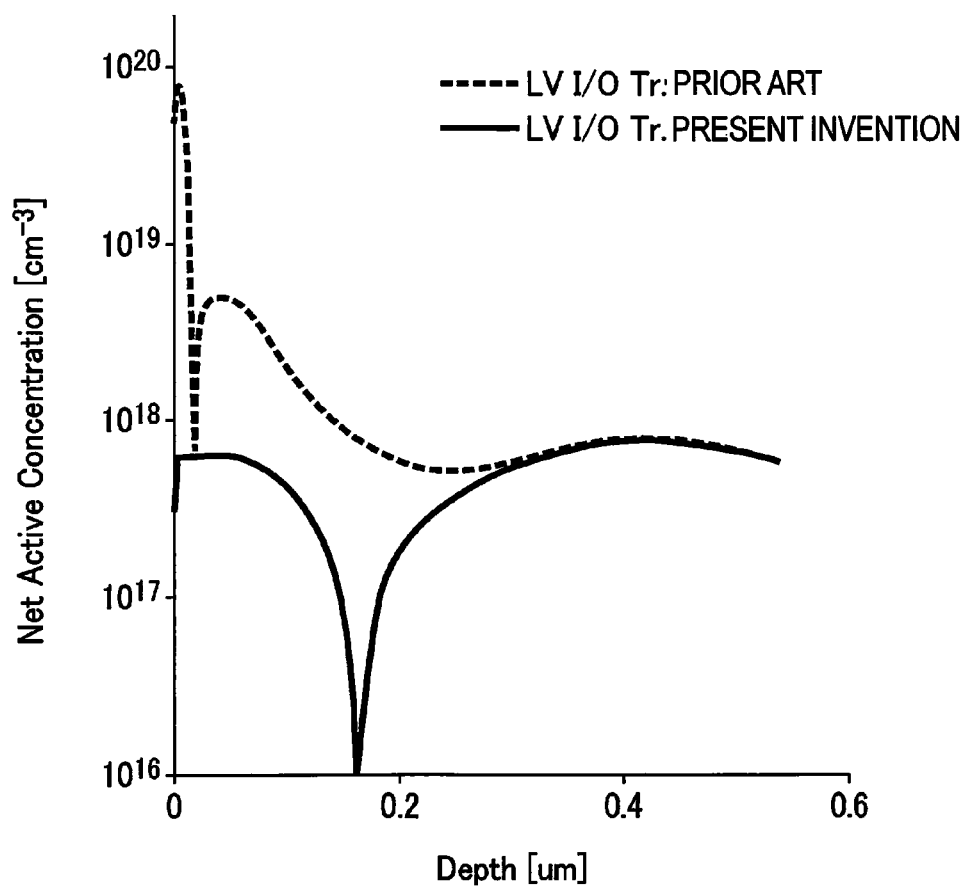
FIG. 38 is a graph showing the distribution of the effective impurity concentration.

FIG. 38 is a graph showing the distribution of the effective impurity concentration, and illustrates profiles of the effective impurity concentration in the ballast resistor portion in FIGS. 37A and 37B. As illustrated in the figures, the pn junction is located at approximately 0.02 μm from the surface in the typical LVI/OTr while the pn junction is located at approximately 0.17 μm from the surface in the LVI/OTr in the fifth embodiment of the present invention. In addition, the effective impurity concentration is $1\times10^{18}$ cm$^{-3}$ or lower. Accordingly, the impurity concentration is low and band-to-band tunneling (BTBT) can be suppressed.

Figure 39A:
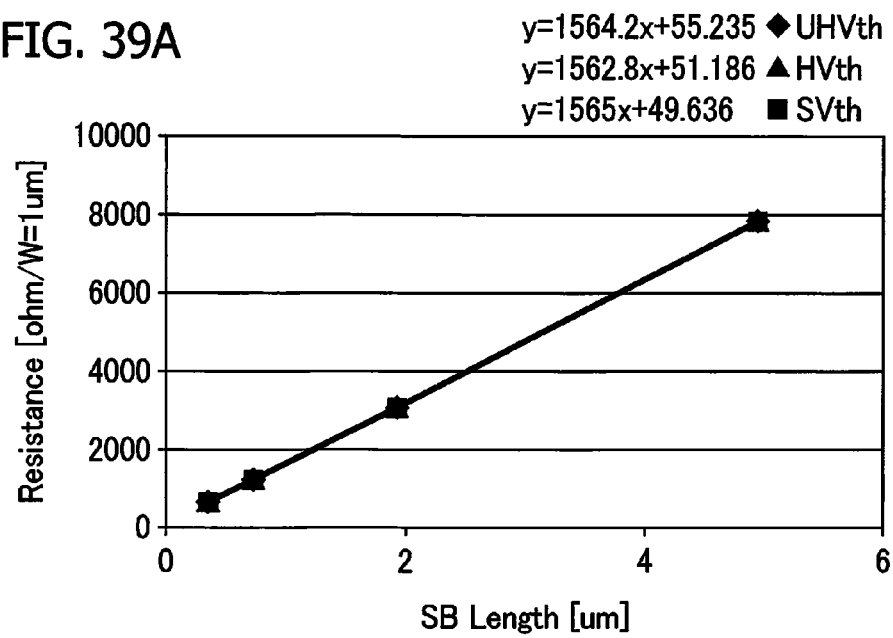
FIGS. 39A and 39B are graphs illustrating the selectivity of the sheet resistance in an n channel type MOS transistor.
Figure 39B:
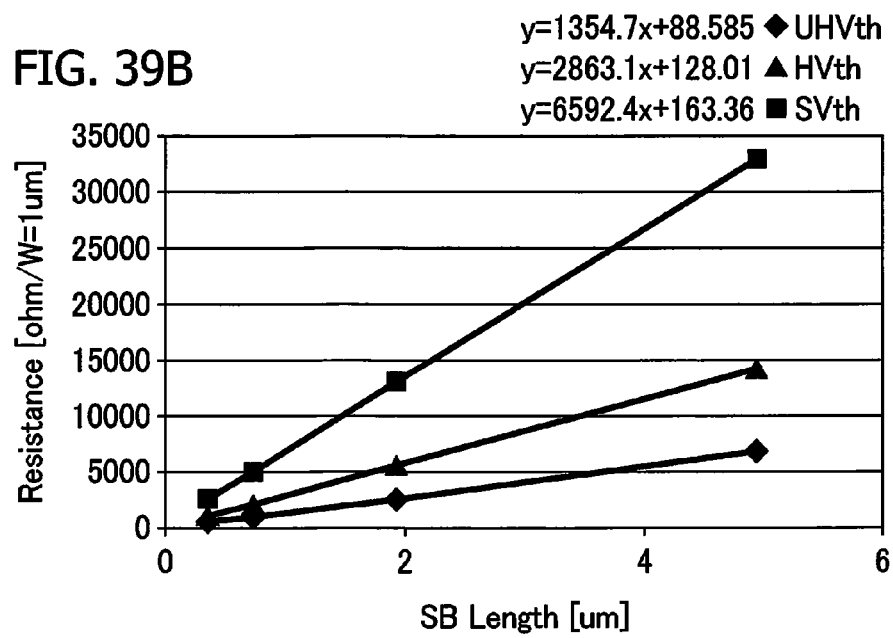

FIGS. 39A and 39B are graphs illustrating the selectivity of the sheet resistance in an n channel type MOS transistor. FIG. 39A illustrates the values, for comparison, of the sheet resistance measured in the case where an LDD forming process is used for HVTr instead of channel doping. FIG. 39B illustrates the sheet resistance values gained from the simulation in the case where the channel doping process according to the fifth embodiment of the present invention is used.

As is clear from the comparison between FIGS. 39A and 39B, one value is determined for the sheet resistance in the case of the LDD forming process while the sheet resistance can be changed between the same number of values as the channel doping steps for different VThs in the case where a channel doping process is used. Accordingly, an optimal sheet resistance value can be selected from the evaluation values for the ESD tolerance by using a channel doping process.

FIGS. 40A and 40B are graphs illustrating the sheet resistance selectivity in a p channel type MOS transistor. FIG. 40A illustrates the values, for comparison, of the sheet resistance measured in the case where an LDD forming process is used for HVTr instead of channel doping. FIG. 40B illustrates the sheet resistance values gained from the simulation in the case where the channel doping process according to the fifth embodiment of the present invention is used. Here, in the case of a PMOS, there are two sets of sheet resistance values because Vth is set by varying the conditions for pocket injection and extension injection for an NMOS under the supposition that the channel doping conditions are the same between HVth and SVth.

As is clear from the comparison between FIGS. 40A and 40B, in the case of a PMOS as well, one value is determined for the sheet resistance in the case of the LDD forming process while the sheet resistance can be changed between the same number of values as the channel doping steps in the case where a channel doping process is used. Accordingly, an optimal sheet resistance value can be selected from the evaluation values for the ESD tolerance by using a channel doping process.

In the fifth embodiment of the present invention, the ballast resistor is formed by using a process for forming a channel dope region of a transistor of the opposite conductivity type, and therefore, the pn junction can be located deep and be of a low impurity concentration, and at the same time, it is possible to select any sheet resistance value. As a result, it is possible to reduce the leak current that occurs together with BTBT and reduce the inconsistency of the leak current, and at the same time, it is possible to increase the ESD tolerance.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A manufacturing method for a semiconductor integrated circuit apparatus, characterized by comprising:
   forming a number of element forming regions that are isolated from each other by an element isolation region in a semiconductor substrate;
   introducing impurities of a first conductivity type into at least two element forming regions from among the element forming regions so as to form a first well region of the first conductivity type for forming a low voltage drive transistor and a second well region of the first conductivity type for a high voltage drive transistor that is driven by a voltage higher than that of the transistor formed in the first well region of the first conductivity type;
   introducing impurities into the semiconductor substrate in such a state that the second well region of the first conductivity type and a portion of the first well region of the first conductivity type are masked so as to form a first channel dope region of the first conductivity type on the surface of another portion of the first well region of the first conductivity type;
   forming a first gate electrode in the first channel dope region with a first gate insulating film in between, and at the same time forming a second gate electrode in the second well region of the first conductivity type with a second gate insulating film in between;
   introducing impurities into the second well region of the first conductivity type using the second gate electrode as a mask so as to form a low concentration source/drain region of a second conductivity type that is a conductivity type opposite to the first conductivity type, and at the same time masking the first channel dope region in the first well region of the first conductivity type so as to form a first resistor forming layer of the second conductivity type;
   introducing impurities into the first channel dope region using the first gate electrode as a mask so as to form a first extension region of the second conductivity type; and
   introducing impurities into the first well region of the first conductivity type and the second well region of the first conductivity type using side walls of the first gate electrode and the second gate electrode as well as an insulating film pattern selectively provided on the first resistor forming layer as a mask so as to form a first source region and a first drain region of the second conductivity type of which the concentration is higher than that in the low concentration source/drain region as well as a second source region and a second drain region of the second conductivity type, of which the concentration is higher than that of the low concentration source/drain region, respectively, and thus converting the first resistor forming layer beneath the insulating film pattern to a first ballast resistor.

2. The manufacturing method for a semiconductor integrated circuit apparatus according to claim 1, characterized by further comprising:
   forming in another element forming region from among the element forming regions a third well region of the first conductivity type for a transistor, of which the drive voltage is the same as that of the transistor formed in the first well region of the first conductivity type in the step of forming a first well region of the first conductivity type; and
   forming a second channel dope region, a second gate insulating film, a second gate electrode, a second extension region of the second conductivity type, a second source region of the second conductivity type, and a second drain region of the second conductivity type in the third well region of the first conductivity type in the steps of forming a first channel dope region of the transistor formed in the first well region of the first conductivity type, forming a first gate insulating film and a first gate electrode, forming a first extension region, forming side walls, and forming a first source region and a first drain region.

3. The manufacturing method for a semiconductor integrated circuit apparatus according to claim 2, characterized by further comprising:
   forming a fourth well region of the first conductivity type in another element forming region from among the element forming regions; and
   providing a flash memory element with a floating gate in the fourth well region of the first conductivity type.

4. The manufacturing method for a semiconductor integrated circuit apparatus according to claim 1, characterized by keeping the insulating film formed in the step of forming the second gate insulating film in the first well region of the first conductivity type, excluding the first channel dope region, in the step of forming the first gate insulating film and introducing impurities using the insulating film that is kept as a mask in the step of forming the first resistor forming layer.

5. The manufacturing method for a semiconductor integrated circuit apparatus according to claim 1, characterized by depositing an insulating film, of which the thickness is 3 nm or greater, so as to cover the first well region of the first conductivity type in the step of forming the first resistor forming layer and introducing impurities using the deposited insulating film as a mask.

6. The manufacturing method for a semiconductor integrated circuit apparatus according to claim 1, characterized by further comprising:
forming a silicide layer in an exposed portion using the side walls and the insulating film pattern as a salicide block.

7. A manufacturing method for a semiconductor integrated circuit apparatus comprising:
forming a number of element forming regions isolated from each other by an element isolation region in a semiconductor substrate;
introducing impurities of a first conductivity type into at least one element forming region from among the element forming regions so as to form a first well region of the first conductivity type;
introducing impurities of a second conductivity type into at least one element forming region from among the other element forming regions so as to form a first well region of the second conductivity type;
forming a first channel dope region of the first conductivity type in a portion of the first well region of the first conductivity type, and at the same time forming a first resistor forming layer of the first conductivity type in a portion of the first well region of the second conductivity type;
forming a second resistor forming layer of the second conductivity type in a region of the first well region of the first conductivity type other than the first channel dope region, and at the same time forming a second channel dope region of the second conductivity type in a region of the first well region of the second conductivity type other than the first resistor forming region;
providing a first gate electrode in the first well region of the first conductivity type with a first gate insulating film in between;
providing a second gate electrode in the first well region of the second conductivity type with a second gate insulating film in between;
introducing impurities into the first well region of the first conductivity type using first side walls on the first gate electrode and the first insulating film pattern provided on the second resistor forming layer as a mask so as to form a first source region and a first drain region of the second conductivity type, of which the impurity concentration is higher than that of the second resistor forming layer, and at the same time to convert the second resistor forming layer beneath the first insulating film pattern to a second ballast resistor;
introducing impurities into the first well region of the second conductivity type using the second side walls provided on the second gate electrode and the second insulating film pattern provided on the first resistor forming layer as a mask so as to form a second source region and a second drain region of the first conductivity type, of which the impurity concentration is higher than that of the first resistor forming layer, and at the same time to convert the first resistor forming layer beneath the second insulating film pattern to a first ballast resistor.

8. The manufacturing method for a semiconductor integrated circuit apparatus according to claim 7, characterized by further comprising:
introducing impurities into the first channel dope region using the first gate electrode as a mask so as to form a first extension region of the second conductivity type that is shallower than and has a concentration lower than that of the first source region and the first drain region before forming the first side walls; and
introducing impurities into the second channel dope region using the second gate electrode as a mask so as to form a second extension region of the first conductivity type that is shallower than and has a concentration lower than that of the second source region and the second drain region before forming the second side walls.

9. The manufacturing method for a semiconductor integrated circuit apparatus according to claim 7, characterized by further comprising:
forming a silicide layer in an exposed portion using the first side walls, the second side walls, the first insulating film pattern, and the second insulating film pattern as a salicide block.

* * * * *